US008513731B2

(12) United States Patent
Lee et al.

(10) Patent No.: US 8,513,731 B2
(45) Date of Patent: Aug. 20, 2013

(54) VERTICAL TYPE SEMICONDUCTOR DEVICE

(75) Inventors: Seung-Jun Lee, Suwon-si (KR); Woonkyung Lee, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 580 days.

(21) Appl. No.: 12/588,491

(22) Filed: Oct. 16, 2009

(65) Prior Publication Data
US 2010/0117143 A1    May 13, 2010

(30) Foreign Application Priority Data
Nov. 11, 2008 (KR) .................. 10-2008-0111394

(51) Int. Cl.
*H01L 29/66* (2006.01)
(52) U.S. Cl.
USPC ............ 257/329; 257/773; 257/E27.081; 438/156
(58) Field of Classification Search
USPC ............ 257/329, 773, E27.081; 438/156
See application file for complete search history.

(56) References Cited

U.S. PATENT DOCUMENTS

| | | | |
|---|---|---|---|
| 7,382,018 B2 | 6/2008 | Kim et al. | |
| 2005/0280960 A1* | 12/2005 | Guo et al. | 360/327.22 |
| 2006/0197115 A1* | 9/2006 | Toda | 257/248 |
| 2007/0158736 A1* | 7/2007 | Arai et al. | 257/315 |
| 2007/0228434 A1* | 10/2007 | Shimojo | 257/296 |
| 2007/0252201 A1 | 11/2007 | Kito et al. | |
| 2008/0149913 A1* | 6/2008 | Tanaka et al. | 257/5 |

FOREIGN PATENT DOCUMENTS

| | | | |
|---|---|---|---|
| JP | 06-338602 A | 12/1994 | |
| JP | 2007-180389 A | 7/2007 | |
| JP | 2007-317874 A | 12/2007 | |
| KR | 10-2006-0089547 A | 8/2006 | |

OTHER PUBLICATIONS

Fukuzumi, et al., "Optimal Integration and Characteristics of Vertical Array Devices for Ultra-High Density, Bit-Cost Scalable Flash Memory", Electron Devices Meeting 2007, IEDM 2007, IEEE International, pp. 449-452 (2007).
Tanaka, et al. "Bit Cost Scalable Technology With Punch and Plug Process for Ultra High Density Flash Memory", 2007 Symposium on VLSI Technology Digest of Technical Papers, pp. 14-15, (2007).

* cited by examiner

*Primary Examiner* — Thao Le
*Assistant Examiner* — Matthew Gordon
(74) *Attorney, Agent, or Firm* — Lee & Morse, P.C.

(57) ABSTRACT

A vertical type semiconductor device including a first vertical semiconductor device on a semiconductor substrate, a second vertical semiconductor device on the first vertical semiconductor device, and an interconnection between the first and second vertical semiconductor devices.

19 Claims, 47 Drawing Sheets

VERTICAL TYPE SEMICONDUCTOR DEVICE

BACKGROUND

1. Field

Embodiments relate to a vertical type semiconductor device.

2. Description of the Related Art

To satisfy consumer demand for superior performance at low cost, higher integration of semiconductor devices may be required. The degree of integration of memory semiconductor devices may be an important factor in determining the cost of products and higher integration may thereby be required. In two-dimensional or planar memory semiconductor devices, degree of integration may be greatly affected by the level of fine pattern formation technology because it may be mainly determined by an area occupied by unit memory cells. For forming fine patterns, however, because very high-cost equipment may be necessary, the degree of integration in two-dimensional memory semiconductor devices remains limited despite progressive increases.

SUMMARY

Embodiments are directed to a vertical type semiconductor device, which substantially overcomes one or more of the drawbacks, limitations, and/or disadvantages of the related art.

It is a feature of an embodiment to provide a vertical type semiconductor device having a multi-layer structure.

At least one of the above and other features and advantages may be realized by providing a vertical type semiconductor device including a first vertical semiconductor device on a semiconductor substrate, a second vertical semiconductor device on the first vertical semiconductor device, and an interconnection between the first and second vertical semiconductor devices.

The interconnection may be a bit line, and the bit line may be shared in the first and second vertical semiconductor devices.

The interconnection may be a common source line, and the common source line may be shared in the first and second vertical semiconductor devices.

The first vertical semiconductor device may include a vertically stacked first word line structure and a first semiconductor structure disposed through the first word line structure, and the second vertical semiconductor device may include a vertically stacked second word line structure and a second semiconductor structure disposed through the second word line structure.

The first and second semiconductor structures may be aligned with one another.

The first and second semiconductor structures may be offset from one another.

At least one side of the first word line structure may have a stair type structure and at least one side of the second word line structure may have a stair type structure.

The stair type structure of the first word line structure and the stair type structure of the second word line structure may be disposed at opposite sides of the semiconductor device.

The vertical type semiconductor device may further include at least one contact plug connected to the stair type structure of at least one of the first word line structure and the second word line structure.

The first vertical semiconductor device may further include a first string selection line structure and a first ground selection line structure.

The first ground selection line structure may be disposed under the first word line structure, and the first string selection line structure may be disposed above the first word line structure.

The first ground selection line structure may include a first ground selection line, a first ground selection semiconductor structure, and a first ground selection gate dielectric between the first ground selection line and the first ground selection semiconductor structure.

The first string selection line structure may include a first string selection line, a first string selection capping pattern, and a first string selection gate dielectric.

The second vertical semiconductor device may further include a second string selection line structure and a second ground selection line structure.

The second ground selection line structure may be disposed under the second word line structure, and the second string selection line structure may be disposed above the second word line structure.

The second ground selection line structure may include a second ground selection line, a second ground selection semiconductor structure, and a second ground selection gate dielectric between the second ground selection line and the second ground selection semiconductor structure.

The second string selection line structure may include a second string selection line, a second string selection capping pattern, and a second string selection gate dielectric.

The interconnection may have a multi-layer structure.

The interconnection may include at least one of a doped semiconductor material, a metal, and a metal compound.

BRIEF DESCRIPTION OF THE DRAWINGS

The above and other features and advantages will become more apparent to those of ordinary skill in the art by describing in detail exemplary embodiments with reference to the attached drawings, in which:

FIGS. 4A through 19A illustrate cross-sectional views of stages in a method of forming a vertical type semiconductor device, taken along line in I-I' in FIG. 3A;

FIGS. 4B through 19B illustrate cross-sectional views of stages in a method of forming a vertical type semiconductor device, taken along line II-II' in FIG. 3A;

FIGS. 21A through 36 Å illustrate cross-sectional views of stages in a method of forming a vertical type semiconductor device, taken along line in FIG. 20A;

FIGS. 21B through 36B illustrate cross-sectional views of stages in a method of forming a vertical type semiconductor device, taken along line IV-IV' in FIG. 20A;

DETAILED DESCRIPTION

Figure 1:
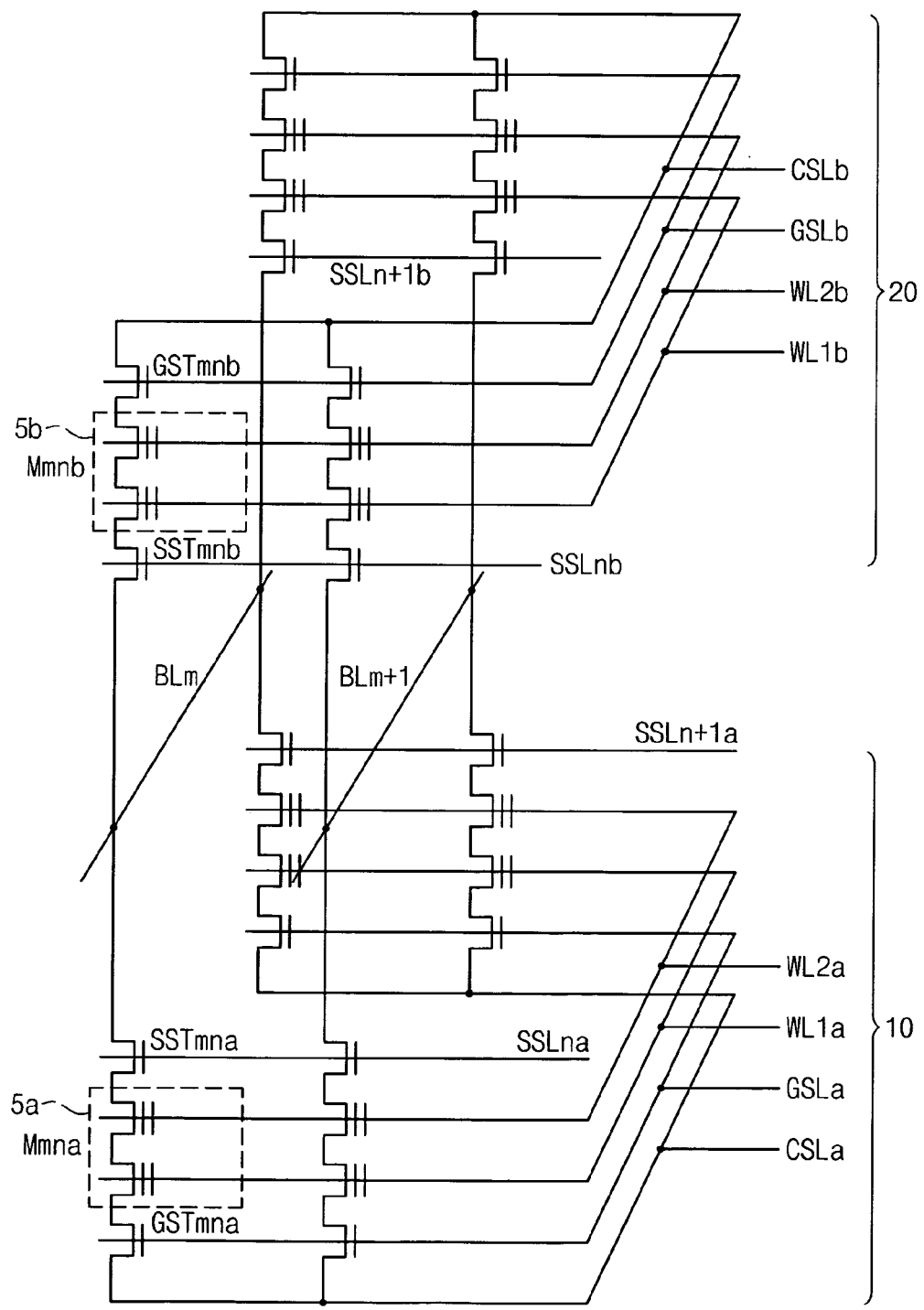
FIG. 1 illustrates a circuit diagram of a vertical type semiconductor device according to an embodiment.

Korean Patent Application No. 10-2008-0111394, filed on Nov. 11, 2008, in the Korean Intellectual Property Office, and entitled: "Vertical Type Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the specification, though terms like a first, a second, and a third are used to describe various regions and layers in various embodiments of the inventive concept, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

Technologies have been proposed for three-dimensionally forming memory cells. According to this technology, because memory cells may be formed in three-dimensional vertical structures, the area of a semiconductor substrate may be more efficiently used, and thus the degree of integration may be greatly increased over a typical two-dimensional planar memory semiconductor device. However, the technology is not based on a method that repeats an operation of planarly forming memory cells, but instead uses a semiconductor structure that is disposed through a plurality of vertically-stacked word lines, greatly decreasing cost per bit.

A vertical type semiconductor device including vertical semiconductor pillars may vertically stack a plurality of word lines. The vertical semiconductor pillars may have a resistance. When the number of the stacked word lines increases, a memory cell current that flows through the vertical semiconductor pillars may decrease. This drop in memory cell current may prevent high degrees of integration.

A vertical type semiconductor device according to an embodiment may have a double-layer structure having lower and upper layers. A first vertical type semiconductor device may be disposed in the lower layer and a second vertical type semiconductor device may be disposed in the upper layer. Common source lines or bit lines of the first and second vertical type semiconductor devices may be shared. Accordingly, the vertical type semiconductor device may minimize the decrease of memory cell current.

FIG. 1 illustrates a circuit diagram of a vertical type semiconductor device according to an embodiment. Referring to FIG. 1, a vertical type semiconductor device according to an embodiment may include a first vertical type semiconductor device 10 and a second vertical type semiconductor device 20. An interconnection may be interposed between the first vertical type semiconductor device 10 and the second vertical type semiconductor device 20.

In the first vertical type semiconductor device 10, a plurality of first word lines WL1$a$ and WL2$a$ may be stacked on a semiconductor substrate. Each of the first word lines WL1$a$ and WL2$a$ may have a plate type structure. The number of the first word lines may be a multiple of 2. First memory cells Mmna, which may be vertically and continuously disposed, may be connected in series. The serially-connected first memory cells Mmna may form a first string 5$a$. One end of the first string 5$a$ may be connected to one end of a first ground selection transistor GSTmna. Another end of the first ground selection transistor GSTmna may be connected to a first common source line CSLa on the semiconductor substrate. Another end of the first string 5$a$ may be connected to one end of a first string selection transistor SSTmna.

Another end of the first string selection transistor SSTmna may be electrically connected to an interconnection. The interconnection may be a bit line BLm. Any one of the first memory cells Mmna in the first string 5$a$ of the first vertical type semiconductor device 10 may be selected by one first word line WL1$a$, one first string selection line SSLna, and one bit line BLm.

The second vertical type semiconductor device 20 may be stacked on the first vertical type semiconductor device 10. The second vertical type semiconductor device 20 may include a plurality of second word lines WL1$b$ and WL2$b$. Each of the second word lines WL and WL2$b$ may have a plate type structure. The number of the second word lines may be a multiple of 2. Second memory cells Mmnb, which may be vertically and continuously disposed, may be connected in series. The serially-connected second memory cells Mmnb may form a second string 5$b$. One end of the second string 5$b$ may be connected to one end of a second ground selection transistor GSTmnb. Another end of the second ground selection transistor GSTmnb may be connected to a second common source line CSLb. Another end of the second string 5$b$ may be connected to one end of a second string selection transistor SSTmnb. Another end of the second string selection transistor SSTmnb may be electrically connected to the bit line BLm. Any one of the second memory cells Mmnb in the second string 5$b$ of the second vertical type semiconductor device 20 may be selected by one second word line WL1$b$, one second string selection line SSLnb and one bit line BLm.

Figure 2:
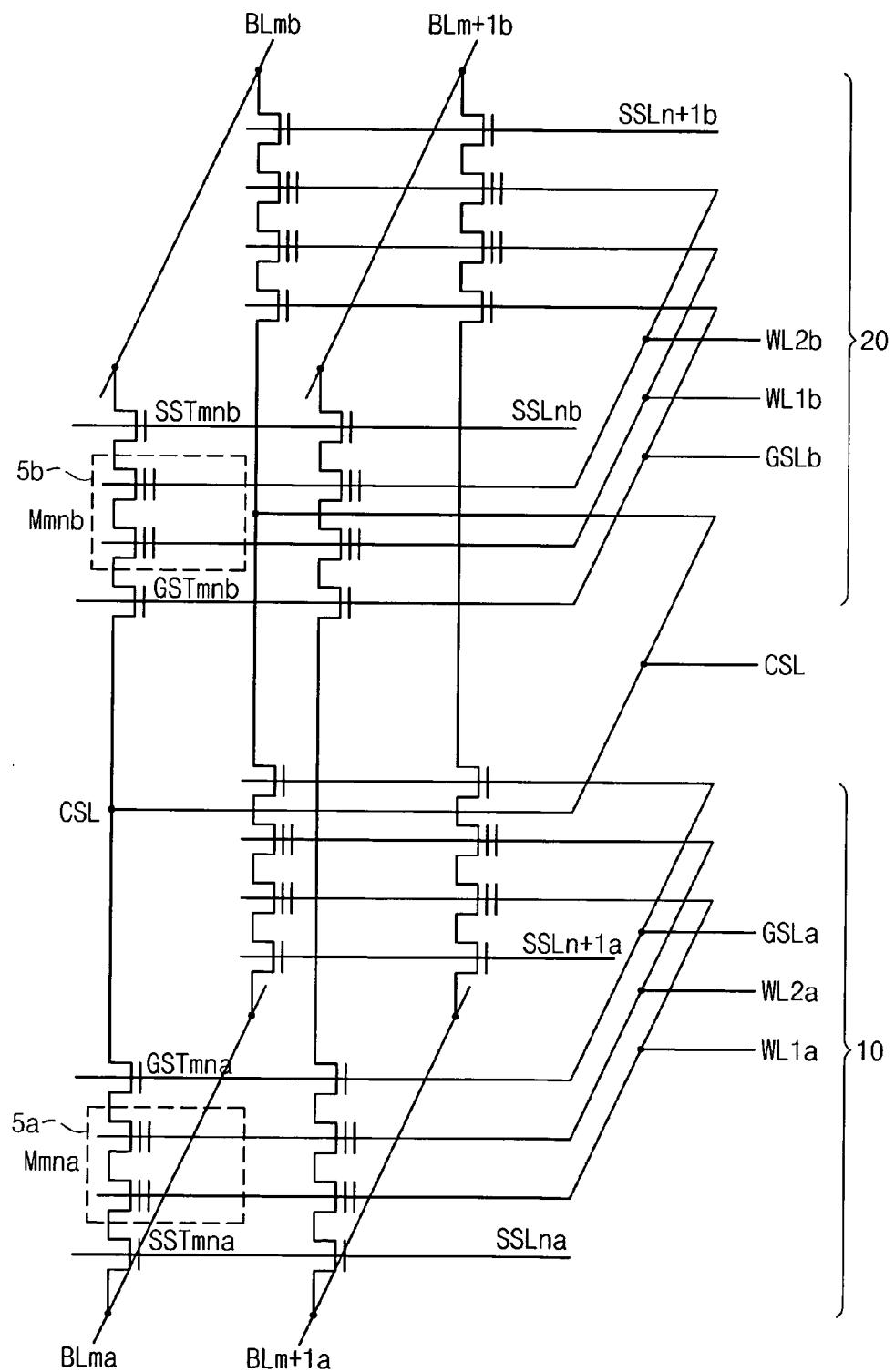
FIG. 2 illustrates a circuit diagram of a vertical type semiconductor device according to an embodiment.

FIG. 2 illustrates a circuit diagram of a vertical type semiconductor device according to another embodiment. Referring to FIG. 2, the vertical type semiconductor device of the present embodiment may include a first vertical type semiconductor device 10 and a second vertical type semiconductor device 20. An interconnection may be interposed between the first vertical type semiconductor device 10 and the second vertical type semiconductor device 20.

In the first vertical type semiconductor device 10, a plurality of first word lines WL1$a$ and WL2$a$ may be stacked on a semiconductor substrate. Each of the first word lines WL1$a$ and WL2$a$ may have a plate type structure. The number of the first word lines may be a multiple of 2. First memory cells Mmna, which may be vertically and continuously disposed, may be connected in series. The serially-connected first memory cells Mmna may form a first string 5*a*.

One end of the first string 5*a* may be connected to one end of a first ground selection transistor GSTmna. Another end of the first ground selection transistor GSTmna may be electrically connected to an interconnection. The interconnection may be a common source line CSL. Another end of the first string 5*a* may be connected to one end of a first string selection transistor SSTmna. Another end of the first string selection transistor SSTmna may be electrically connected to a first bit line BLma. Any one of the first memory cells Mmna in the first string 5*a* of the first vertical type semiconductor device 10 may be selected by one first word line WL1*a*, one first string selection line SSLna, and one first bit line BLma.

The second vertical type semiconductor device 20 may be disposed on the first vertical type semiconductor device 10. The second vertical type semiconductor device 20 may include a plurality of stacked second word lines WL1*b* and WL2*b*. Each of the second word lines WL1*b* and WL2*b* may have a plate type structure. The number of the second word lines may be a multiple of 2. Second memory cells Mmnb, which may be vertically and continuously disposed, may be connected in series. The serially-connected second memory cells Mmnb may form a second string 5*b*. One end of the second string 5*b* may be connected to one end of a second ground selection transistor GSTmnb. Another end of the second ground selection transistor GSTmnb may be connected to a common source line CSL. Another end of the second string 5*b* may be connected to one end of a second string selection transistor SSTmnb. Another end of the second string selection transistor SSTmnb may be electrically connected to a second bit line BLmb. Any one of the second memory cells Mmnb in the second string 5*b* of the second vertical type semiconductor device 20 may be selected by one second word line WL1*b*, one second string selection line SSLnb, and one second bit line BLmb.

Figure 3A:
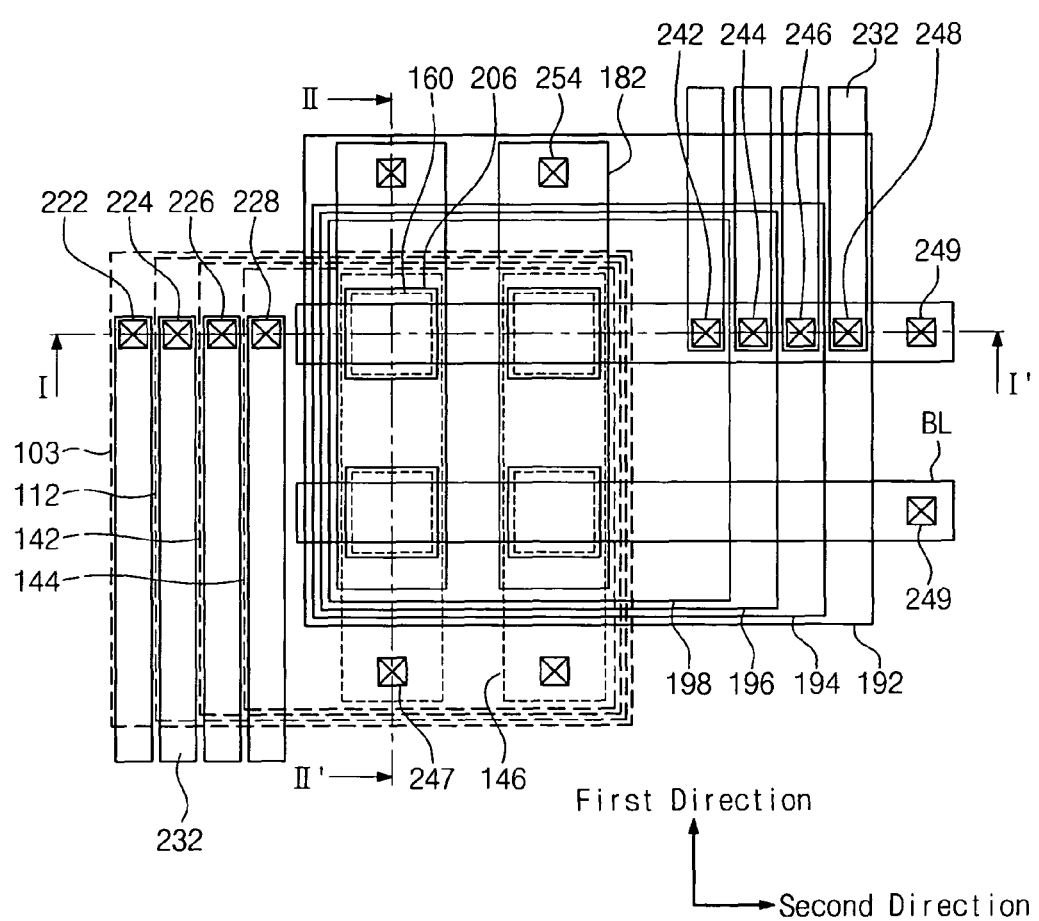
FIG. 3A illustrates a plan view of a vertical type semiconductor device according to an embodiment.
Figure 3B:
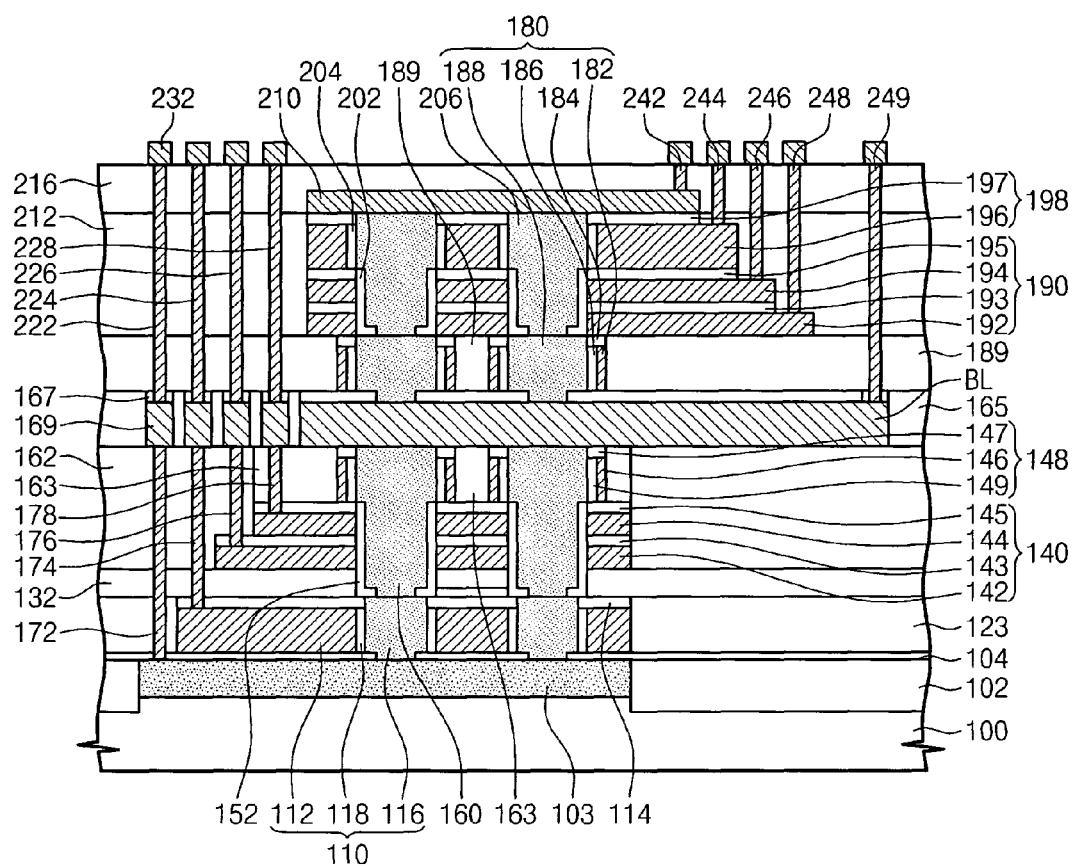
FIGS. 3B and 3C illustrate cross-sectional views of the vertical type semiconductor device of FIG. 3A.
Figure 3C:
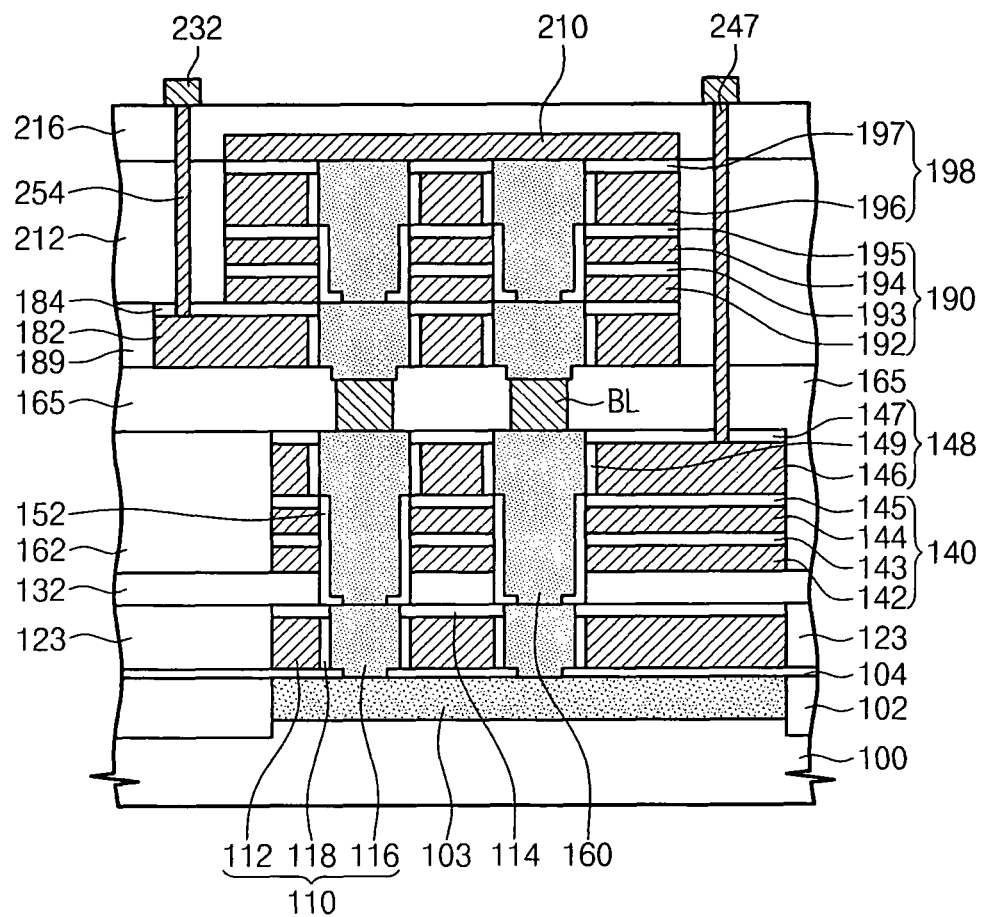

FIG. 3A illustrates a plan view of a vertical type semiconductor device according to an embodiment. FIGS. 3B and 3C illustrate cross-sectional views of the vertical type semiconductor device of FIG. 3A. FIG. 3B illustrates a cross-sectional view taken along line I-I' in FIG. 3A. FIG. 3C illustrates a cross-sectional view taken along line II-II' in FIG. 3A.

Referring to FIGS. 3A through 3C, an isolation layer 102 may be disposed on a semiconductor substrate 100. The isolation layer 102 may define an active region. An upper surface of the isolation layer 102 and the semiconductor substrate 100 may substantially have the same height. The isolation layer 102 may be formed by, e.g., a shallow trench isolation process. The isolation layer 102 may include, e.g., a silicon oxide layer. The active region may be doped. The doped active region may be a common source line 103. The common source line 103 may serve as a conductive layer. The common source line 103 may have a plate type structure.

A first interlayer dielectric 104 may be disposed on the semiconductor substrate 100. The first interlayer dielectric 104 may include, e.g., a silicon oxide layer, a silicon nitride layer, and/or a silicon oxynitride layer. A first ground selection structure 110 may be disposed on the first interlayer dielectric 104. The first ground selection structure 110 may be disposed on the common source line 103. The first ground selection structure 110 may include the ground selection transistor GSTmna (see FIGS. 1 and 2). The first ground selection transistor GSTmna may have a plate type structure of a first ground selection line 112, a first ground selection semiconductor structure 116, which may be disposed through the first ground selection line 112, and a first ground selection gate dielectric 118, which may be disposed between the first ground selection semiconductor structure 116 and the first ground selection line 112.

The first ground selection line 112 may be formed of, e.g., a doped semiconductor material. A first ground selection line capping pattern 114 may be disposed on the first ground selection line 112. The first ground selection line 112 may have a plate type structure. A first ground selection line capping pattern 114 may be disposed on the first ground selection line 112 and include, e.g., a silicon nitride layer, a silicon oxynitride layer and/or a silicon oxide layer. The first ground selection line capping pattern 114 and a side surface of the first ground selection line 112 may be aligned. The first ground selection semiconductor structure 116 may be disposed through the first ground selection line capping pattern 114, the first ground selection line 112, and the first interlayer dielectric 104. The first ground selection semiconductor structure 116 may include, e.g., a single crystalline semiconductor or a polycrystalline semiconductor. The first ground selection semiconductor structure 116 may be doped. One end of the first ground selection semiconductor structure 116 may contact the common source line 103. The first ground selection semiconductor structure 116 may be disposed in a matrix type structure through the first ground selection line 112.

The first ground selection line 112 and a side surface of the first ground selection line capping pattern 114 may contact a second interlayer dielectric 123. An upper surface of the second interlayer dielectric 123 and an upper surface of the first ground selection line capping pattern 114 may have the same height.

A third interlayer dielectric 132 may be disposed on the first ground selection line capping pattern 114. The third interlayer dielectric 132 may include, e.g., a silicon oxide layer, a silicon nitride layer, and/or a silicon oxynitride layer.

A first word line structure 140 may be disposed on the third interlayer dielectric 132. The first word line structure 140 may include, e.g., a first lower word line 142, a first lower word line dielectric pattern 143, a second lower word line 144, and a second lower word line dielectric pattern 145, which may be sequentially stacked. The lower word lines 142 and 144 may be stacked in two or more layers. At least one side of the first word line structure 140 may have a stair type structure. In the stair type structure portion of the first word line structure 140, the first lower word line dielectric pattern 143 and a side surface of the first lower word line 142 may be aligned and the second word line dielectric pattern 145 and a side surface of the second word line 144 may be aligned. The first and second lower word line dielectric patterns 143 and 145 may include, e.g., silicon oxide layers. The first and second lower word lines 142 and 144 may include, e.g., doped silicon. Thicknesses of the lower word lines 142 and 144 may be greater than thicknesses of the lower word line dielectric patterns 143 and 145. The lower word lines 142 and 144 may have plate type structures.

A first semiconductor structure 160 may be provided through the first word line structure 140. The first semiconductor structure 160 may be disposed in a matrix type structure and pass through a plane onto which the first lower word lines 142 are provided. The first semiconductor structure 160 may be aligned with the first ground selection semiconductor structure 116. A first gate dielectric 152 may be disposed between the first semiconductor structure 160 and the lower word lines 142 and 144.

The first gate dielectric 152 may include a charge trapping layer. One word line and the first semiconductor structure 160 may provide one memory cell. The first semiconductor structure 160 may include a channel region, source region, and drain region of a memory cell. The first semiconductor structure 160 may extend through the third interlayer dielectric 132. One end of the first semiconductor structure 160 may contact the first ground selection semiconductor structure 116. The first semiconductor structure 160 may include, e.g., a single crystalline semiconductor or a polycrystalline semiconductor. The semiconductor structure 160 may have a pillar type structure. In an implementation, the first semiconductor structure 160 may have a cylindrical shape or a hollow cylindrical shape.

A first string selection structure 148 may be disposed on the first word line structure 140. The first string selection structure 148 may include a first string selection line 146, a first string selection capping pattern 147, and a first string selection gate dielectric 149. The first string selection line 146 may extend in a first direction and have a line type structure. The first string selection line 146 and a side surface of the first string selection capping pattern 147 may be aligned. The first semiconductor structure 160 may extend through the first string selection line 146 and the first string selection capping pattern 147. The first string selection gate dielectric 149 may be disposed between the first semiconductor structure 160 and the first string selection line 146. A fourth interlayer dielectric 162 may be disposed at a side surface of the first word line structure 140 and a side surface of the first string selection structure 148. An upper surface of the fourth interlayer dielectric 162 and an upper surface of the first string selection capping pattern 147 may have the same height. A fifth interlayer dielectric 163 may be disposed between first string selection lines 146 and the first string selection capping patterns 147, which may be adjacent. An upper surface of the fifth interlayer dielectric 163 may be aligned with the upper surface of the first string selection capping pattern 147.

First lower contact plugs 172, 174, 176 and 178 may be disposed at a periphery of the stair type structure portion of the first word line structure 140. The first lower contact plugs may include a first common source line plug 172, a first ground selection line plug 174, and first lower word line plugs 176 and 178. The first lower contact plugs may be disposed through a portion of or disposed entirely through the fourth interlayer dielectric 162. Upper surfaces of the first lower contact plugs and the upper surface of the fourth interlayer dielectric 162 may have the same height. The first common source line plug 172 may extend through the third interlayer dielectric 132, the second interlayer dielectric 123, and the first interlayer dielectric 104. The first common source line plug 172 may electrically contact the first common source line 103. The first lower contact plugs may include, e.g., a metal, doped silicon, and/or a metal compound. The first ground selection line plug 174 may extend through the third interlayer dielectric 132. The first ground selection line plug 174 may electrically contact the first ground selection line 112. The first lower word line plugs 176 and 178 may be electrically connected to the first lower word line 142 and the second lower word line 144, respectively, through a portion of the fourth interlayer dielectric 162.

Another end of the first semiconductor structure 160 may be electrically connected to a bit line BL. The first string selection line 146, the first string selection gate dielectric 149, and the first semiconductor structure 160 may form the first string selection transistor SSTmna (see FIG. 1). The first string selection line 146 may extend in the first direction. Adjacent first string selection lines 146 may be electrically isolated from one another. The bit line BL may be patterned in a line type structure and may extend in a second direction that intersects with the first direction. A bit line capping pattern 167 may be disposed on the bit line BL. The bit line capping pattern 167 and a side surface of the bit line BL may be aligned. The bit line capping pattern 167 may include, e.g., a silicon oxide layer, a silicon nitride layer, and/or a silicon oxynitride layer. The bit line BL may be a conductive material that includes, e.g., doped silicon, a metal compound, and/or a metal. The bit line BL may have, e.g., a stack structure of metal silicide/polysilicon or polysilicon/metal silicide/polysilicon. A side surface of the bit line BL may contact a sixth interlayer dielectric 165. An upper surface of the sixth interlayer dielectric 165 and an upper surface of the bit line capping pattern 167 may have the same height.

Interconnection pads 169 may be disposed on the fourth interlayer dielectric 162. The interconnection pads 169 may be electrically connected to the first common source line plug 172, the first ground selection line plug 174, and the first lower word line plugs 176 and 178, respectively.

A second string selection structure 180 may be disposed on the bit line capping pattern 167. The second string selection structure 180 may include a second string selection line 182, a second string selection gate dielectric 186, and a second string selection semiconductor structure 188. The second string selection line 182 may extend in a first direction in a line type structure. The second string selection line 182 and a side surface of the second string selection capping pattern 184 may be aligned. The second string selection semiconductor structure 188 may be disposed through the second string selection line 182. A second string selection gate dielectric 186 may be disposed between the second string selection semiconductor structure 188 and the second string selection line 182. A seventh interlayer dielectric 189 may fill a space between adjacent second string selection lines 182. An upper surface of the seventh interlayer dielectric 189 may be aligned with an upper surface of the second string selection capping pattern 184.

A second word line structure 190 and a ground selection line structure 198 may be sequentially stacked on the seventh interlayer dielectric 189. The second word line structure 190 may include a first upper word line 192, a first upper word line dielectric pattern 193, a second upper word line 194, and a second upper word line dielectric pattern 195, which may be sequentially stacked. The upper word lines may be stacked in two or more layers. At least one side of the second word line structure 190 may have a stair type structure. In the stair type structure portion of the second word line structure 190, the first upper word line dielectric pattern 193 and a side surface of the first upper word line 192 may be aligned. In the stair type structure portion of the second word line structure 190, the second upper word line dielectric pattern 195 and a side surface of the second upper word line 194 may be aligned. The first and second upper word line dielectric patterns 193 and 195 may include, e.g., silicon oxide layers. The first and second upper word lines 192 and 194 may include, e.g., a doped silicon. The upper word lines 192 and 194 may have plate type structures.

The second ground selection line structure 198 may include a plate type structure of a second ground selection line 196 and a second ground selection line capping pattern 197, which may be sequentially stacked. The second word line structure 190 and the second ground selection line structure 198 may include stair type structures at one side thereof.

A second semiconductor structure 206 may be provided through the second ground selection line structure 198 and the second word line structure 190. The second semiconductor structure 206 may be disposed in a matrix type structure and pass through a plane onto which the upper word lines 192 and 194 are provided. A second gate dielectric 202 may be disposed between the second semiconductor structure 206 and the upper word lines 192 and 194. In an implementation, the second gate dielectric 202 may be disposed between the second semiconductor structure 206 and the second word line structure 190. A second ground selection gate dielectric 204 may be interposed between the second ground selection line 196 and the second semiconductor structure 206.

The second gate dielectric 202 may include a charge trapping layer. One word line and the second semiconductor structure 206 may form one memory cell. The second semiconductor structure 206 may provide the channel region, source region, and drain region of a memory cell. The second semiconductor structure 206 may be disposed through the second ground selection line capping pattern 197. The second semiconductor structure 206 may include, e.g., a single crystalline semiconductor or a polycrystalline semiconductor. The second semiconductor structure 206 may have a pillar type structure.

An eighth interlayer dielectric 212 may contact the second word line structure 190 and the second ground selection line structure 198. An upper surface of the eighth interlayer dielectric 212 and an upper surface of the second ground selection line structure 198 may have the same height.

A second common source line 210 may be disposed on the second ground selection structure 198. One end of the second semiconductor structure 206 may contact the second string selection semiconductor structure 188. Another end of the second semiconductor structure 206 may contact the second common source line 210. The second common source line 210 may be a conductor.

A side surface and an upper portion of the second common source line 210 may contact a ninth interlayer dielectric 216. An upper surface of the ninth interlayer dielectric 216 may be planarized. Second contact plugs 242 and 246 to 249 may pass through the ninth interlayer dielectric 216 and interlayer dielectrics in the lower portion of the ninth interlayer dielectric 216. The second contact plugs may include a bit line contact plug 249, a second string selection line contact plug 247, second word line contact plugs 248 and 246, a second ground selection line contact plug 244, and a second common source line contact plug 242.

First upper contact plugs 222, 224, 226, and 228 may be disposed over the stair type structure portion of the first word line structure 140. The first upper contact plugs 222, 224, 226, and 228 may be electrically connected to the first lower contact plugs 172, 174, 176, and 178, respectively. The first upper contact plugs 222, 224, 226, and 228 and the second contact plugs 242 and 246 to 249 may be electrically connected to interconnections 232.

Following is a description of a method for forming a vertical type semiconductor device according to an embodiment.

Figure 4A:
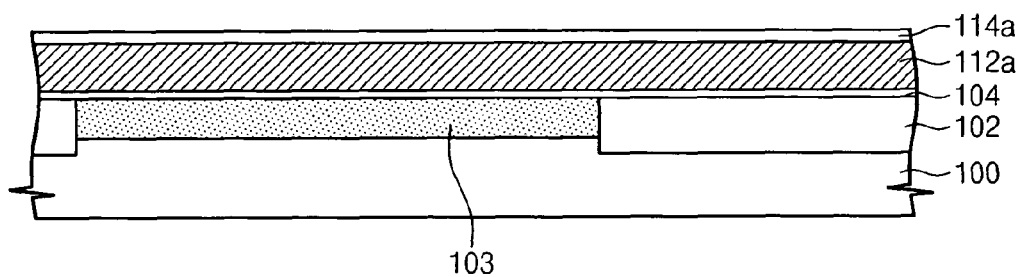
Figure 4B:
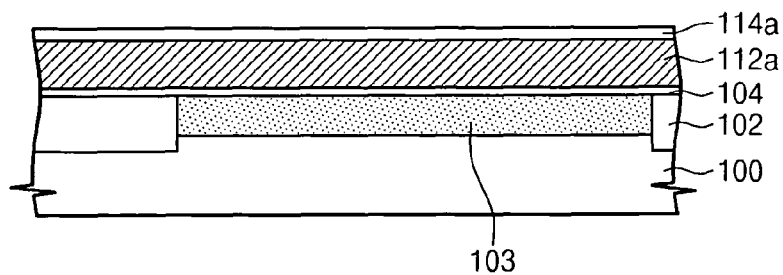

Referring to FIGS. 4A and 4B, a buffer oxide layer (not shown) and a silicon nitride layer (not shown) may be formed on a semiconductor substrate 100. A buffer oxide pattern (not shown), a silicon nitride pattern (not shown), and a trench (not shown) may be formed by, e.g., continuously patterning the buffer oxide layer, the silicon nitride layer, and the semiconductor substrate 100. The trench may be filled with an isolation layer 102 through, e.g., a Plasma Chemical Vapor Deposition (PCVD) process. The isolation layer 102 may be planarized to expose the silicon nitride pattern. The silicon nitride pattern and the buffer oxide pattern may be removed. That is, the isolation layer 102 may be formed through, e.g., a shallow trench isolation process.

A common source line 103 may be formed by, e.g., forming a sacrificial oxide layer (not shown) on the semiconductor substrate 100, patterning with a photoresist, and injecting ions. The sacrificial oxide layer may then be removed.

A first interlayer dielectric 104 may be formed on the common source line 103. The first interlayer dielectric 104 may include, e.g., a silicon oxide layer. An upper surface of the first interlayer dielectric 104 may be planarized. A first ground selection conductive layer 112a may be formed on the first interlayer dielectric 104. A first ground selection capping layer 114a may be disposed on the first ground selection conductive layer 112a. The ground selection conductive layer 112a may include, e.g., a single crystalline silicon or a polycrystalline silicon. In an implementation, the first ground selection conductive layer 112a may include, e.g., single crystalline silicon or polycrystalline silicon prepared by forming amorphous silicon and performing a subsequent crystallization process. The first ground selection capping layer 114a may include, e.g., a silicon nitride layer or a silicon oxynitride layer.

Figure 5A:
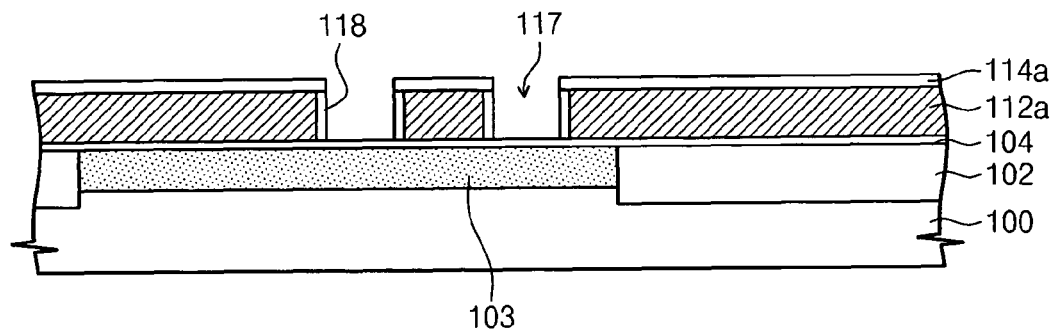
Figure 5B:
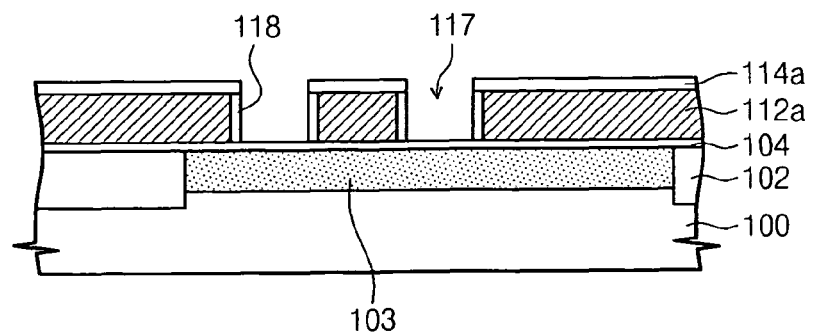

Referring to FIGS. 5A and 5B, a first ground selection hole 117 may be formed by, e.g., continuously patterning the first ground selection capping layer 114a, the first ground selection conductive layer 112a, and the first interlayer dielectric 104. The first ground selection hole 117 may be two-dimensionally arranged in a matrix type structure. A first ground selection gate dielectric 118 may be formed at a side surface of the first ground selection hole 117 by, e.g., thermally treating the semiconductor substrate 100 having the first ground selection hole 117. The first ground selection gate dielectric 118 may include, e.g., a silicon oxide layer.

Figure 6A:
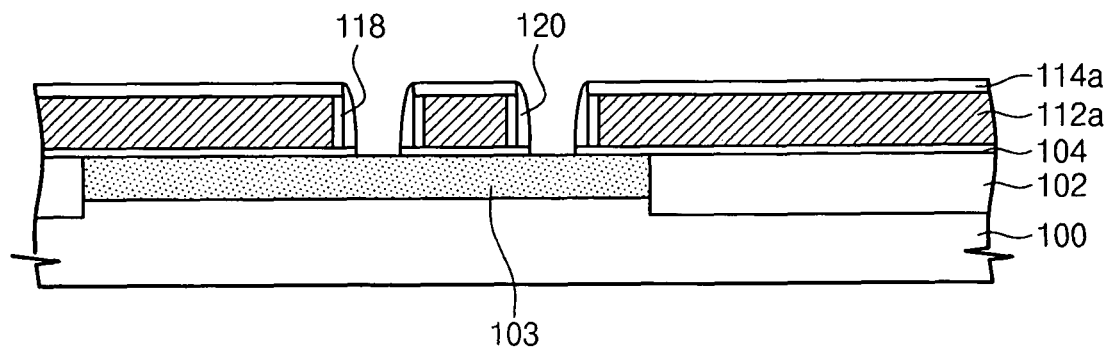
Figure 6B:
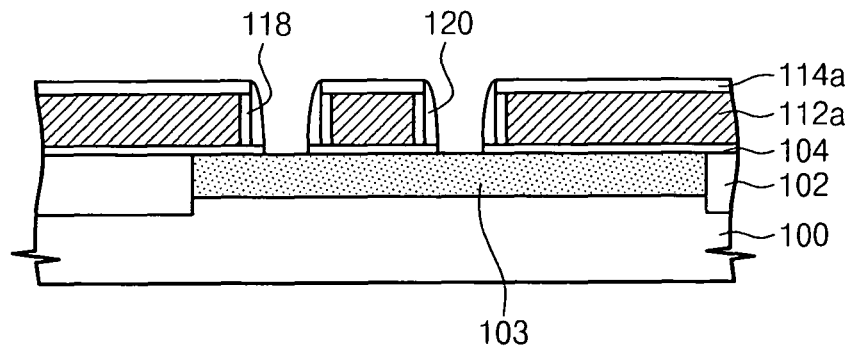

Referring to FIGS. 6A and 6B, a first ground selection spacer layer (not shown) may be conformally formed on the semiconductor substrate 100 having the first ground selection gate dielectric 118. The first ground selection spacer layer may include, e.g., a silicon oxynitride layer or a silicon layer. A first ground selection spacer 120 may be formed at an inner side surface of the first ground selection hole 117 by, e.g., isotropic etching of the ground selection spacer layer. Subsequently, portions of the first interlayer dielectric 104 disposed at a lower portion of the first ground selection hole 117 may be removed by, e.g., isotropic etching, and thus the common source line 103 may be exposed.

Figure 7A:
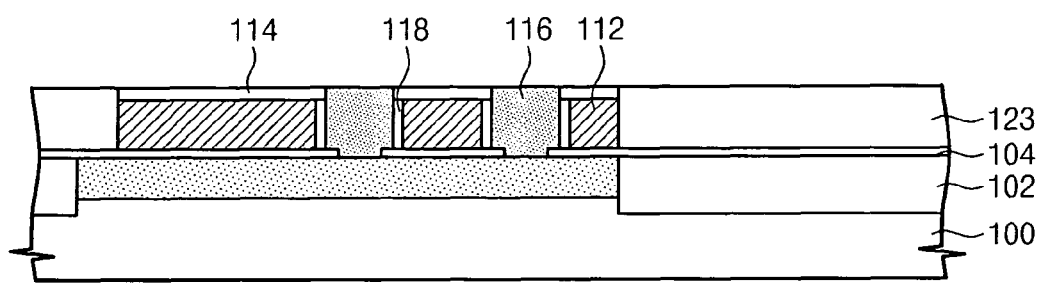
Figure 7B:
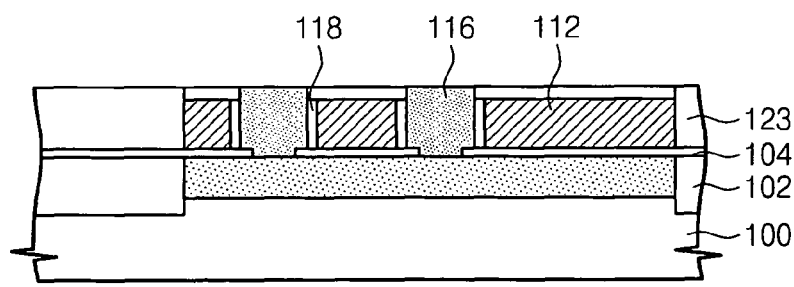

Referring to FIGS. 7A and 7B, the first ground selection spacer 120 may be selectively removed by, e.g., isotropic etching. The inside of the first ground selection hole 117 may be filled with a first ground selection semiconductor structure 116. The first ground selection semiconductor structure 116 may be formed by, e.g., selective epitaxial growth or by forming a semiconductor layer on the semiconductor substrate 100 through a chemical vapor deposition process and performing a planarization process.

A first ground selection capping pattern 114 and a first ground selection line 112 may be formed by, e.g., patterning the first ground selection capping layer 114a and the first ground selection conductive layer 112a. The first ground selection line 112 may have a plate type structure. The first ground selection structure 110 (see FIGS. 3B and 3C) may include the first ground selection line 112, the first ground selection semiconductor structure 116, and the first ground selection gate dielectric 118. The first ground selection structure 110 may form the first ground selection transistor GSTmna. A second interlayer dielectric 123 may be formed on the semiconductor substrate 100 having the first ground selection structure 110. An upper surface of the second interlayer dielectric 123 may be planarized. The upper surface of the second interlayer dielectric 123 and an upper surface of the first ground selection capping pattern 114 may have the same height.

Figure 8A:
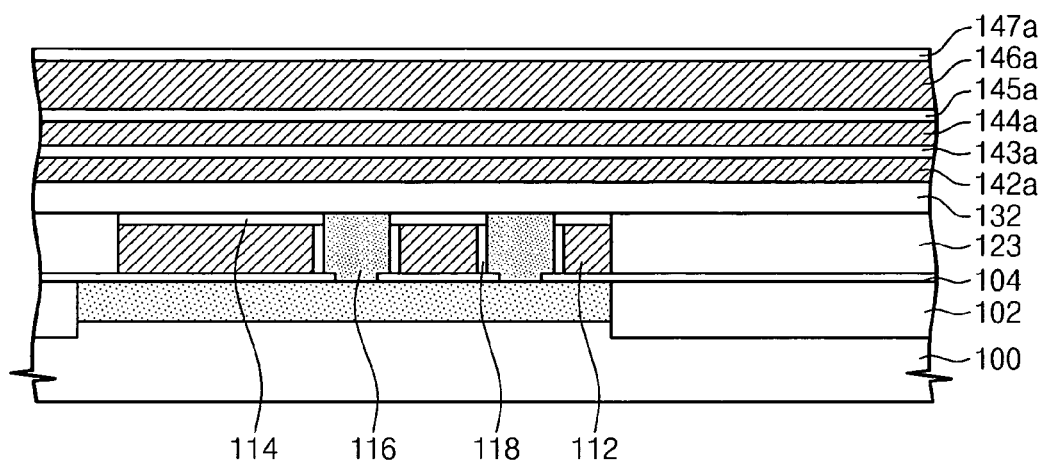
Figure 8B:
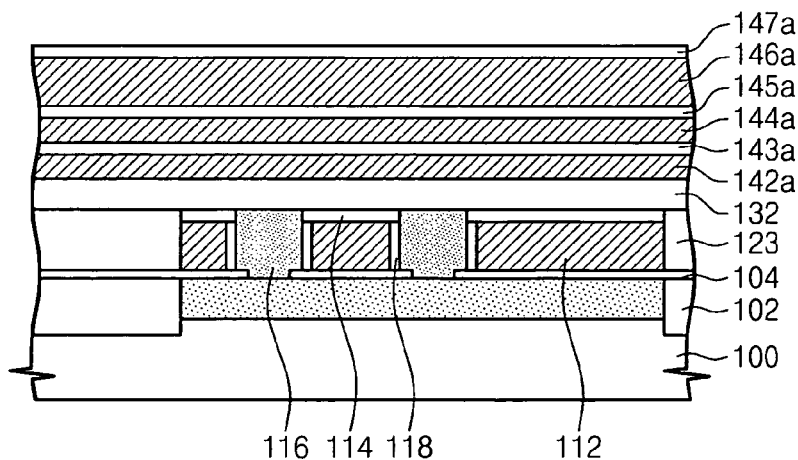

Referring to FIGS. 8A and 8B, a third interlayer dielectric 132 may be formed on the first ground selection capping pattern 114. The third interlayer dielectric 132 may include, e.g., a silicon oxide layer. A first lower word line conductive layer 142a, a first lower word line dielectric 143a, a second lower word line conductive layer 144a, and a second lower word line dielectric 145a may be sequentially stacked on the third interlayer dielectric 160. The first and second lower word line conductive layers 142a and 144a may include, e.g., doped silicon. The first and second lower word line dielectrics 143a and 145a may include, e.g., silicon oxide layers.

A first string selection conductive layer 146a and a first string selection capping layer 147a may be stacked on the second lower word line dielectric 145a. The string selection conductive layer 146a may include, e.g., doped silicon. The first string selection capping layer 147a may include, e.g., a silicon nitride layer, a silicon oxide layer, and/or a silicon oxynitride layer.

Figure 9A:
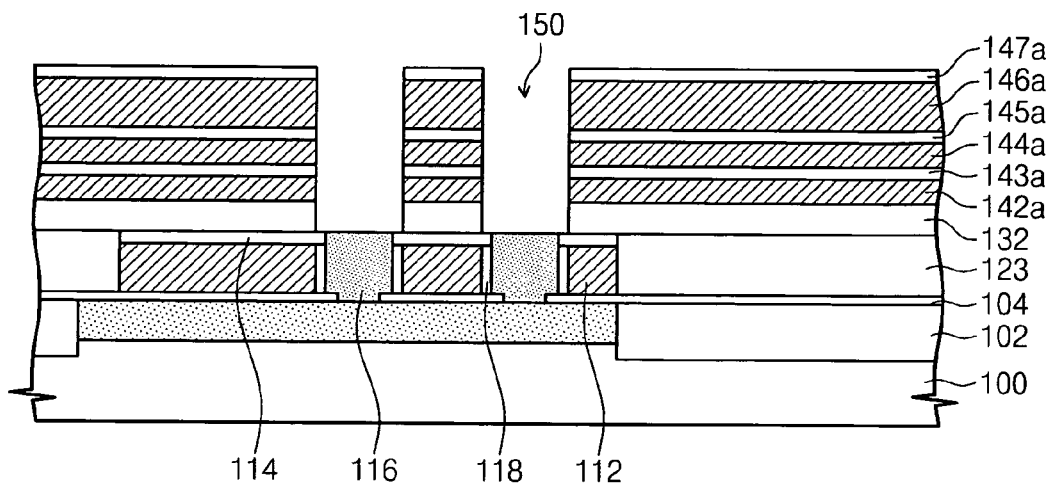
Figure 9B:
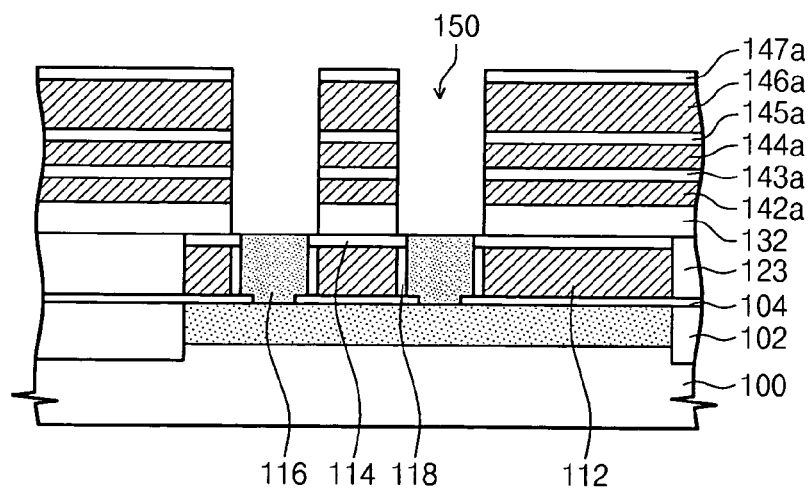

Referring to FIGS. 9A and 9B, a first string contact hole 150 may be formed by, e.g., patterning a lower structure under the first string selection capping layer 147a. The first string contact hole 150 may be formed in a matrix type structure. The first string contact hole 150 may pass through the lower word line conductive layers 142a and 144a and the lower word line dielectrics 143a and 145a.

The first string contact hole 150 may pass though the third interlayer dielectric 132. The first string contact hole 150 may expose an upper surface of the first ground selection semiconductor structure 116. The first string contact hole 150 may be disposed in alignment with the first ground selection semiconductor structure 116.

Figure 10A:
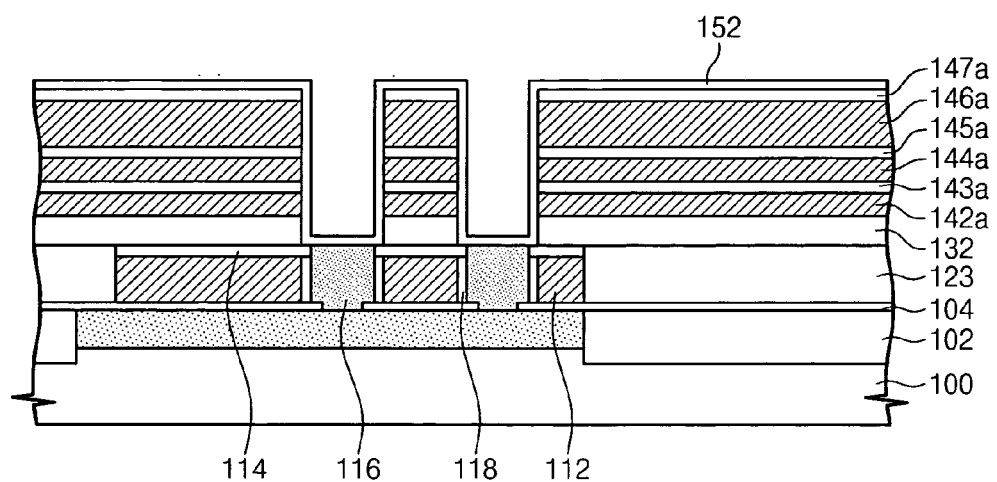
Figure 10B:
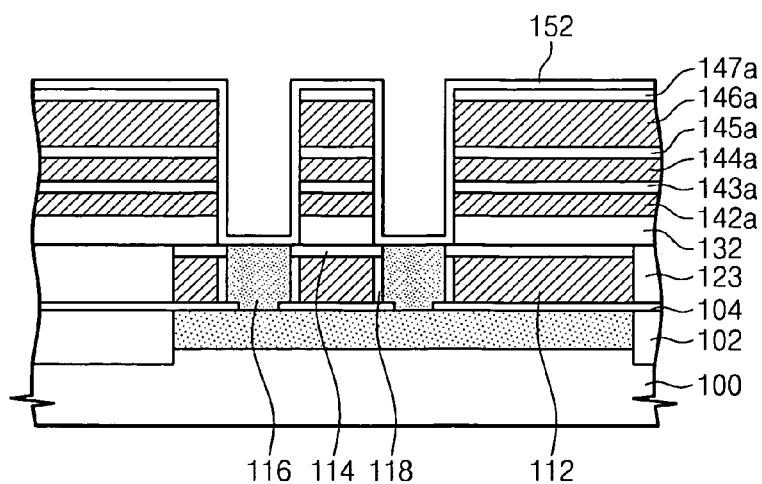

Referring to FIGS. 10A and 10B, a first gate dielectric 152 may be conformally formed on the semiconductor substrate 100 having the first string contact hole 150. The first gate dielectric 152 may include a charge trapping layer. The first gate dielectric 152 may have, e.g., a multi-layer structure of tunnel dielectric/charge trapping layer/blocking dielectric or an ONO multi-layer structure of silicon oxide layer/silicon nitride layer/silicon oxide layer. The charge trapping layer may include, e.g., a silicon nitride layer. The charge trapping layer may trap electric charges. The tunnel dielectric may include, e.g., a thermal oxide layer. The structure and material of the gate dielectric may be variously modified.

Figure 11A:
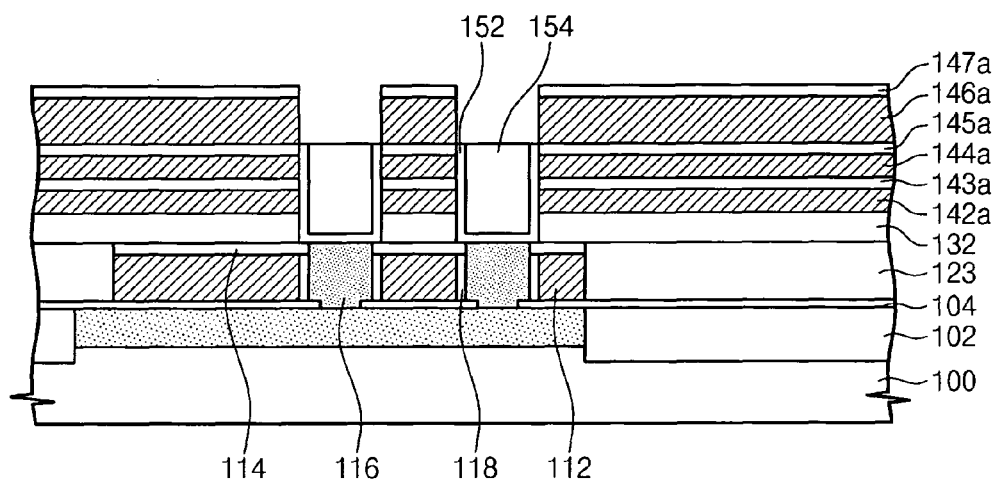
Figure 11B:
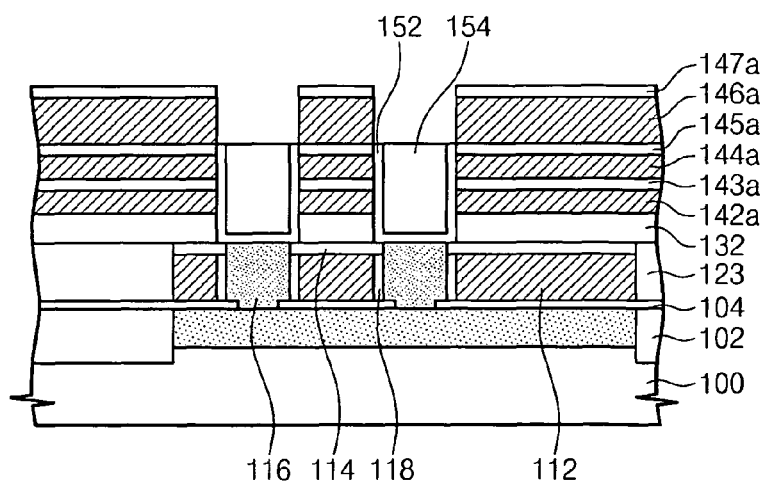

Referring to FIGS. 11A and 11B, an upper surface of a photoresist 154 may be substantially aligned with an upper surface of the second lower word line dielectric 145a by, e.g., forming and etching back the photoresist 154 on the semiconductor substrate 100 having the first gate dielectric 152. Subsequently, exposed portions of the first gate dielectric 152 may be removed by, e.g., wet etching.

Figure 12A:
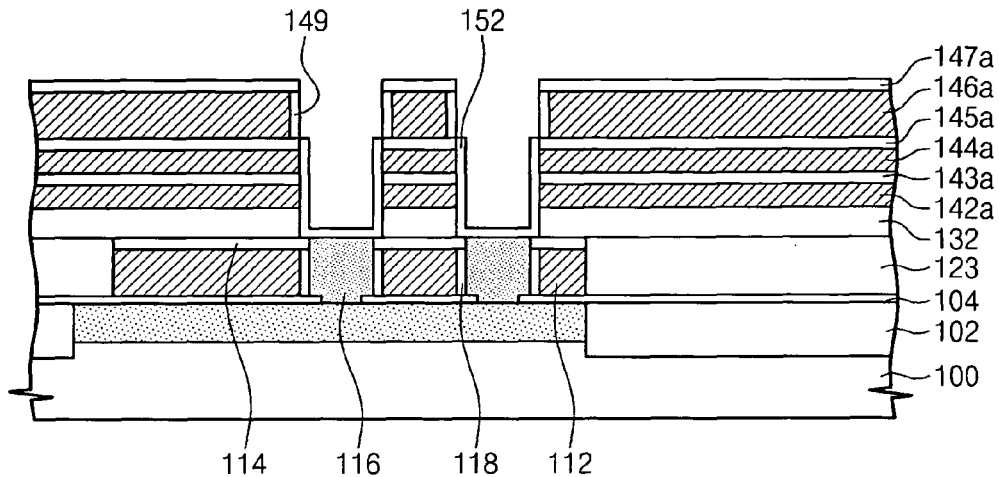
Figure 12B:
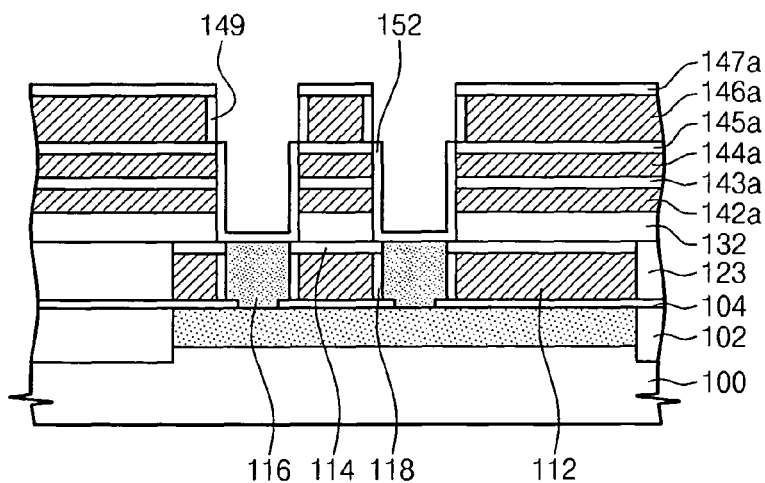

Referring to FIGS. 12A and 12B, the photoresist 154 in the first string contact hole 150 may be removed. A first string selection gate dielectric 149 may be formed by, e.g., thermally oxidizing the first string selection conductive layer 146a.

Figure 13A:
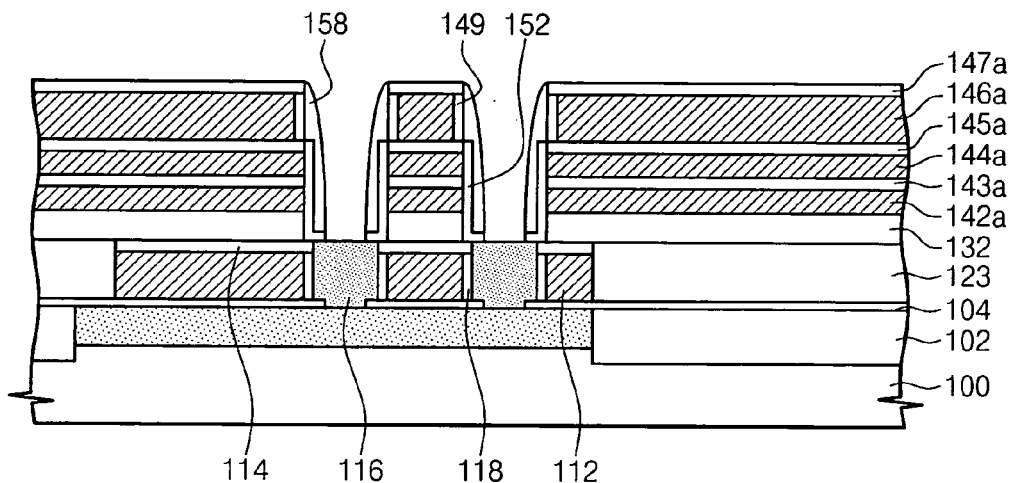
Figure 13B:
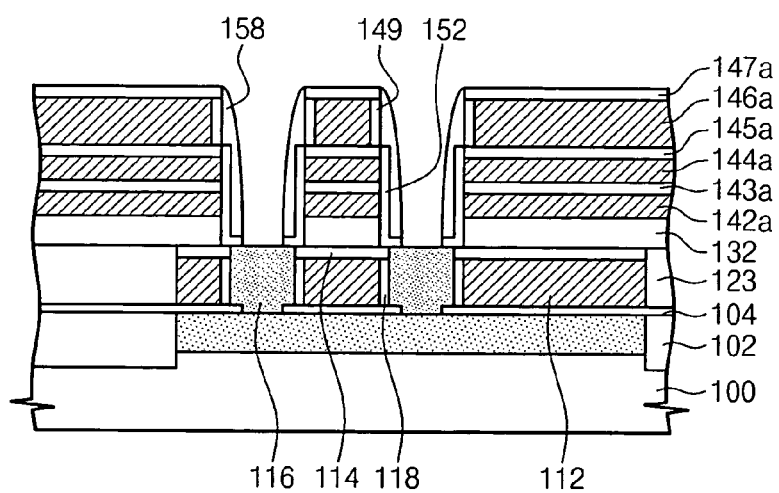

Referring to FIGS. 13A and 13B, a first string spacer layer (not shown) may be conformally formed on the semiconductor substrate 100. The first string spacer layer may include, e.g., a silicon nitride layer, a silicon oxynitride layer, or a silicon layer. A string spacer 158 may be formed at a side surface of the first string contact hole 150 by, e.g., isotropic etching of the first string spacer layer. Subsequently, a lower surface of the first gate dielectric 152 may be removed by additional etching. Etching may be performed by using the first string spacer 158 and the first string selection capping layer 147a as masks. Thus, portions of the first gate dielectric 152 on the first ground selection semiconductor structure 116 may be removed. Accordingly, at least a portion of the first ground selection semiconductor structure 116 may be exposed.

Figure 14A:
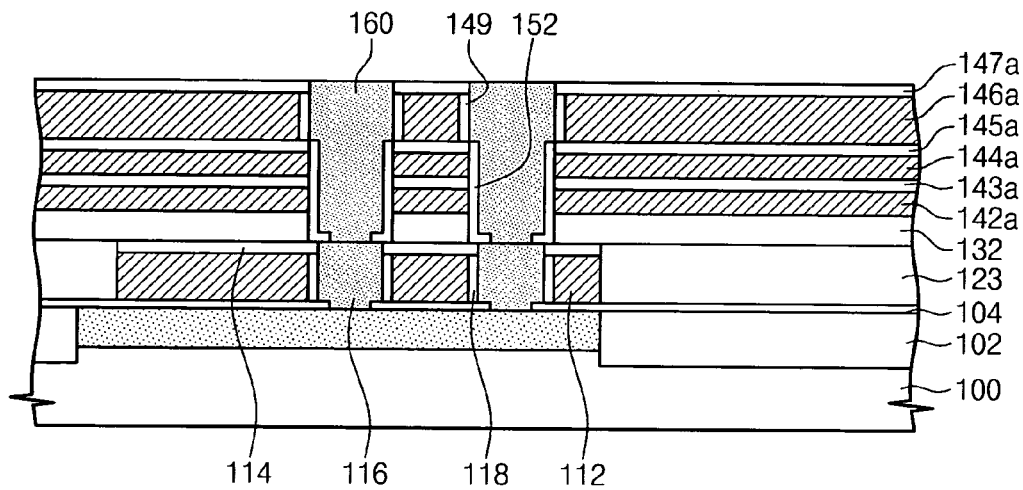
Figure 14B:
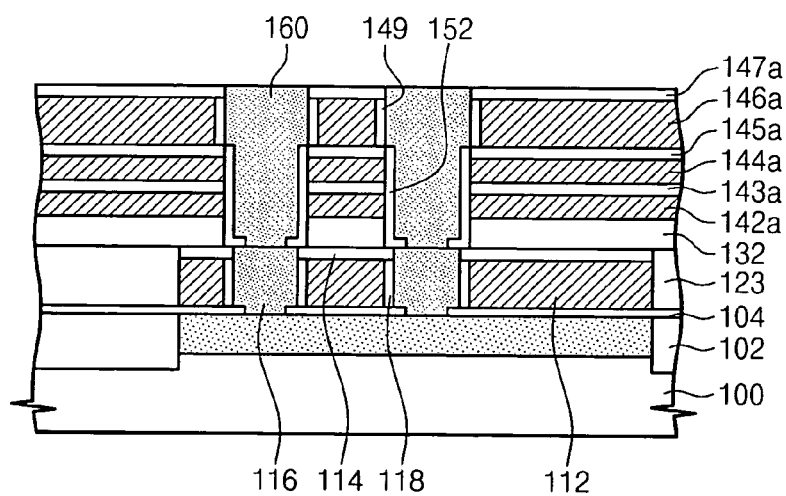

Referring to FIGS. 14A and 14B, the first string spacer 158 may be selectively removed by, e.g., isotropic etching. A first semiconductor structure 160 may be formed in a pillar type structure at the first string contact hole 150 by performing, e.g., a selective epitaxial growth process on the first ground selection semiconductor structure 116. The first semiconductor structure 160 may include, e.g., doped or undoped silicon. The first semiconductor structure 160 may fill the first string contact hole 150. Subsequently, the semiconductor substrate 100 having the first semiconductor structure 160 may be planarized.

Figure 15A:
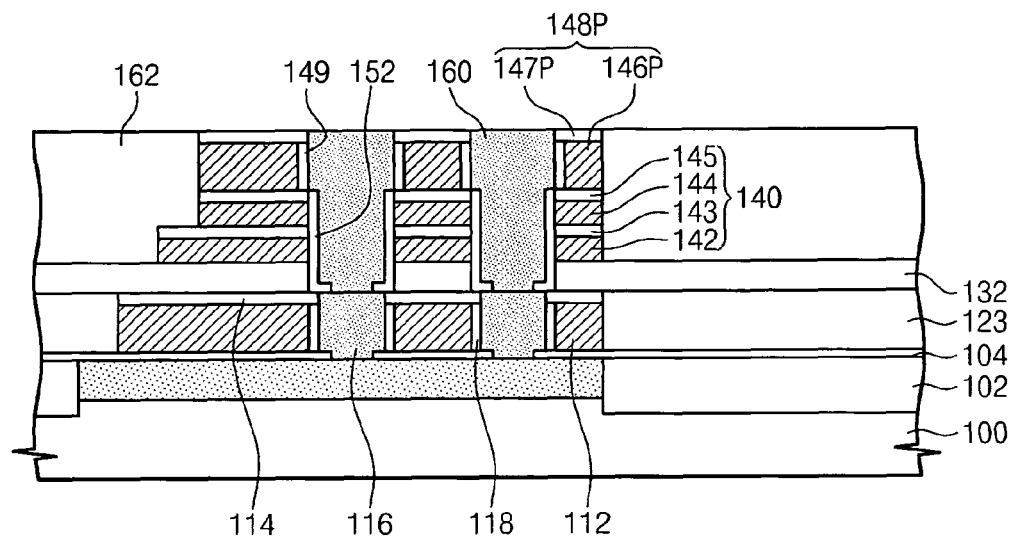
Figure 15B:
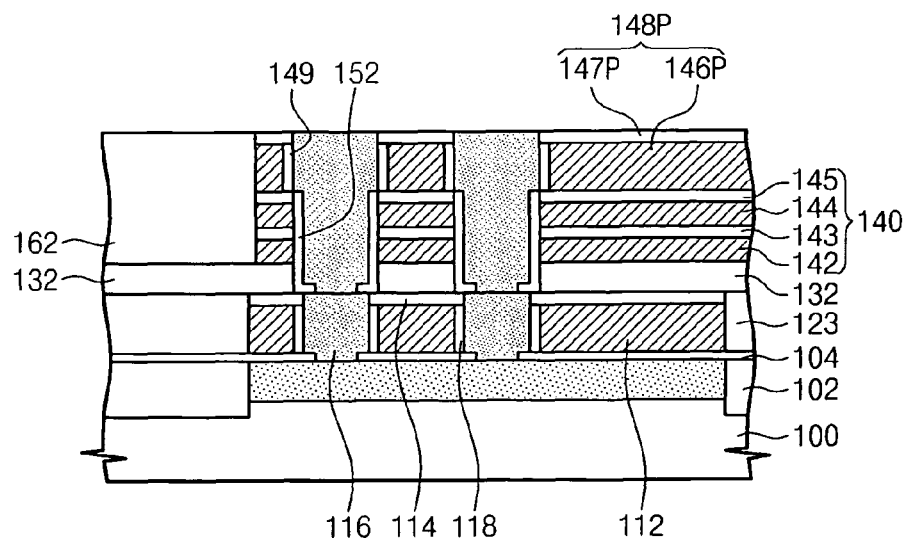

Referring to FIGS. 15A and 15B, an auxiliary string selection line structure 148p and a first word line structure 140 may be formed by, e.g., patterning a structure under the first string selection capping layer 147a. The patterning may be performed with a plurality of masks.

The first word line structure 140 may include a first lower word line 142, a first lower word line dielectric pattern 143, a second lower word line 144, and a second lower word line dielectric pattern 145. The first auxiliary string selection line structure 148p may be disposed on the first word line structure 140. The first auxiliary string selection line structure 148p may include a first auxiliary string selection line 146p and a first auxiliary string selection capping pattern 147p. The first auxiliary string selection line 146p and a side surface of the first auxiliary string selection capping pattern 147p may be aligned.

In a stair type structure portion of the first word line structure 140, the first lower word line 142 and a side surface of the first lower word line dielectric pattern 143 may be aligned. The second lower word line 144 and a side surface of the second lower word line dielectric pattern 145 may be aligned. A first string selection line structure 148 (see FIGS. 16A and 16B) may continuously form a stair type structure at the first word line structure 140 and the stair type structure portion.

A fourth interlayer dielectric 162 may be disposed on the first word line structure 140 and a side surface of the first auxiliary string selection line structure 148p. An upper surface of the fourth interlayer dielectric 162 may be planarized.

Figure 16A:
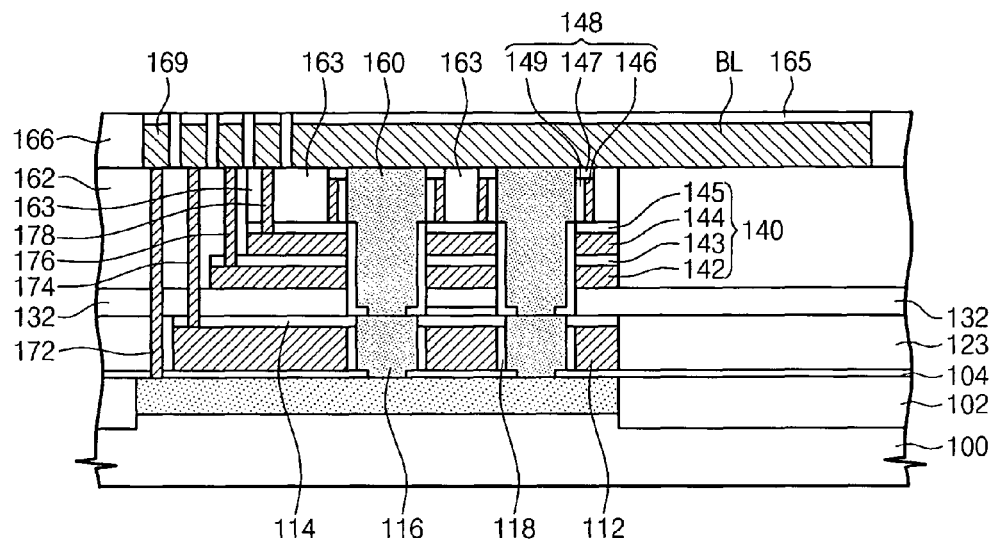
Figure 16B:
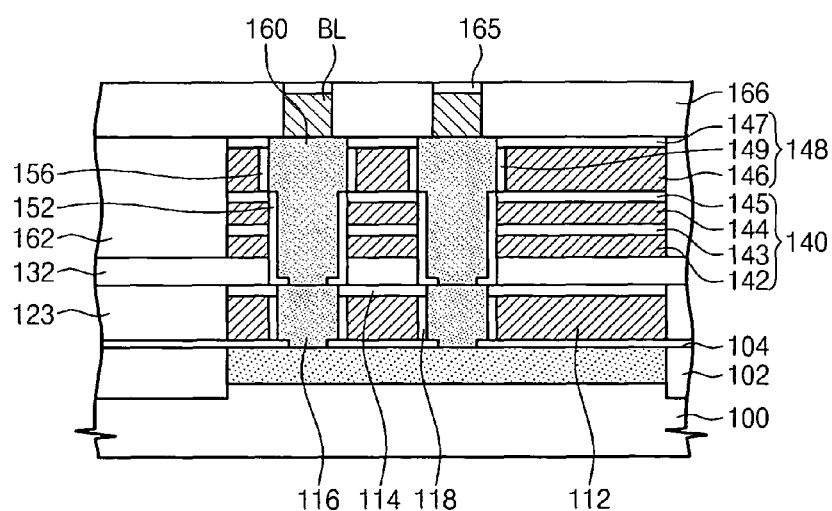

Referring to FIGS. 16A and 16B, a first string selection capping pattern 147 and a first string selection line 146 that extend in the first direction may be formed by, e.g., patterning the first auxiliary string selection capping pattern 147p and the first auxiliary string selection line 146p.

The first string selection structure 148 may include the first string selection line 146, the first string selection capping pattern 147, and a first string selection gate dielectric 149.

A fifth interlayer dielectric 163 may be formed on the semiconductor substrate 100 having the first string selection line 146. The fifth interlayer dielectric 163 may be planarized to expose the first string selection capping pattern 147. The interlayer dielectric 163 may include, e.g., a silicon oxide layer.

A first lower word line contact hole (not shown) exposing the first lower word line 142 and a second lower word line contact hole (not shown) exposing the second lower word line 144 may be formed by, e.g., patterning the fourth interlayer dielectric 162 and/or the fifth interlayer dielectric 163. A first ground selection contact hole (not shown) exposing the first ground selection line 112 may be formed by, e.g., patterning the fourth interlayer dielectric 162 and the third interlayer dielectric 132. A first common source contact hole (not shown) exposing a first common source line 112 may be formed by, e.g., continuously patterning the fourth interlayer dielectric 162, the third interlayer dielectric 132, the second interlayer dielectric 123, and the first interlayer dielectric 104.

A conductive layer may fill the first and second lower word line contact holes, the first ground selection contact hole, and the first common source contact hole. The conductive layer may be planarized to expose the fifth interlayer dielectric 162, thereby forming the first lower contact plugs 172, 174, 176, and 178. The first lower contact plugs 172, 174, 176, and 178 may include first and second lower word line contact plugs 176 and 178, a first ground selection contact plug 174, and a first common source contact plug 172.

A bit line conductive layer (not shown) and a bit line capping layer (not shown) may be formed on the semiconductor substrate 100 having the first and second lower word line contact plugs 176 and 178. A bit line capping pattern 165, which may extend in the second direction, and a bit line BL may be formed by, e.g., patterning the bit line capping layer and the bit line conductive layer. A conductive pad 169 may be disposed on the first lower contact plugs.

A sixth interlayer dielectric 166 may be formed on the semiconductor substrate 100 having the bit line BL. The sixth interlayer dielectric 166 may include, e.g., a silicon oxide layer. The sixth interlayer dielectric 166 may fill a space between the bit lines BL. An upper surface of the sixth interlayer dielectric 166 may be planarized. The upper surface of the sixth interlayer dielectric 166 and an upper surface of the bit line capping pattern 165 may have the same height.

Figure 17A:
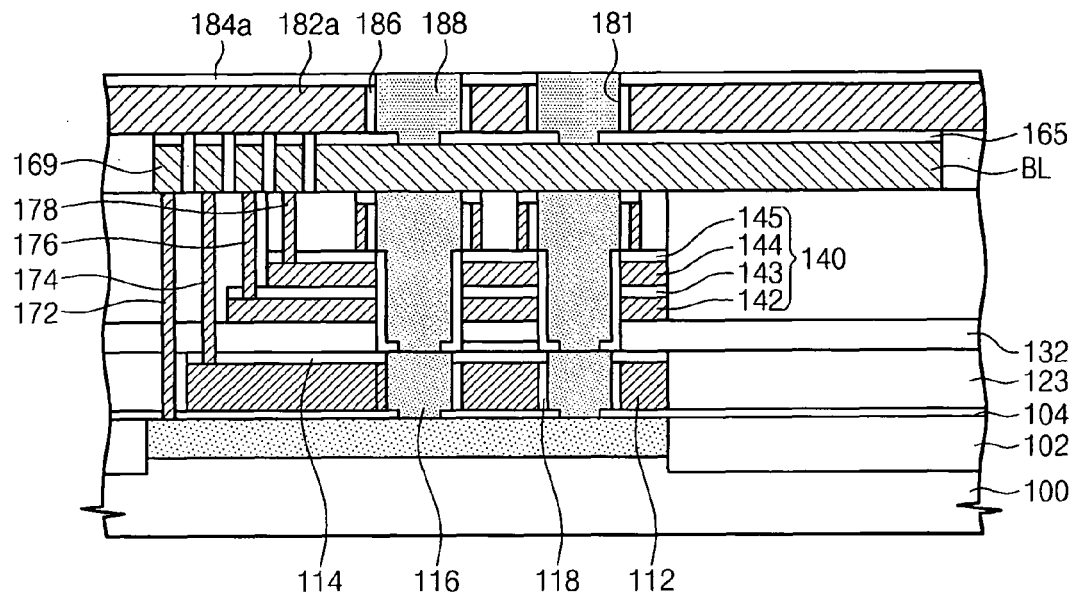
Figure 17B:
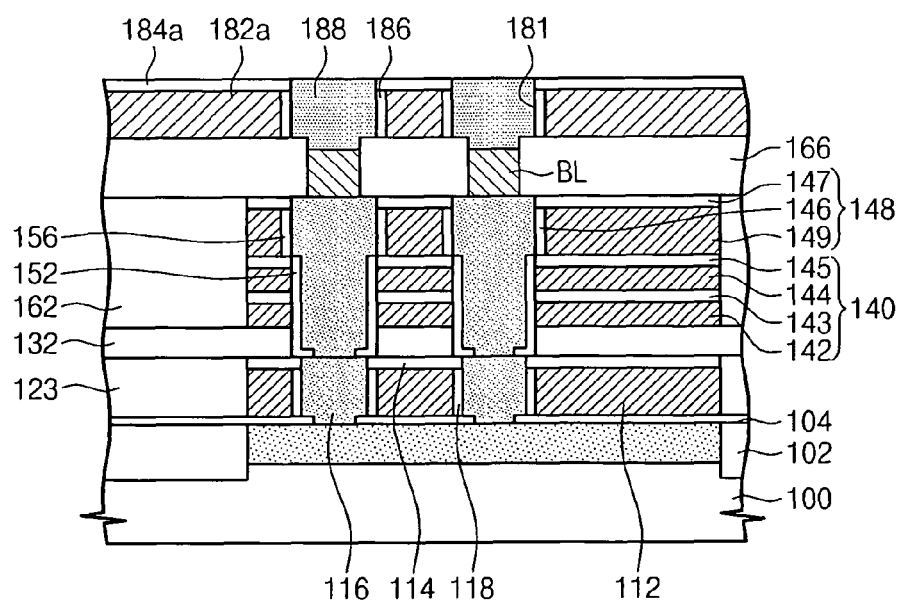

Referring to FIGS. 17A and 17B, a second string selection conductive layer 182a may be formed on the sixth interlayer dielectric 165. A second string selection capping layer 184a may be disposed on the second string selection conductive layer 182a. The second string selection conductive layer 182a may include, e.g., a single crystalline silicon or a polycrystalline silicon. In an implementation, the second string selection conductive layer 182a may include, e.g., single crystalline silicon or polycrystalline silicon prepared by forming amorphous silicon and performing a subsequent crystallization process. The second string selection capping layer 184a may include, e.g., a silicon nitride layer or a silicon oxynitride layer.

A string selection contact hole 181 may be formed by, e.g., continuously patterning the second string selection capping layer 184a and the second string selection conductive layer 182a. The string selection contact hole 181 may be two-dimensionally arranged in a matrix type structure. A second string selection gate dielectric 186 may be formed at an inner side surface of the string selection contact hole 181 by, e.g., thermally treating the semiconductor substrate 100 having the string selection contact hole 181. The second string selection gate dielectric 186 may include, e.g., a silicon oxide layer.

A second string selection spacer layer (not shown) may be conformally formed on a semiconductor substrate 100 having the second string selection gate dielectric 186. The second string selection spacer layer may include, e.g., a silicon oxynitride layer or a silicon layer. A second string selection spacer (not shown) may be formed at the inner side surface of the second string selection hole 181 by, e.g., isotropic etching of the second string selection spacer layer. Subsequently, portions of the bit line capping pattern 165 disposed at a lower portion of the second string selection hole 181 may be removed. Thus, the bit line BL may be exposed by, e.g., isotropic etching in the second string selection hole 181 where the second string selection spacer is disposed.

The second string selection spacer may be selectively removed by, e.g., isotropic etching. The inside of the second string selection hole 181 may be filled with a second string selection semiconductor structure 188. The second string selection semiconductor structure 188 may be formed by, e.g., a selective epitaxial growth process or by forming a semiconductor layer on the semiconductor substrate 100 through a chemical vapor deposition process and performing a planarization process.

Figure 18A:
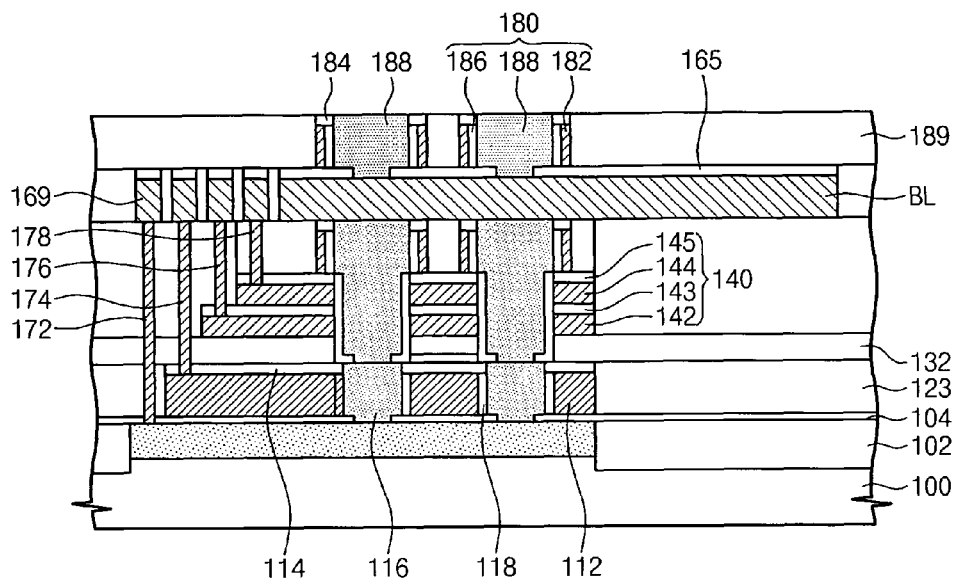
Figure 18B:
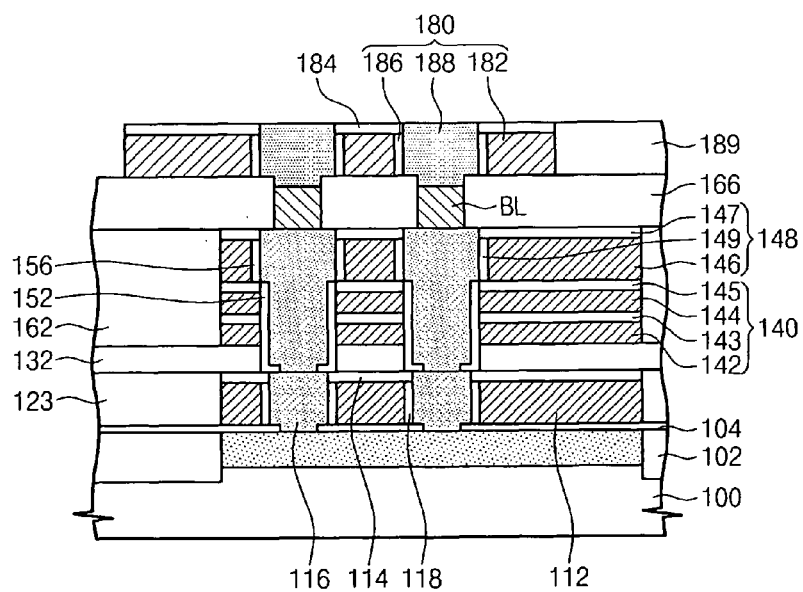

Referring to FIGS. 18A and 18B, a second string selection capping pattern 184 and a second string selection line 182 may be formed by, e.g., patterning the second string selection capping layer 184a and the second string selection conductive layer 182a. The second string selection line 182 may have a line type structure extending in the first direction. A second string selection structure 180 may include the second string selection line 182, the second string selection semiconductor structure 188, and the second string selection gate dielectric 186. The second string selection structure 180 may form the second string selection transistor SSTmnb.

A seventh interlayer dielectric 189 may be formed on the semiconductor substrate 100 having the second string selection structure 180. An upper surface of the seventh interlayer dielectric 189 may be planarized. The upper surface of the seventh interlayer dielectric 189 and an upper surface of the second string selection capping pattern 184 may have the same height.

Figure 19A:
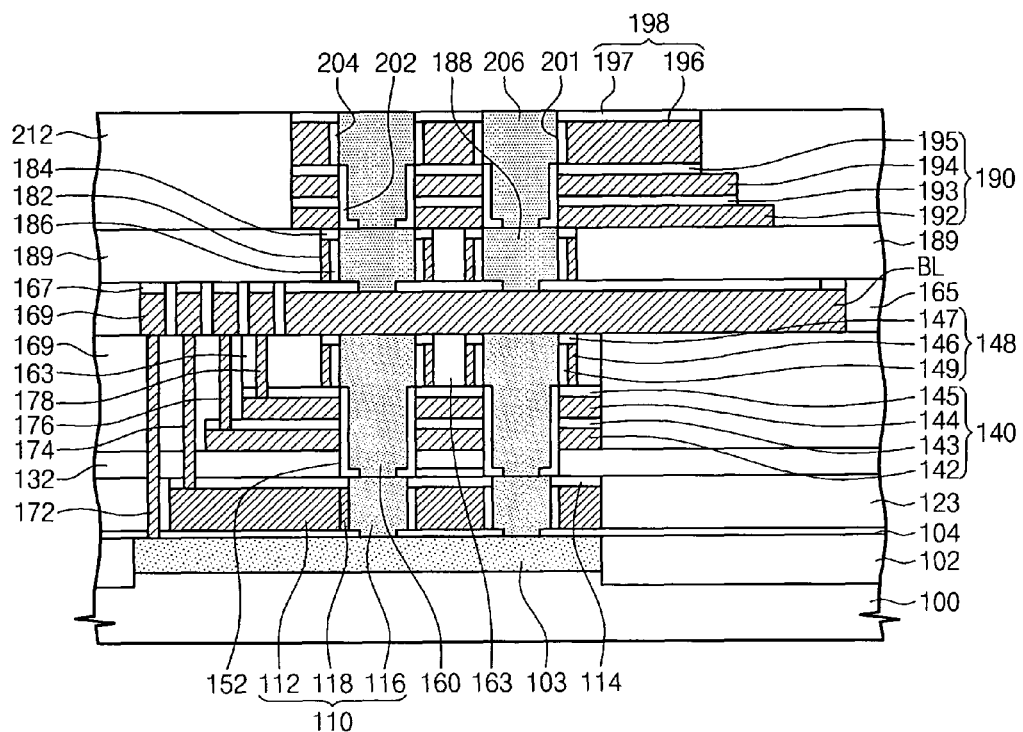
Figure 19B:
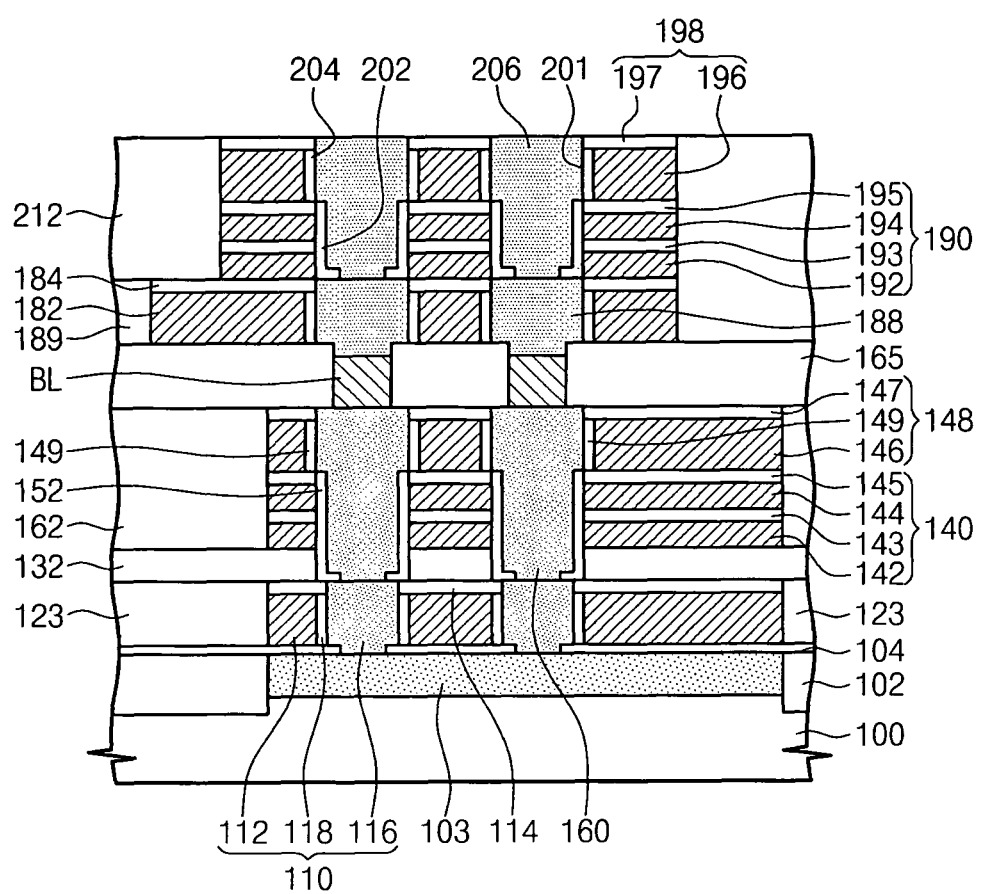

Referring to FIGS. 19A and 19B, a first upper word line conductive layer (not shown), a first upper word line dielectric (not shown), a second upper word line conductive layer (not shown), and a second upper word line dielectric (not shown) may be sequentially stacked on the seventh interlayer dielectric 189. The first and second upper word line conductive layers may each include, e.g., doped silicon. The first and second upper word line dielectrics may each include, e.g., silicon oxide layers.

A second string contact hole 201 may be formed by, e.g., patterning a lower structure under the second ground selection capping layer. The second string contact hole 201 may be formed in a matrix type structure. The second string contact hole 201 may pass through the upper word line conductive layers and the word line dielectrics. The second string contact hole 201 may expose an upper surface of the second string selection semiconductor structure 188. The second string contact hole 201 may be disposed in alignment with the second string selection semiconductor structure 188.

A second gate dielectric 202 may be conformally formed on the semiconductor substrate 100 having the second string contact hole 201. The second gate dielectric 202 may include a charge trapping layer. The second gate dielectric 202 may have, e.g., a multi-layer structure of tunnel dielectric/charge trapping layer/blocking dielectric or an ONO multi-layer structure of silicon oxide layer/silicon nitride layer/silicon oxide layer. The charge trapping layer may include, e.g., a silicon nitride layer. The charge trapping layer may trap electric charges. The tunnel dielectric may include, e.g., a thermal oxide layer. The structure and material of the gate dielectric may be variously modified.

An upper surface of a photoresist (not shown) may be substantially aligned with an upper surface of the second upper word line dielectric 195 by, e.g., forming and etching back the photoresist on the semiconductor substrate 100 having the second gate dielectric 202. Subsequently, exposed portions of the second gate dielectric 202 may be removed by, e.g., wet etching.

The photoresist that filled in the second string contact hole 201 may be removed. A second ground selection gate dielectric 204 may be formed by, e.g., thermally oxidizing the second ground selection conductive layer.

A second string spacer layer (not shown) may be conformally formed on the semiconductor substrate 100. The second string spacer layer may include, e.g., a silicon nitride layer, a silicon oxynitride layer, or a silicon layer. A string spacer (not shown) may be formed at a side surface of the second string contact hole 201 by, e.g., isotropic etching of the second string spacer layer. Subsequently, a lower surface of the second gate dielectric 202 may be removed by additional etching. Etching may be performed by using the string spacer and the ground selection capping layer as masks. Thus, portions of the second gate dielectric 202 disposed on the second string selection semiconductor structure 188 may be removed. Accordingly, portions of the second string selection semiconductor structure 188 may be exposed.

The second string spacer may be selectively removed by, e.g., isotropic etching. A second semiconductor structure 206 may be formed in a pillar type structure at the second string contact hole 201 by performing, e.g., a selective epitaxial growth process, on the second string selection semiconductor structure 188. The second semiconductor structure 206 may include, e.g., doped or undoped silicon. The second semiconductor structure 206 may fill the second string contact hole 201. Subsequently, the semiconductor substrate 100 having the second semiconductor structure 206 may be planarized.

A second ground selection line structure 198 and a second word line structure 190 may be formed by, e.g., patterning a structure under the second ground selection capping layer. The patterning may be performed with a plurality of masks.

The second word line structure 190 may include a first upper word line 192, a first upper word line dielectric pattern 193, a second upper word line 194, and a second upper word line dielectric pattern 195. The second ground selection line structure 198 may be disposed on the second word line structure 190. The second ground selection line structure 198 may include a second ground selection line 196 and a second ground selection capping pattern 197. The second ground selection line 196 and a side surface of the second ground selection capping pattern 197 may be aligned.

In the stair type structure portion of the second word line structure 190, the first upper word line 192 and a side surface of the first upper word line dielectric pattern 193 may be aligned. The second upper word line 194 and a side surface of the second upper word line dielectric pattern 195 may be aligned. The second ground selection line structure 198 may continuously form a stair type structure at the stair type structure portion of the second word line structure 190.

An eighth interlayer dielectric 212 may be disposed on the second word line structure 190 and a side surface of the second ground selection line structure 198. An upper surface of the eighth interlayer dielectric 212 may be planarized. The upper surface of the eighth interlayer dielectric 212 and an upper surface of the second ground selection capping pattern 197 may have the same height.

Referring again to FIGS. 3A through 3C, a common source conductive layer may be formed on the second ground selection capping pattern 197. A second common source line 210 may be formed by, e.g., patterning the common source conductive layer. A ninth interlayer dielectric 216 may be formed on the second common source line 210. An upper surface of the ninth interlayer dielectric 216 may be planarized.

Second contact plugs and first upper contact plugs may be formed by, e.g., patterning a structure under the ninth interlayer dielectric 216. Second contact plugs 242, 244, 246, 247, 248, 249, and 254 may include a second common source line contact plug 242, a second ground selection contact plug 244, a second upper word line contact plug 246, a first upper word line contact plug 248, a bit line contact plug 249, a first string selection line contact plug 247, and a second string selection contact plug 254. The first upper contact plugs 222, 224, 226, and 228 may include first and second upper word line contact plugs 226 and 228, a first upper ground selection contact plug 224, and a first upper common source contact plug 222.

A metal interconnection 232 may be disposed on the semiconductor substrate 100 having the second contact plugs.

Figure 20A:
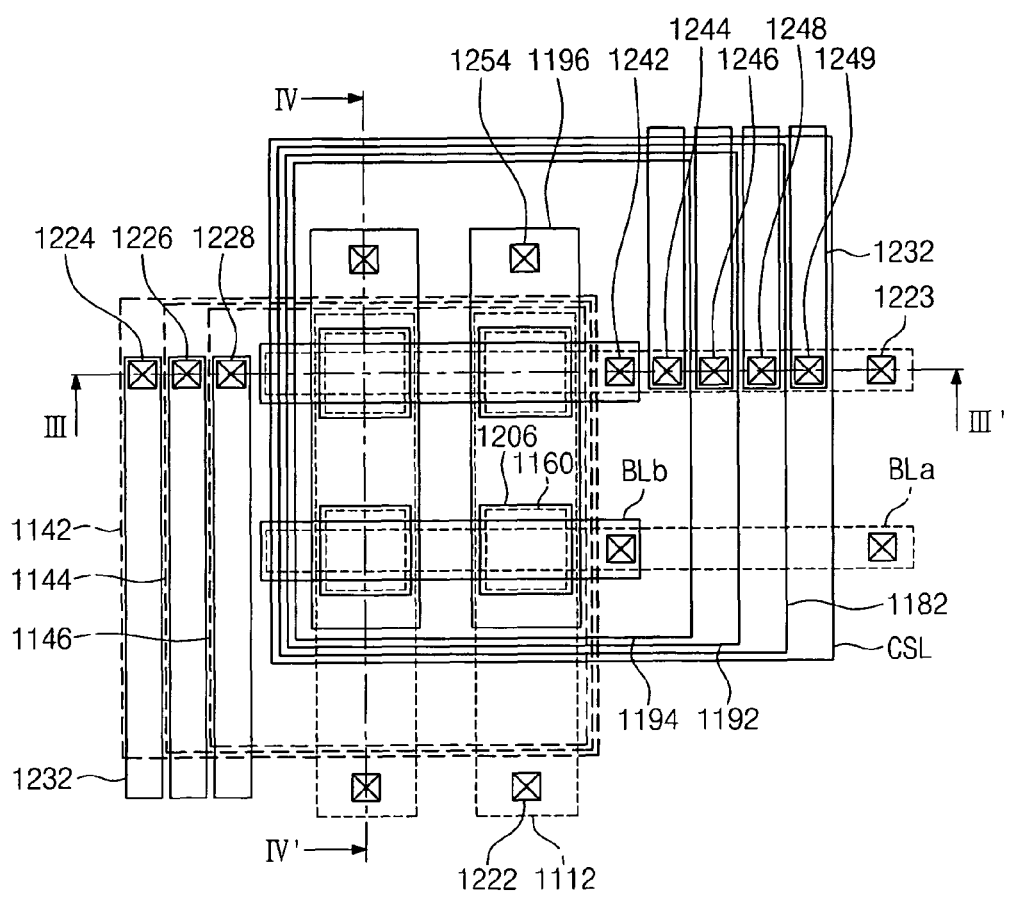
FIG. 20A illustrates a plan view of a vertical type semiconductor device according to an embodiment.
Figure 20B:
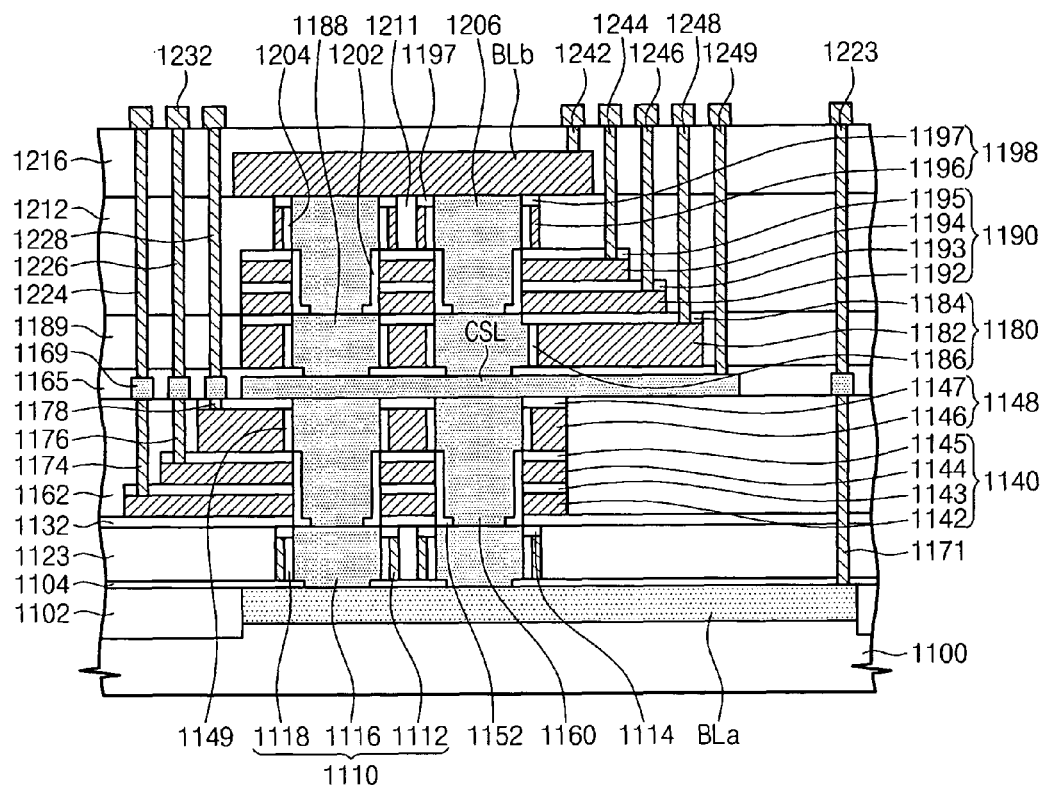
FIGS. 20B and 20C illustrate cross-sectional views of the vertical type semiconductor device of FIG. 20A.
Figure 20C:
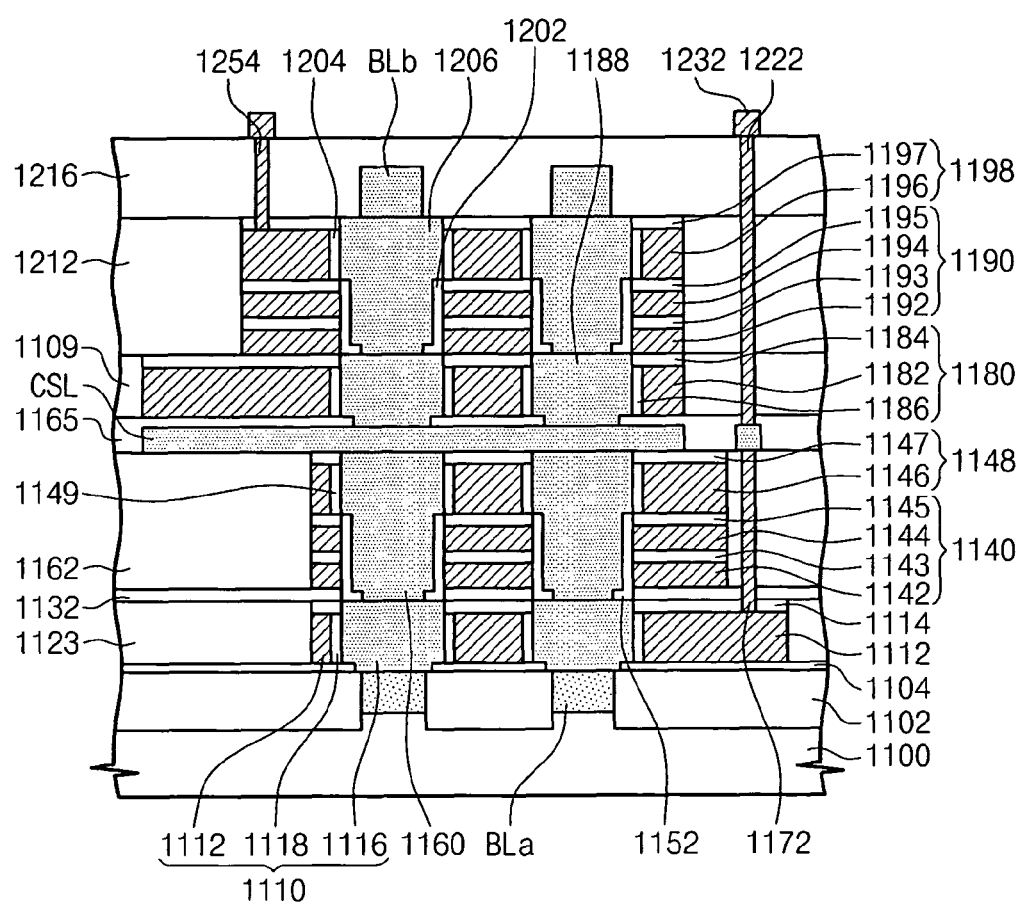

FIG. 20A illustrates a plan view of a vertical type semiconductor device according to another embodiment. FIGS. 20B and 20C illustrate cross-sectional views of the vertical type semiconductor device of FIG. 20A. FIG. 20B illustrates a cross-sectional view taken along line in FIG. 20A. FIG. 20C illustrates a cross-sectional view taken along line IV-IV' in FIG. 20A.

Referring to FIGS. 20A through 20C, an isolation layer 1102 may be disposed on a semiconductor substrate 1100. The isolation layer 1102 may define an active region. An upper surface of the isolation layer 1102 and the semiconductor substrate 1100 may have substantially the same height. The isolation layer 1102 may be formed by, e.g., a shallow trench isolation process. The isolation layer 1102 may include, e.g., a silicon oxide layer. The active region may be doped. The doped active region may be a first bit line BLa. The semiconductor substrate 1100 may be disposed in a plane that is defined by a first direction and a second direction crossing the first direction. The first bit line BLa may serve as a conductive layer. The first bit line BLa may extend in the second direction and have a line type structure. Adjacent first bit lines BLa may be isolated from one another by the isolation layer 1102. The first bit line BLa may include a conductive material, e.g., doped silicon, a metal compound, and/or a metal. The first bit line BLa may have, e.g., a stack structure of metal silicide/silicon or silicon/metal silicide/silicon.

A first interlayer dielectric 1104 may be disposed on the semiconductor substrate 1100. The first interlayer dielectric 1104 may include, e.g., a silicon oxide layer, a silicon nitride layer, and/or a silicon oxynitride layer. A first string selection structure 1110 may be disposed on the first interlayer dielectric 1104. The first string selection structure 1110 may extend in the first direction on the first bit line BLa. The first string selection structure 1110 may include the first string selection transistor SSTmna (see FIG. 2). The first string selection transistor SSTmna may include a first string selection line 1112, a first string selection semiconductor structure 1116, which may be disposed through the first string selection line 1112, and a first string selection gate dielectric 1118, which may be disposed between the first string selection semiconductor structure 1116 and the first string selection line 1112.

The string ground selection line 1112 may be formed of, e.g., a doped semiconductor material. A first string selection line capping pattern 1114 may be disposed on the first string selection line 1112. The first string selection line capping pattern 1114 may include, e.g., a silicon nitride layer, a silicon oxynitride layer, and/or a silicon oxide layer. The first string selection line capping pattern 1114 and a side surface of the first string selection line 1112 may be aligned. The first string selection semiconductor structure 1116 may be disposed through the first string selection line capping pattern 1114, the first string selection line 1112, and the first interlayer dielectric 1104. The first string selection semiconductor structure 1116 may include, e.g., a single-crystalline semiconductor or a polycrystalline semiconductor. The first string selection semiconductor structure 1116 may be doped. One end of the first string selection semiconductor structure 1116 may contact the first bit line BLa. The first string selection semiconductor structure 1116 may be disposed in a matrix type structure through the first string selection line 1112.

The first string selection line 1112 and the side surface of the first string selection line capping pattern 1114 may contact a second interlayer dielectric 1123. An upper surface of the second interlayer dielectric 1123 and an upper surface of the first string selection line capping pattern 1114 may have the same height.

A third interlayer dielectric 1132 may be disposed on the first string selection line capping pattern 1114. The third interlayer dielectric 1132 may include, e.g., a silicon oxide layer, a silicon nitride layer, and/or a silicon oxynitride layer.

A first word line structure 1140 may be disposed on the third interlayer dielectric 1132. The first word line structure 1140 may include a first lower word line 1142, a first lower word line dielectric pattern 1143, a second lower word line 1144, and a second lower word line dielectric pattern 1145, which may be sequentially stacked. The lower word lines 1142 and 1144 may be stacked in two or more layers. At least one side of the first word line structures 1140 may have a stair type structure. In the stair type structure portion of the first word line structure 1140, the first lower word line dielectric pattern 1143 and a side surface of the first lower word line 1142 may be aligned and the second word line dielectric pattern 1145 and a side surface of the second word line 1144 may be aligned. The first and second lower word line dielectric patterns 1143 and 1145 may each include, e.g., silicon oxide layers. The first and second lower word lines 1142 and 1144 may each include, e.g., doped silicon. Thicknesses of the lower word lines 1142 and 1144 may be greater than thicknesses of the lower word line dielectric patterns 1143 and 1145. The lower word lines 1142 and 1144 may have plate type structures.

A first semiconductor structure 1160 may be disposed through the first word line structure 1140. The first semiconductor structure 1160 may be disposed in a matrix type structure and pass through a plane onto which the first lower word lines are provided. The first semiconductor structure 1160 may be aligned with the first string selection semiconductor structure 1116. A first gate dielectric 1152 may be disposed between the first semiconductor structure 1160 and the lower word lines 1142 and 1144. In an implementation, the first gate dielectric 1152 may be disposed between the first semiconductor structure 1160 and the first word line structure 1140.

The first gate dielectric 1152 may include a charge trapping layer. One word line and the first semiconductor structure 1160 may form one memory cell. The first semiconductor structure 1160 may provide the channel region, source region, and drain region of a memory cell. The first semiconductor structure 1160 may extend through the third interlayer dielectric 1132. One end of the first semiconductor structure 1160 may contact the first string selection semiconductor structure 1116. The first semiconductor structure 1160 may include, e.g., a single crystalline semiconductor or a polycrystalline semiconductor. The first semiconductor structure 1160 may have, e.g., a pillar type structure. In an implementation, the first semiconductor structure 1160 may have, e.g., a cylindrical shape or a hollow cylindrical shape.

A first ground selection structure 1148 may be disposed on the first word line structure 1140. The first ground selection structure 1148 may include a first ground selection line 1146 and a first ground selection capping pattern 1147. The first ground selection line 1146 may have a plate type structure. The first ground selection line 1146 and a side surface of the first ground selection capping pattern 1147 may be aligned. The first semiconductor structure 1160 may extend through the first ground selection line 1146 and the first ground selection capping pattern 1147. A first ground selection gate dielectric 1149 may be disposed between the first semiconductor structure 1160 and the first ground selection line 1146. A fourth interlayer dielectric 1162 may be disposed at a side surface of the first word line structure 1140 and a side surface of the first ground selection structure 1148. An upper surface of the fourth interlayer dielectric 1162 and an upper surface of the first ground selection capping pattern 1147 may have the same height.

First lower contact plugs 1171, 1172, 1174, 1176, and 1178 may be disposed at a periphery of the first word line structure 1140. The first lower contact plugs may include a first lower bit line contact plug 1171, a first lower string selection line contact plug 1172, first lower word line contact plugs 1174 and 1176, and a first lower ground selection line contact plug 1178.

The first lower contact plugs may be disposed through a portion of, or disposed entirely through, the fourth interlayer dielectric 1162. Upper surfaces of the first lower contact plugs and an upper surface of the fourth interlayer dielectric 1162 may have the same height. The first lower contact plugs may include a conductive material, e.g., metal, doped silicon, and/or a metal compound.

Another end of the first semiconductor structure 1160 may be electrically connected to a common source line CSL. The common source line CSL may have a plate type structure.

The common source line CSL may include a conductive material, e.g., doped silicon, a metal compound, and/or metal. The common source line CSL may have, e.g., a stack structure of metal silicide/polysilicon or polysilicon/metal silicide/polysilicon. Interconnection pads 1169 may be disposed on the fourth interlayer dielectric 1162. The interconnection pads 1169 may be electrically connected to respective first lower contact plugs. A fifth interlayer dielectric 1165 may be disposed on the common source line CSL. An upper surface of the fifth interlayer dielectric 1165 may be planarized.

A second ground selection structure 1180 may be disposed on the fifth interlayer dielectric 1165. The second ground selection structure 1180 may include a second ground selection line 1182, a second ground selection capping pattern 1184, and a second ground selection gate dielectric 1186. The second ground selection line 1182 may have a plate type structure. The second ground selection line 1182 and a side surface of the second ground selection capping pattern 1184 may be aligned. A second ground selection semiconductor structure 1188 may be disposed through the second ground selection line 1182 and the second ground selection capping pattern 1184. A second ground selection gate dielectric 1186 may be disposed between the second ground selection semiconductor structure 1188 and the second ground selection line 1182. A sixth interlayer dielectric 1189 may be disposed at a side surface of the second ground selection line 1182. An upper surface of the sixth interlayer dielectric 1189 may be aligned with an upper surface of the second ground selection capping pattern 1184.

A second word line structure 1190 and a second string selection line structure 1198 may be sequentially stacked on the sixth interlayer dielectric 1189. The second word line structure 1190 may include a first upper word line 1192, a first upper word line dielectric pattern 1193, a second upper word line 1194, and a second upper word line dielectric pattern 1195, which may be sequentially stacked. The upper word lines may be stacked in two or more layers. At least one side of the second word line structure 1190 may have a stair type structure. In the stair type structure portion of the second word line structure 1190, the first upper word line dielectric pattern 1193 and a side surface of the first upper word line 1192 may be aligned. In the stair type structure portion of the second word line structure 1190, the second upper word line dielectric pattern 1195 and the side surface of the second upper word line 1194 may be aligned. The first and second upper word line dielectric patterns 1193 and 1195 may each include, e.g., silicon oxide layers. The first and second upper word lines 1192 and 1194 may each include, e.g., doped silicon. The upper word lines 1192 and 1194 may each have plate type structures.

The second string selection line structure 1198 may include a second string selection line 1196 and a second string selection line capping pattern 1197, which may be sequentially stacked. The second word line structure 1190 and the second string selection line structure 1198 may include stair type structures at one side thereof. The second string selection line 1196 may extend in the first direction and have a line type structure.

A second semiconductor structure 1206 may be disposed through the second string selection line structure 1198 and the second word line structure 1190. The second semiconductor structure 1206 may have a matrix type structure and pass through a plane onto which the upper word lines 1192 and 1194 are provided. A second gate dielectric 1202 may be disposed between the second semiconductor structure 1206 and the upper word lines 1192 and 1194. In an implementation, the second gate dielectric 1202 may be disposed between the second semiconductor structure 1206 and the second word line structure 1190. A second string selection gate dielectric 1204 may be interposed between the second string selection line 1196 and the second semiconductor structure 1206.

The second gate dielectric 1202 may include a charge trapping layer. An intersection point of one word line and the second semiconductor structure 1206 may form one memory cell. The second semiconductor structure 1206 may provide the channel region, source region, and drain region of a memory cell. The second semiconductor structure 1206 may extend through the second string selection line capping pattern. The second semiconductor structure 1206 may include, e.g., a single crystalline semiconductor or a polycrystalline semiconductor. The second semiconductor structure 1206 may have a pillar type structure.

A seventh interlayer dielectric 1212 may contact the second word line structure 1190 and a side surface of the second string selection line structure 1198. An upper surface of the seventh interlayer dielectric 1212 and an upper surface of the second string selection line capping pattern 1197 may have the same height. Each space between the second string selection lines 1196 may be filled with an eighth interlayer dielectric 1211. An upper surface of the eighth interlayer dielectric 1211 may be planarized. The upper surface of the eighth interlayer dielectric 1211 and an upper surface of the second string selection line capping pattern 1197 may have the height.

A second bit line BLb may be disposed on the second string selection structure 1198. One end of the second semiconductor structure 1206 may contact the second ground selection semiconductor structure 1188. Another end of the second semiconductor structure 1206 may contact the second bit line BLb. The bit line BLb may be a conductor. The bit line BLb may extend in the second direction and have a line type structure. A ninth interlayer dielectric 1216 may be disposed on the semiconductor substrate 1100 having the second bit line BLb. An upper surface of the ninth interlayer dielectric 1216 may be planarized.

Second contact plugs 1242, 1244, 1246, 1248, 1249, and 1254 may pass through the interlayer dielectrics of the lower portion of the ninth interlayer dielectric 1216. The second contact plugs may include a second bit line contact plug 1242, a second string selection line contact plug 1254, second word line contact plugs 1244 and 1246, a second ground selection line contact plug 1248, and a common source line contact plug 1249.

First upper contact plugs 1222, 1224, 1226, 1228, and 1223 may be disposed on the first lower contact plugs. The first upper contact plugs 1222, 1224, 1226, 1228, and 1223 may be electrically connected to the first lower contact plugs 1172, 1174, 1176, 1178, and 1171, respectively. The first upper contact plug and the second contact plugs may be electrically connected to metal interconnections 1232.

Following is a description of a method for forming a vertical type semiconductor device according to another embodiment.

Figure 21A:
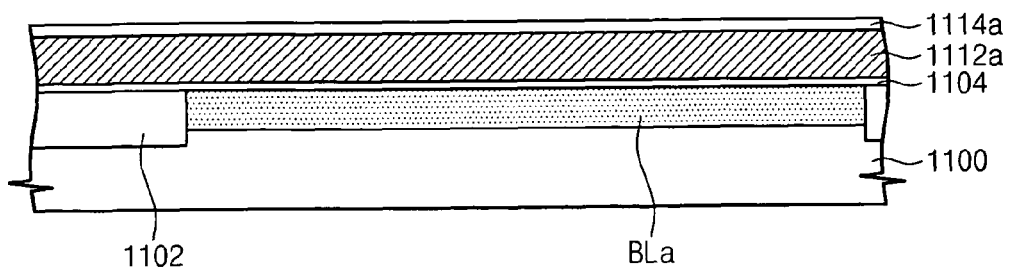
Figure 21B:
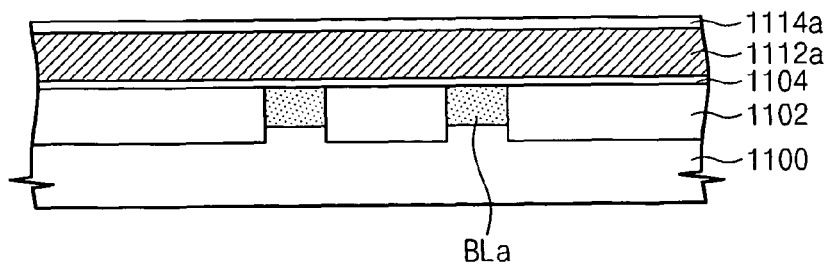

Referring to FIGS. 21A and 21B, a buffer oxide layer (not shown) and a silicon nitride layer (not shown) may be formed on a semiconductor substrate 1100. A buffer oxide pattern (not shown), a silicon nitride pattern (not shown) and a trench (not shown) may be formed by, e.g., continuously patterning the buffer oxide layer, the silicon nitride layer, and the semiconductor substrate 1100. The trench may be filled with an isolation layer 1102 through, e.g., a PCVD process. The isolation layer 1102 may be planarized to expose the silicon nitride pattern. The silicon nitride pattern and the buffer oxide pattern may be removed. Thus, the isolation layer 1102 may be formed through, e.g., a shallow trench isolation process.

A first bit line BLa may be formed by, e.g., forming a sacrificial oxide layer (not shown) on the semiconductor substrate 1100, performing patterning with a photoresist, and injecting ions. The first bit line BLa may extend in the second direction. The isolation layer 1102 may be interposed between first bit lines BLa.

A first interlayer dielectric 1104 may be formed on the first bit line BLa. The first interlayer dielectric 1104 may include, e.g., a silicon oxide layer. An upper surface of the first interlayer dielectric 1104 may be planarized. A first string selection conductive layer 1112a may be formed on the first interlayer dielectric 1104. A first string selection capping layer 1114a may be disposed on the first string selection conductive layer 1112a. The first string selection conductive layer 1112a may include, e.g., a single crystalline silicon or a polycrystalline silicon. In an implementation, the first string selection conductive layer 1112a may include, e.g., single crystalline silicon or polycrystalline silicon prepared by forming amorphous silicon and performing a subsequent crystallization process. The first string selection capping layer 1114a may include, e.g., a silicon nitride layer or a silicon oxynitride layer.

Figure 22A:
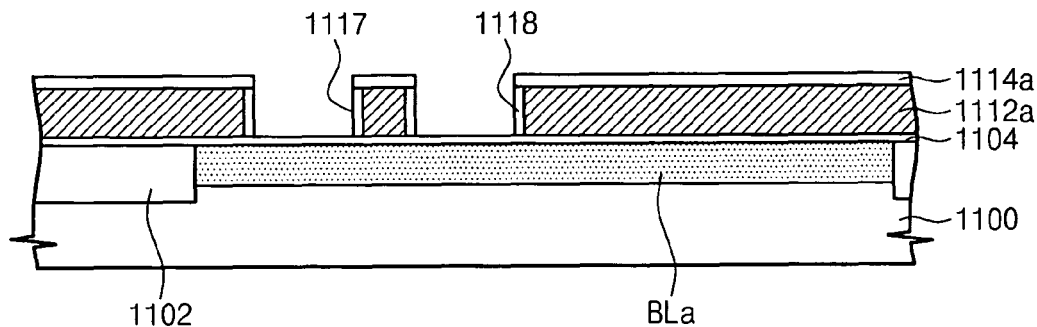
Figure 22B:
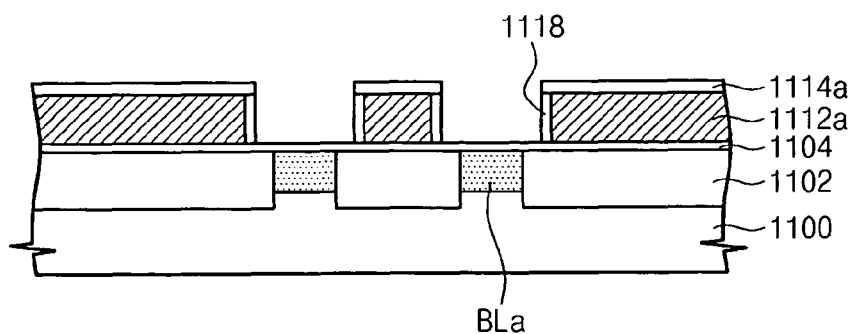

Referring to FIGS. 22A and 22B, a first string selection hole 1117 may be formed by, e.g., continuously patterning the first string selection capping layer 1114a and the first string selection conductive layer 1112a. The first string selection hole 1117 may be two-dimensionally arranged in a matrix type structure. A first string selection gate dielectric 1118 may be formed at a side surface of the first string selection hole 1117 by, e.g., thermally treating the semiconductor substrate 1100 having the first string selection hole 1117. The first string selection gate dielectric 1118 may include, e.g., a silicon oxide layer.

Figure 23A:
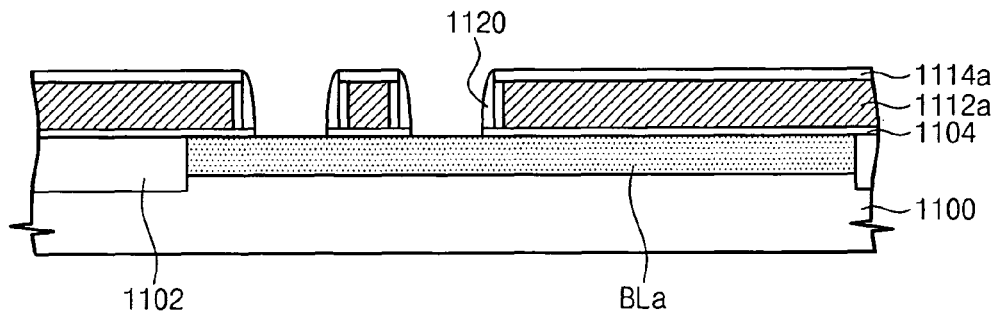
Figure 23B:
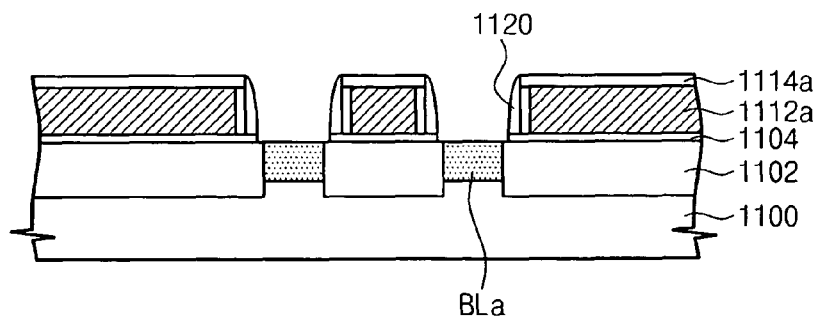

Referring to FIGS. 23A and 23B, a first string selection spacer layer (not shown) may be conformally formed on the semiconductor substrate 1100 having the first string selection gate dielectric 1118. The first string selection spacer layer may include, e.g., a silicon oxynitride layer or a silicon layer. A first string selection spacer 1120 may be formed at an inner side surface of the first string selection hole 1117 by, e.g., isotropic etching the string selection spacer layer. Subsequently, portions of the first interlayer dielectric 1104 disposed at a lower portion of the first string selection hole 1117 may be removed by, e.g., isotropic etching the first string selection hole 1117 where the first string selection spacer 1120 is disposed, thereby exposing the first bit line BLa.

Figure 24A:
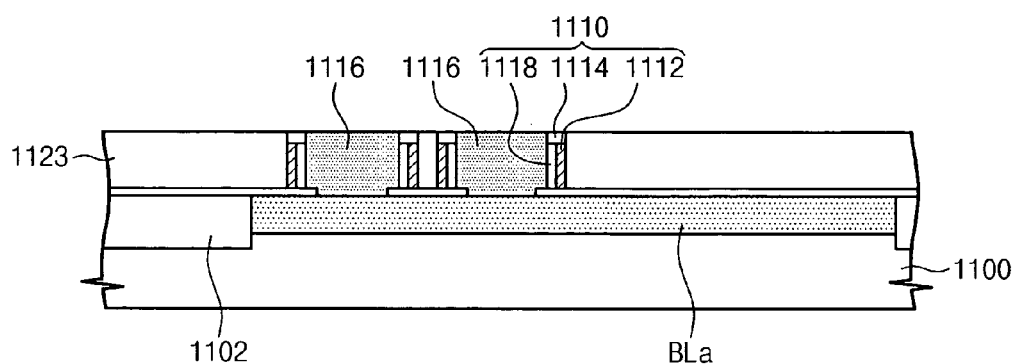
Figure 24B:
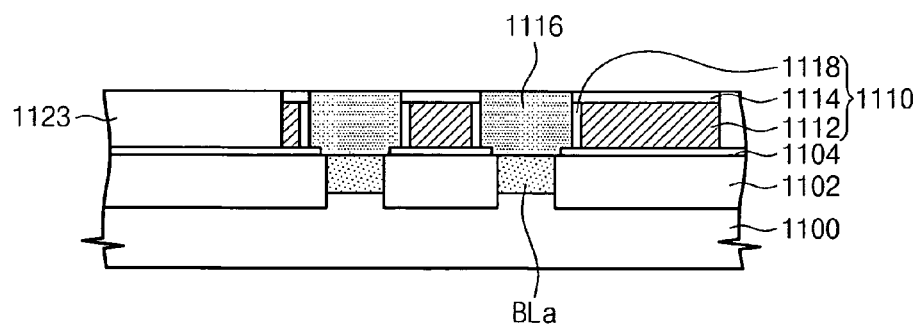

Referring to FIGS. 24A and 24B, the first string selection spacer 1120 may be selectively removed by, e.g., isotropic etching. An inside of the first string selection hole 1117 may be filled with a first string selection semiconductor structure 1116. The first string selection semiconductor structure 1116 may be formed by, e.g., a selective epitaxial growth process or by forming a semiconductor layer on the semiconductor substrate 1100 through a chemical vapor deposition process and then performing a planarization process.

A first string selection capping pattern 1114 and a first string selection line 1112 may be formed by, e.g., patterning the first string selection capping layer 1114a and the first string selection conductive layer 1112a. The first string selection line 1112 may extend in the second direction. A first string selection structure 1110 may include the first string selection line 1112, the first string selection semiconductor structure 1116, and the first string selection gate dielectric 1118. The first string selection structure 1110 may form the first string selection transistor SSTmna (see FIG. 2). A second interlayer dielectric 1123 may be formed on the semiconductor substrate 1100 having the first string selection structure 1110. An upper surface of the second interlayer dielectric 1123 may be planarized. The upper surface of the second interlayer dielectric 1123 and an upper surface of the first string selection capping pattern 1114 may have the same height.

Figure 25A:
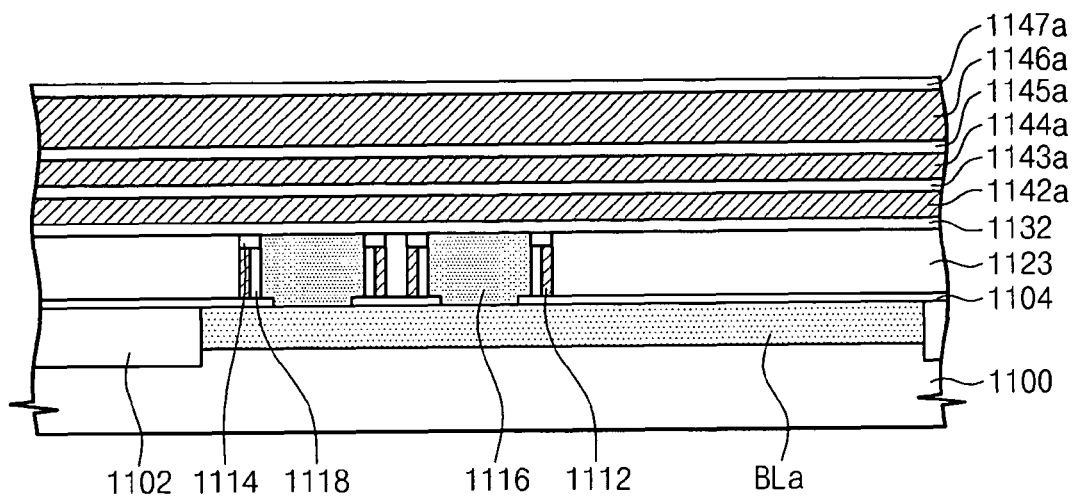
Figure 25B:
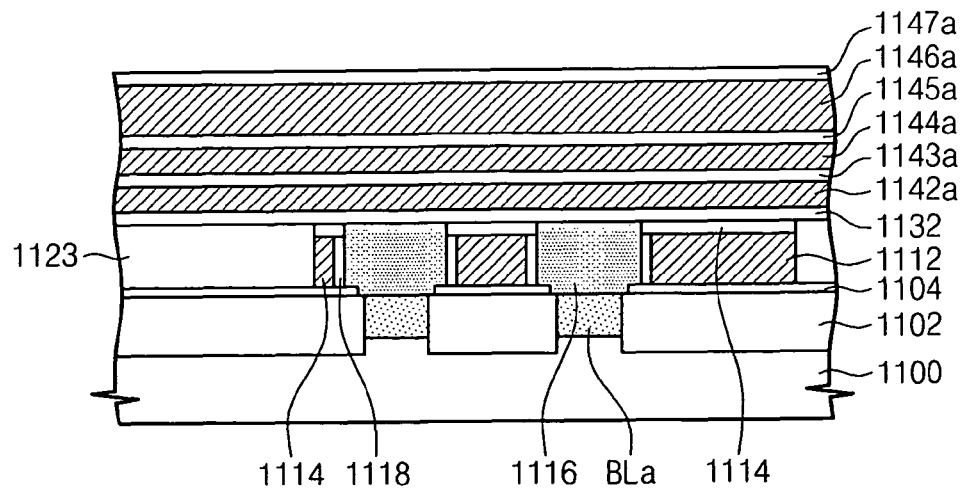

Referring to FIGS. 25A and 25B, a third interlayer dielectric 1132 may be disposed on the first string selection capping pattern 1114. The third interlayer dielectric 1132 may include, e.g., a silicon oxide layer. A first lower word line conductive layer 1142a, a first lower word line dielectric 1143a, a second lower word line conductive layer 1144a, and a second lower word line dielectric 1145a may be sequentially stacked on the third interlayer dielectric 1160. The first and second lower word line conductive layers 1142a and 1144a may each include, e.g., doped silicon. The first and second lower word line dielectrics 1143a and 1145a may each include, e.g., silicon oxide layers.

A first ground selection conductive layer 1146a and a first ground selection capping layer 1147a may be stacked on the second lower word line dielectric 1145a. The first ground selection conductive layer 1146a may include, e.g., doped silicon. The first ground selection capping layer 1147a may include an insulator, e.g., a silicon nitride layer, a silicon oxide layer, and/or a silicon oxynitride layer.

Figure 26A:
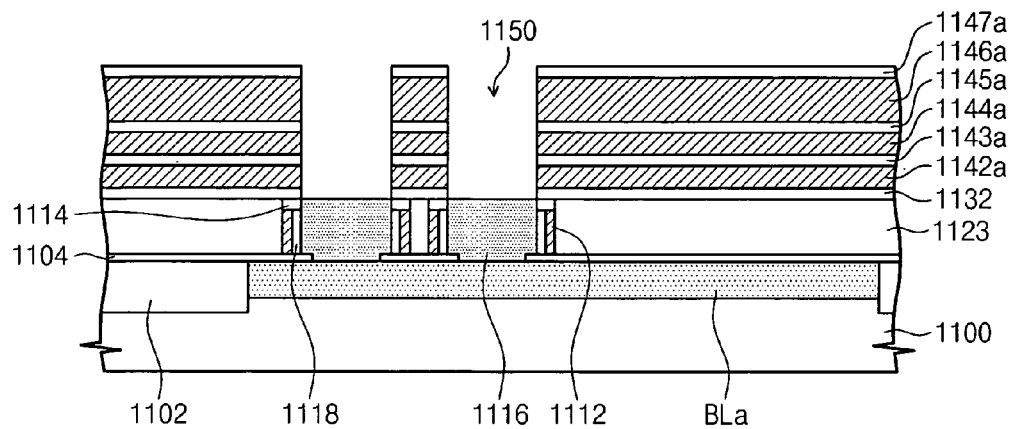
Figure 26B:
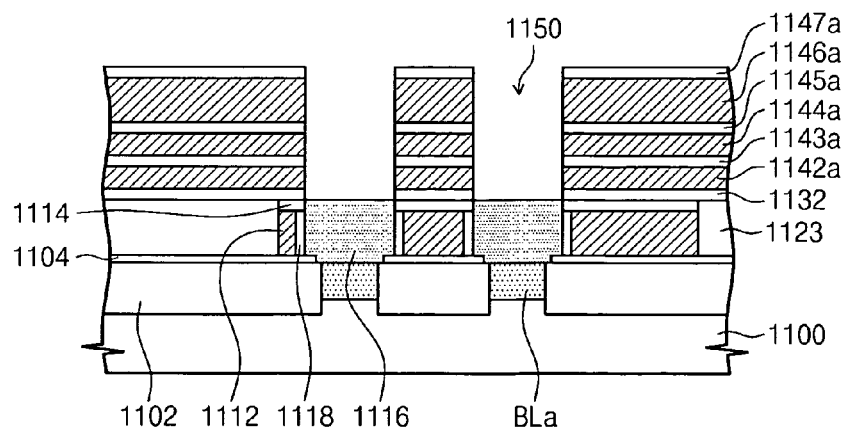

Referring to FIGS. 26A and 26B, a first string contact hole 1150 may be formed by, e.g., patterning a lower structure under the first ground selection capping layer 1147a. The first string contact hole 1150 may be formed in a matrix type structure. The first string contact hole 1150 may pass through the lower word line conductive layers 1142a and 1144a and the word line dielectrics 1143a and 1145a.

The first string contact hole 1150 may extend though the third interlayer dielectric 1132. The first string contact hole 1150 may expose an upper surface of the first string selection semiconductor structure 1116. The first string contact hole 150 may be aligned with the first string selection semiconductor structure 1116.

Figure 27A:
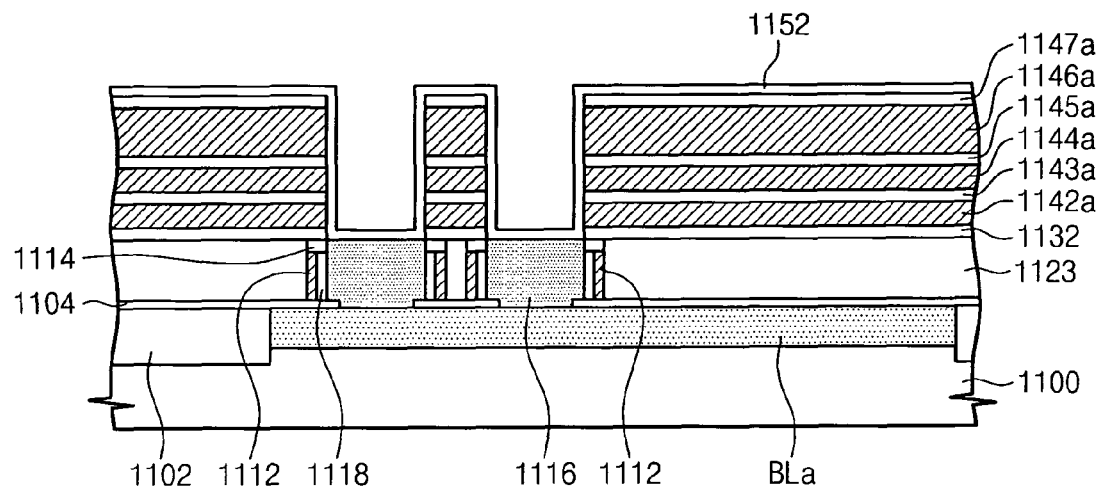
Figure 27B:
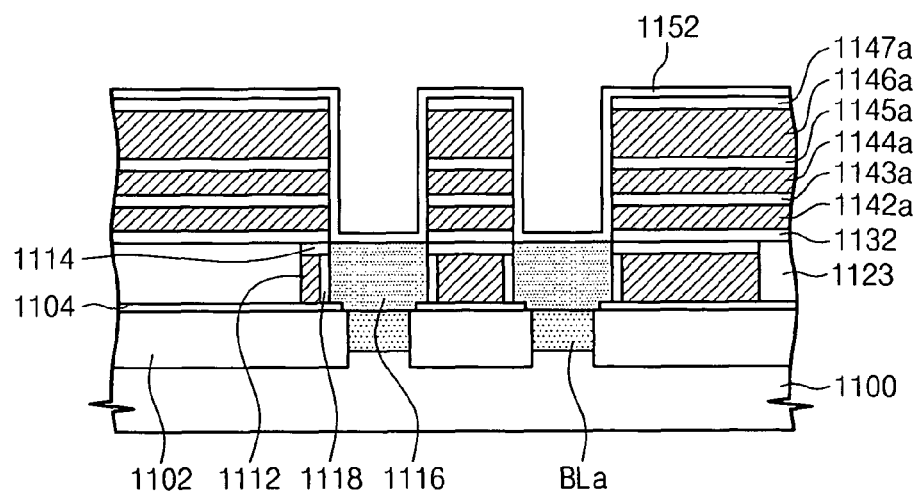

Referring to FIGS. 27A and 27B, a first gate dielectric 1152 may be conformally formed on the semiconductor substrate 1100 having the first string contact hole 1150. The first gate dielectric 1152 may include a charge trapping layer. The first gate dielectric 1152 may have, e.g., a multi-layer structure of tunnel dielectric/charge trapping layer/blocking dielectric. In an implementation, the first gate dielectric 152 may have an ONO multi-layer structure of silicon oxide layer/silicon nitride layer/silicon oxide layer. The charge trapping layer may include, e.g., a silicon nitride layer. The charge trapping layer may trap electric charges. The tunnel dielectric may include, e.g., a thermal oxide layer. The structure and material of the gate dielectric may be variously modified.

Figure 28A:
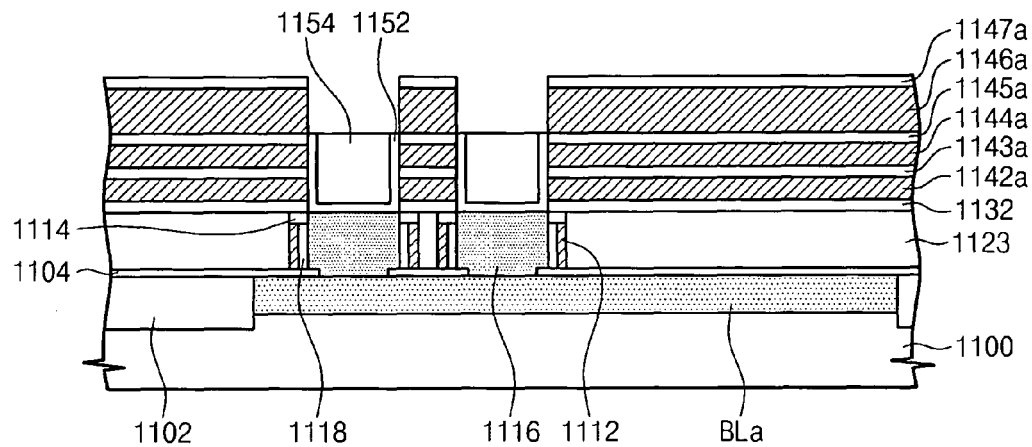
Figure 28B:
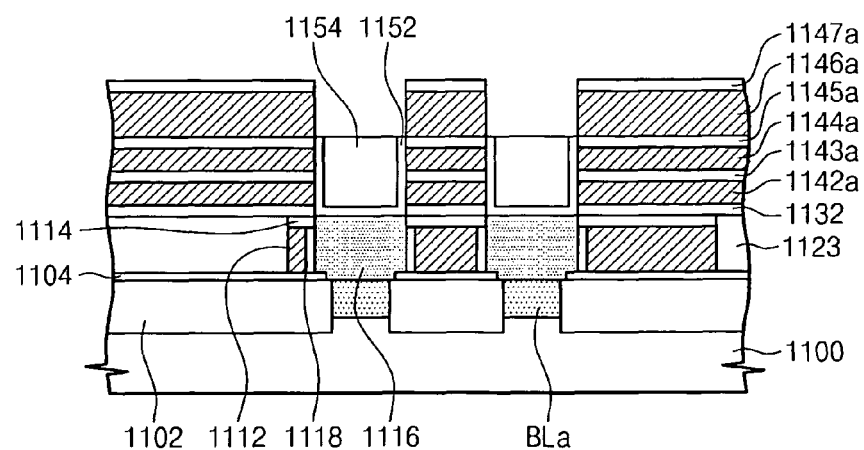

Referring to FIGS. 28A and 28B, an upper surface of a photoresist 1154 may be substantially aligned with an upper surface of the second lower word line dielectric 1145a by, e.g., forming and etching back the photoresist 1154 on the semiconductor substrate 1100 having the first gate dielectric 1152. Subsequently, exposed portions of the first gate dielectric 1152 may be removed by, e.g., wet etching.

Figure 29A:
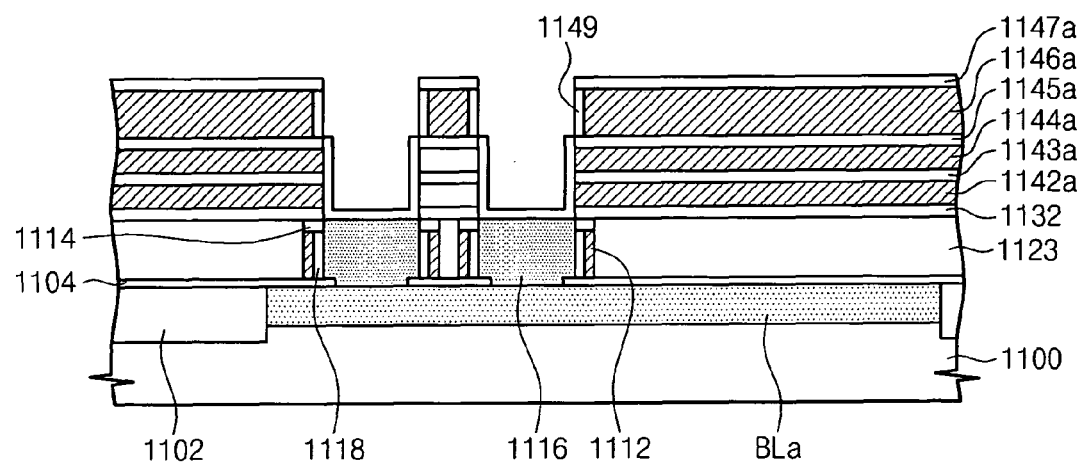
Figure 29B:
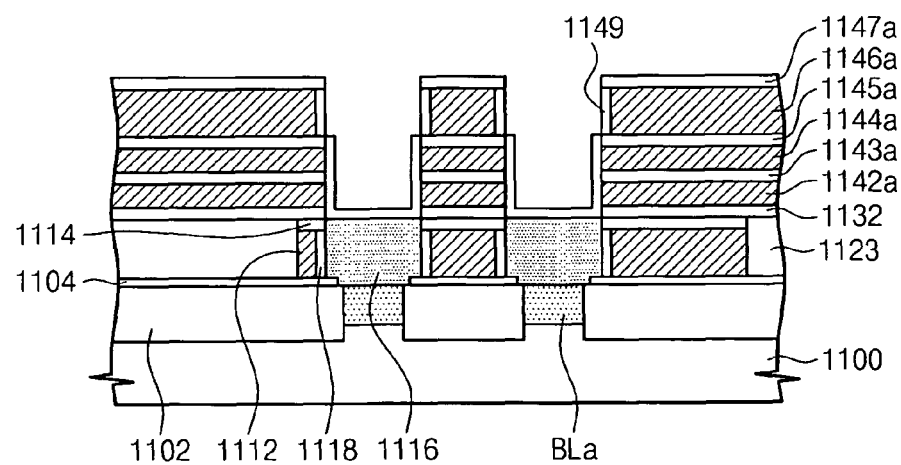

Referring to FIGS. 29A and 29B, the photoresist 1154 in the first string contact hole 1150 may be removed. A first string selection gate dielectric 1149 may be formed by, e.g., thermally oxidizing the first string selection conductive layer 1146a.

Figure 30A:
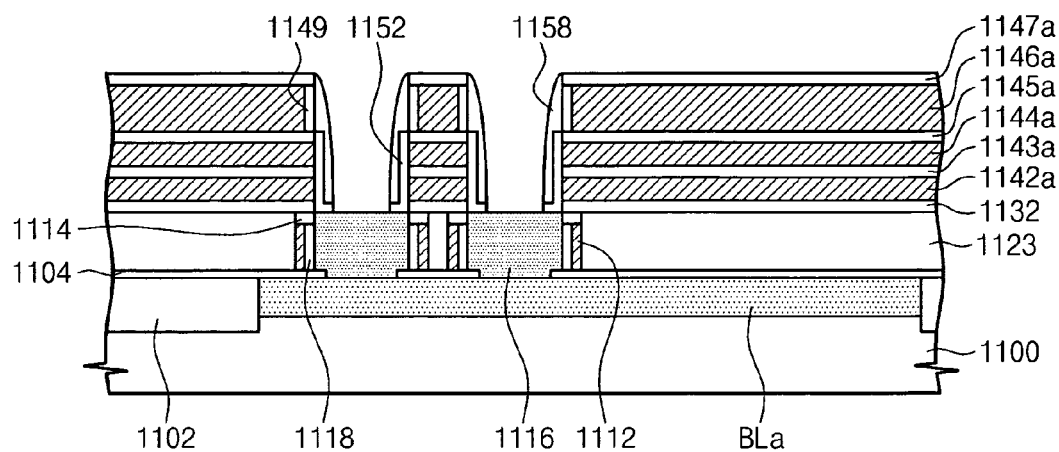
Figure 30B:
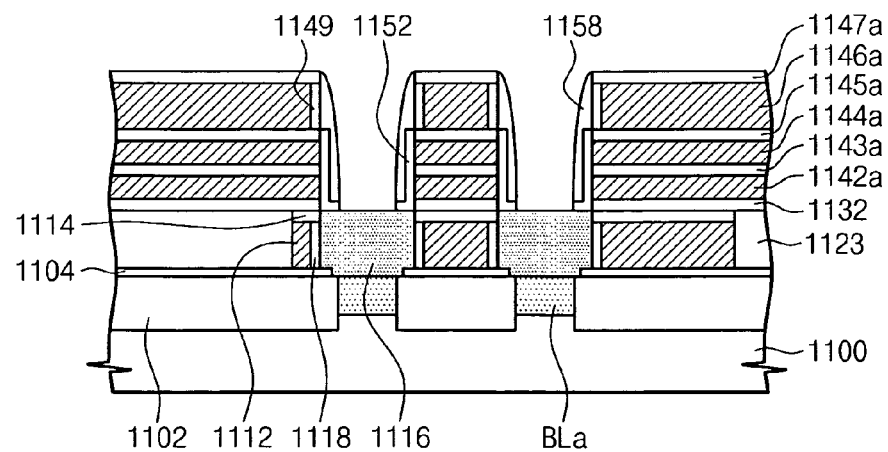

Referring to FIGS. 30A and 30B, a first string spacer layer (not shown) may be conformally formed on the semiconductor substrate 1100. The first string spacer layer may include an insulator, e.g., a silicon nitride layer, a silicon oxynitride layer, or a silicon layer. A first string spacer 1158 may be formed at the side surface of the first string contact hole 1150 by, e.g., isotropic etching the first string spacer layer. Subsequently, portions of a lower surface of the first gate dielectric 1152 may be removed by additional etching. Etching may be performed by using the first string spacer 1158 and the first string selection capping layer 1147a as masks. Thus, portions of the first gate dielectric 1152 disposed on the first string selection semiconductor structure 1116 may be removed. Accordingly, a portion of the first string selection semiconductor structure 1116 may be exposed.

Figure 31A:
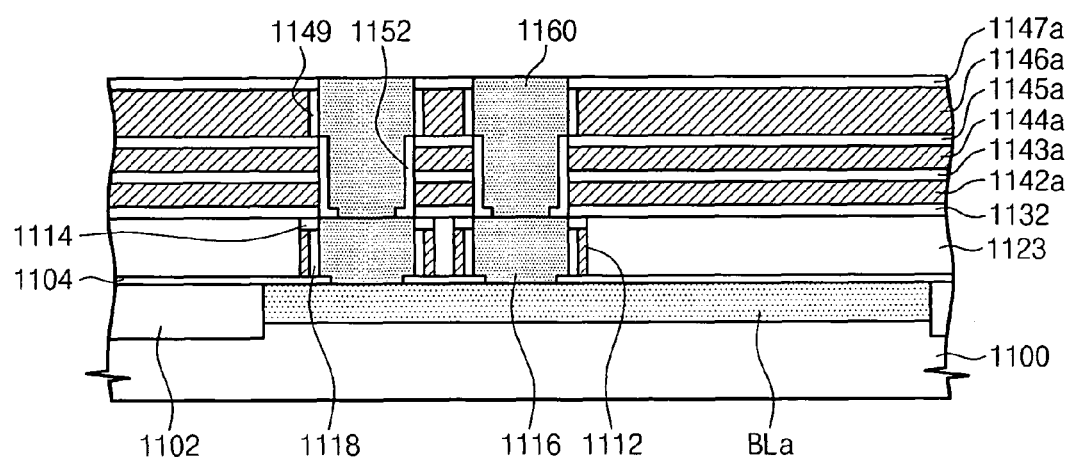
Figure 31B:
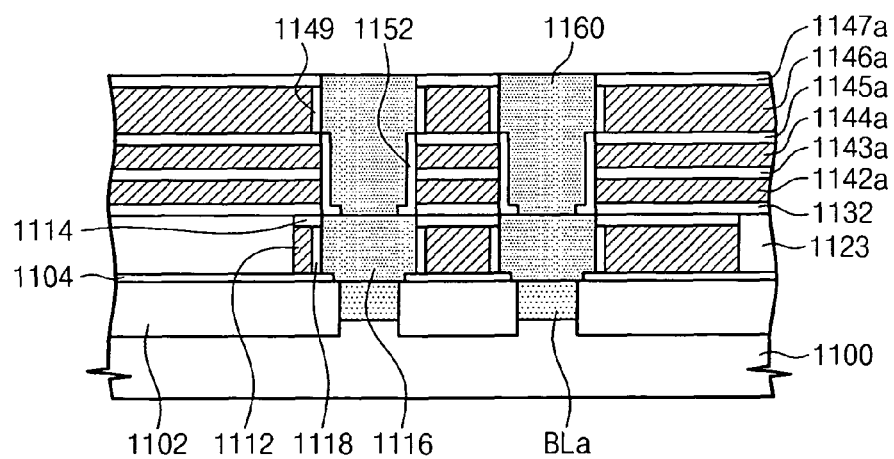

Referring to FIGS. 31A and 31B, the first string spacer 1158 may be selectively removed by, e.g., isotropic etching. A first semiconductor structure 1160 may be formed in a pillar type structure at the first string contact hole 1150 by performing, e.g., a selective epitaxial growth process on the first string selection semiconductor structure 1116. The first semiconductor structure 1160 may include, e.g., doped or undoped silicon. The first semiconductor structure 1160 may fill the first string contact hole 1150. Subsequently, the semiconductor substrate 1100 having the first semiconductor structure 1160 may be planarized.

Figure 32A:
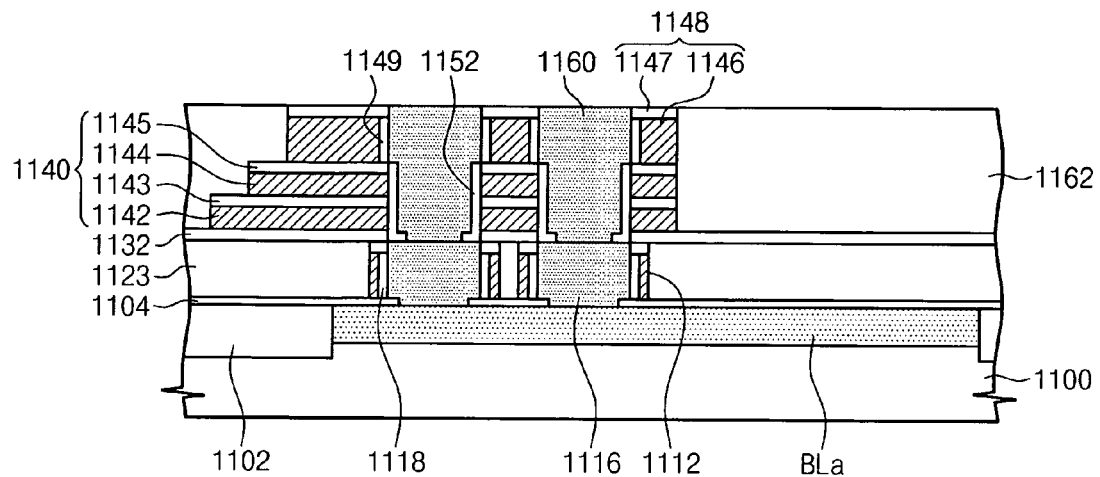
Figure 32B:
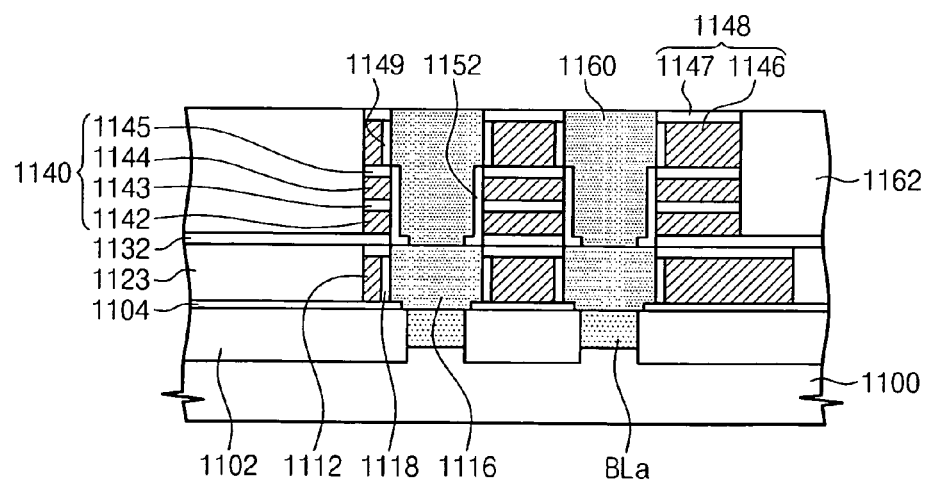

Referring to FIGS. 32A and 32B, a first ground selection line structure 1148 and a first word line structure 1140 may be formed by, e.g., patterning a structure under the first ground selection capping layer 1147a. The patterning may be performed with a plurality of masks. The first ground selection line structure 1148 and the first word line structure 1140 may each have a stair type structure at one side thereof.

The first word line structure 1140 may include a first lower word line 1142, a first lower word line dielectric pattern 1143, a second lower word line 1144, and a second lower word line dielectric pattern 1145. The first ground selection line structure 1148 may be disposed on the first word line structure 1140. The first ground selection line structure 1148 may include a first ground selection line 1146 and a first ground selection capping pattern 1147. The first ground selection line 1146 and a side surface of the first ground selection capping pattern 1147 may be aligned.

In the stair type structure portion of the first word line structure 1140, the first lower word line 1142 and a side surface of the first lower word line dielectric pattern 1143 may be aligned. The first ground selection line structure 1148 may continuously form a stair type structure at the first word line structure 1140 and the stair type structure portion. The second lower word line 1144 and a side surface of the second lower word line dielectric pattern 1145 may be aligned. A fourth interlayer dielectric 1162 may be disposed at a side surface of the first word line structure 1140. An upper surface of the fourth interlayer dielectric 1162 may be planarized.

Figure 33A:
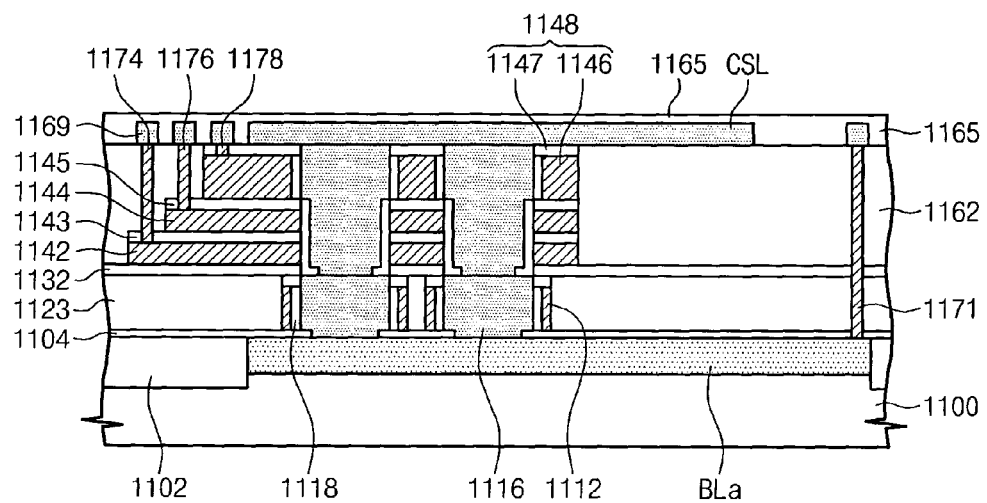
Figure 33B:
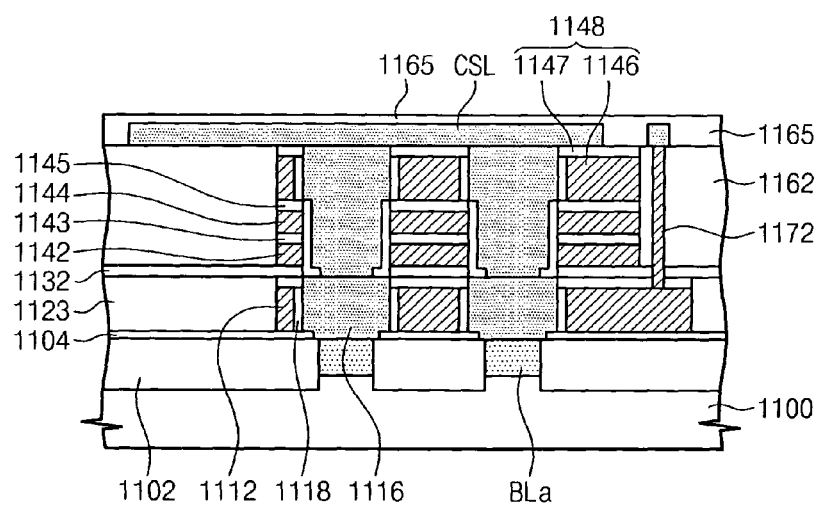

Referring to FIGS. 33A and 33B, a first lower word line contact hole (not shown) exposing the first lower word line 1142 and a second lower word line contact hole (not shown) exposing the second lower word line 1144 may be formed by, e.g., patterning the fourth interlayer dielectric 1162. A first ground selection contact hole (not shown) exposing the first ground selection line may be formed by, e.g., patterning the fourth interlayer dielectric 1162.

A first string selection contact hole (not shown) exposing the first string selection line 1112 may be formed by, e.g., continuously patterning the fourth interlayer dielectric 1162 and the third interlayer dielectric 1132. A first bit line contact hole (not shown) exposing a first bit line BLa may be formed by, e.g., continuously patterning the fourth interlayer dielectric 1162, the third interlayer dielectric 1132, the second interlayer dielectric 1123, and the first interlayer dielectric 1104.

A conductive layer may fill the first and second lower word line contact holes, the first ground selection contact hole, the first string selection contact hole, and the first bit line contact hole. The conductive layer may be planarized to expose the fourth interlayer dielectric 1162, thereby forming the first lower contact plugs 1171, 1172, 1174, 1176, and 1178. The first lower contact plugs 1171, 1172, 1174, 1176, and 1178 may include first and second lower word line contact plugs 1174 and 1176, a first ground selection contact plug 1178, a first bit line contact plug 1171, and a first string selection line contact plug 1172.

A common source conductive layer (not shown) may be formed on the semiconductor substrate 1100 having the first and second lower word line contact plugs 1174 and 1176. A common source line CSL may be formed by, e.g., patterning the common source conductive layer. The common source line CSL may have a plate type structure. A conductive pad 1169 may be disposed on the first lower contact plugs.

A fifth interlayer dielectric 1165 may be formed on the semiconductor substrate 1100 having the common source line CSL. The fifth interlayer dielectric 1165 may include, e.g., a silicon oxide layer. An upper surface of the fifth interlayer dielectric 1165 may be planarized.

Figure 34A:
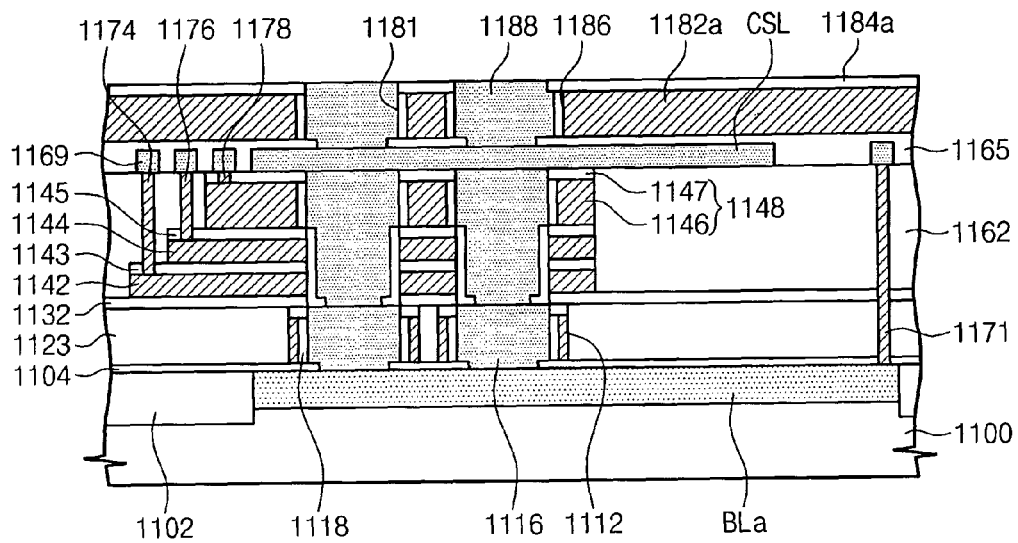
Figure 34B:
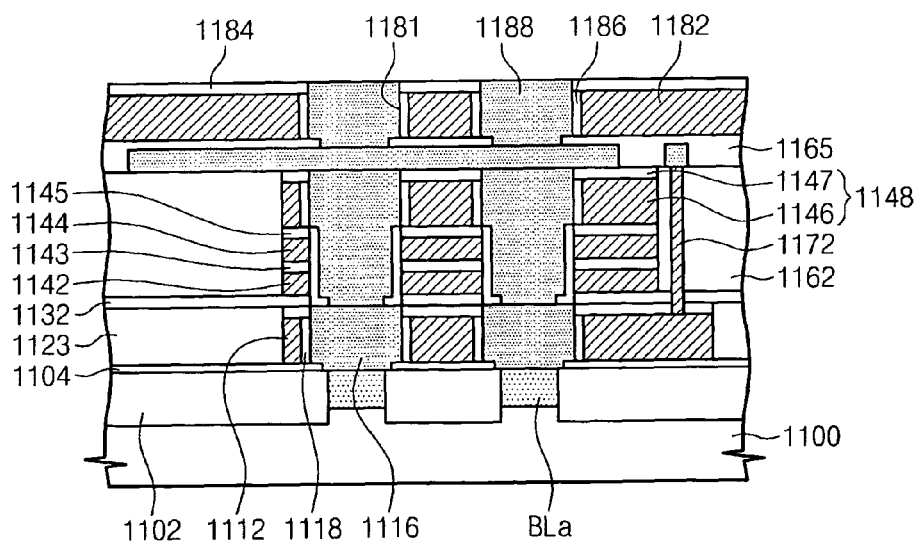

Referring to FIGS. 34A and 34B, a second ground selection conductive layer 1182a may be formed on the fifth interlayer dielectric 1165. A second ground selection capping layer 1184a may be formed on the second ground selection conductive layer 1182a. The second ground selection conductive layer 1182a may include, e.g., a single crystalline silicon or a polycrystalline silicon. In an implementation, the second ground selection conductive layer 1182a may include, e.g., single crystalline silicon or polycrystalline silicon prepared by forming amorphous silicon and performing a subsequent crystallization process. The second ground selection capping layer 1184a may include, e.g., a silicon nitride layer or a silicon oxynitride layer.

A ground selection contact hole 1181 may be formed by, e.g., continuously patterning the second ground selection capping layer 1184a and the second ground selection conductive layer 1182a. The ground selection contact hole 1181 may be two-dimensionally arranged in a matrix type structure. A second ground selection gate dielectric 1186 may be formed at an inner side surface of the ground selection contact hole 1181 by, e.g., thermally treating the semiconductor substrate 1100 having the ground selection contact hole 1181. The second ground selection gate dielectric 1186 may include, e.g., a silicon oxide layer.

A second ground selection spacer layer (not shown) may be conformally formed on the semiconductor substrate 1100 having the second ground selection gate dielectric 1186. The second ground selection spacer layer may include, e.g., a silicon oxynitride layer or a silicon layer. A second ground selection spacer (not shown) may be formed at the inner side surface of the second ground selection hole 1181 by, e.g., isotropic etching of the second ground selection spacer layer. Subsequently, portions of the fifth interlayer dielectric 1165 disposed at a lower portion of the second ground selection hole 1181 may be removed. Thus, the common source line CSL may be exposed by, e.g., isotropic etching of the second ground selection hole 1181 where the second ground selection spacer is disposed.

The second ground selection spacer may be selectively removed by, e.g., isotropic etching. The second ground selection hole 1181 may be filled with a second ground selection semiconductor structure 1188. The second ground selection semiconductor structure 1188 may be formed through, e.g., a selective epitaxial growth process or by forming a semiconductor layer on the semiconductor substrate 1100 through a chemical vapor deposition process and performing a planarization process.

Figure 35A:
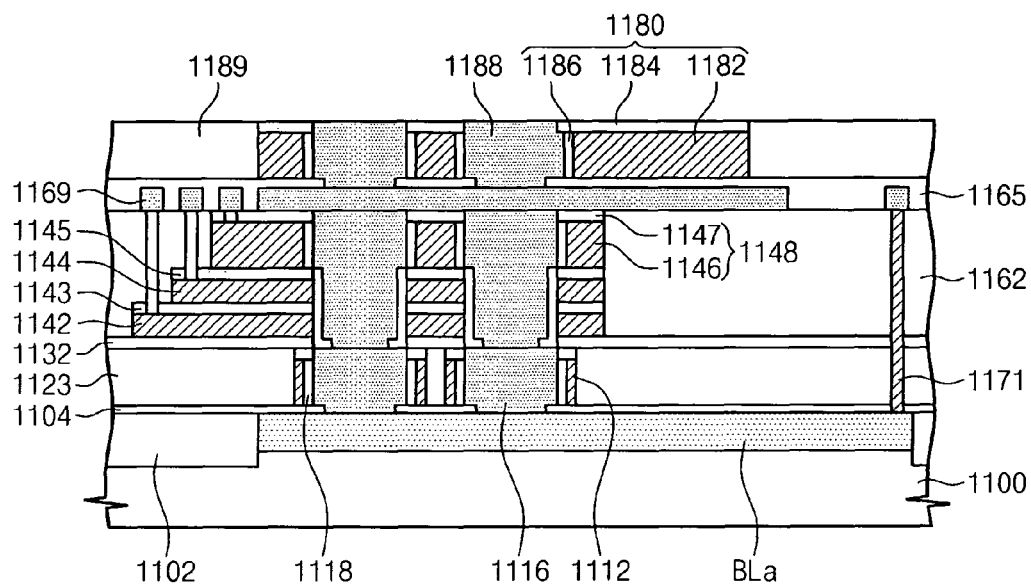
Figure 35B:
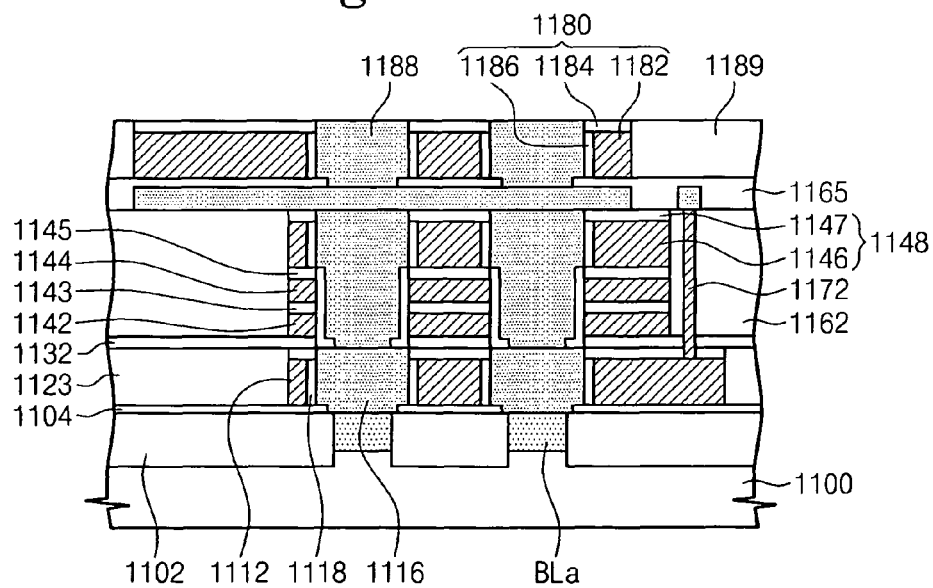

Referring to FIGS. 35A and 35B, a second ground selection capping pattern 1184 and a second ground selection line 1182 may be formed by, e.g., patterning the second ground selection capping layer 1184a and the second ground selection conductive layer 1182a. The second ground selection line 1182 may have a line type structure. A second ground selection structure 1180 may include the second ground selection line 1182, the second ground selection semiconductor structure 1188, and the second ground selection gate dielectric 1186. The second ground selection structure 1180 may form the second ground selection transistor GSTmnb (see FIG. 2).

A sixth interlayer dielectric 1189 may be formed on the semiconductor substrate 1100 having the second ground selection structure 1180. An upper surface of the sixth interlayer dielectric 1189 may be planarized. The upper surface of the sixth interlayer dielectric 1189 and an upper surface of the second ground selection capping pattern 1184 may have the same height.

Figure 36A:
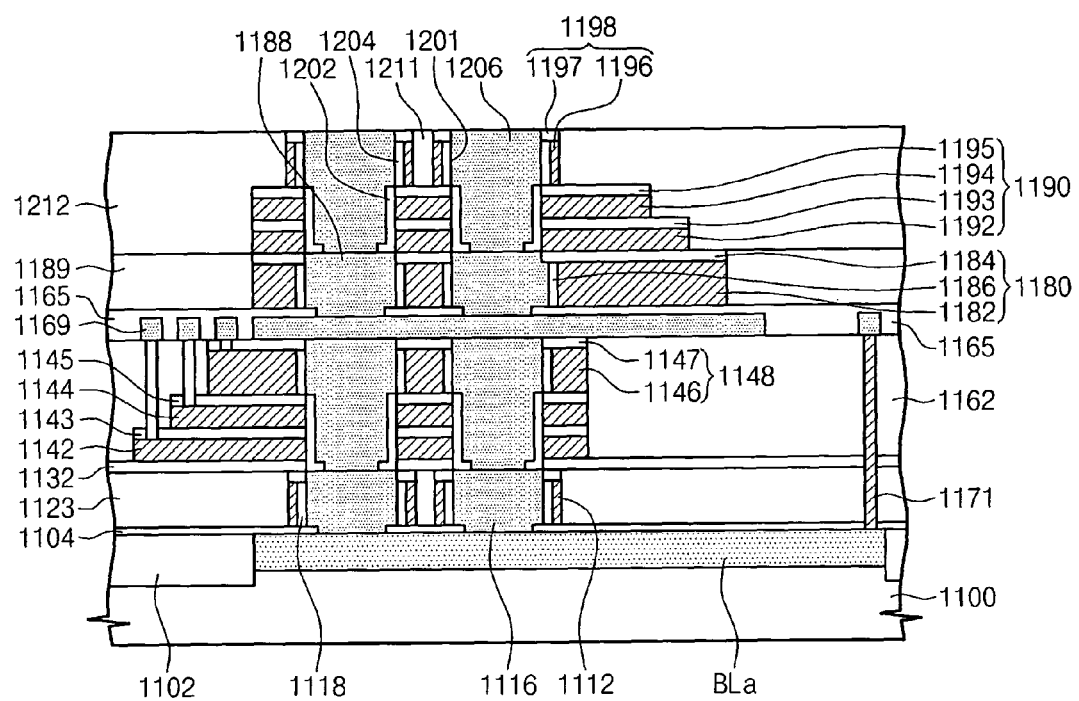
Figure 36B:
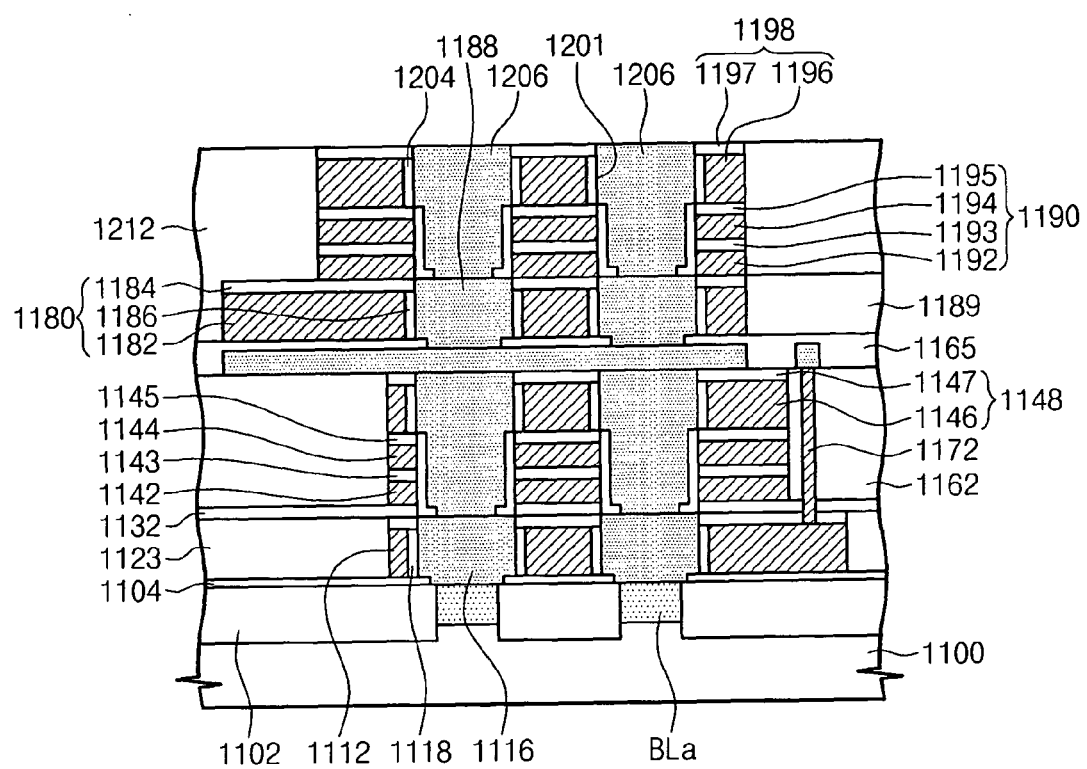

Referring to FIGS. 36A and 36B, a first upper word line conductive layer (not shown), a first upper word line dielectric (not shown), a second upper word line conductive layer (not shown), and a second upper word line dielectric (not shown) may be sequentially stacked on the sixth interlayer dielectric 1189. The first and second upper word line conductive layers may each include, e.g., doped silicon. The first and second upper word line dielectrics may each include, e.g., silicon oxide layers.

A second string selection conductive layer (not shown) and a second string selection capping layer (not shown) may be stacked on the second upper word line dielectric. The second string selection conductive layer may include, e.g., doped silicon. The second string selection capping layer may include an insulator, e.g., a silicon nitride layer, a silicon oxide layer, and/or a silicon oxynitride layer.

A second string contact hole 1201 may be formed by, e.g., patterning a lower structure under the second string selection capping layer. The second string contact hole 1201 may be formed in a matrix type structure. The second string contact hole 1201 may pass through the upper word line conductive layers and the word line dielectrics. The second string contact hole 1201 may expose an upper surface of the second ground selection semiconductor structure 1188. The second string contact hole 1201 may be aligned with the second ground selection semiconductor structure 1188.

A second gate dielectric 1202 may be conformally formed on the semiconductor substrate 1100 having the second string contact hole 1201. The second gate dielectric 1202 may include a charge trapping layer. The second gate dielectric 1202 may have, e.g., multi-layer structure of tunnel dielectric/charge trapping layer/blocking dielectric. In an implementation, the second gate dielectric 1202 may have an ONO multilayer structure of silicon oxide layer/silicon nitride layer/silicon oxide layer. The charge trapping layer may include, e.g., a silicon nitride layer. The charge trapping layer may trap electric charges. The tunnel dielectric may include, e.g., a thermal oxide layer. The structure and material of the gate dielectric may be variously modified.

A photoresist (not shown) may be formed in the second string contact hole 1201. An upper surface of the photoresist may be substantially aligned with an upper surface of the second upper word line dielectric 1195 by, e.g., forming and etching back the photoresist on the semiconductor substrate 1100 having the second gate dielectric 1201. Subsequently, the exposed portions of the second gate dielectric 1202 may be removed by, e.g., wet etching.

The photoresist that filled in the second string contact hole 1201 may be removed. A second ground selection gate dielectric 1204 may be formed by, e.g., thermally oxidizing the second ground selection conductive layer 1196.

A second string spacer layer (not shown) may be conformally formed on the semiconductor substrate 1100. The second string spacer layer may include, e.g., a silicon nitride layer, a silicon oxynitride layer, or a silicon layer. A string spacer (not shown) may be formed at a side surface of the second string contact hole 1201 by, e.g., isotropic etching the second string spacer layer. Subsequently, a lower surface of the second gate dielectric 1202 may be removed by additional etching. Etching may be performed by using the string spacer and the ground selection capping layer as masks. Thus, portions of the second gate dielectric 1202 disposed on the second ground selection semiconductor structure 1188 may be removed. Accordingly, the second ground selection semiconductor structure 1188 may be exposed.

The second string spacer may be selectively removed by, e.g., isotropic etching. A second semiconductor structure 1206 may be formed in a pillar type structure at the second string contact hole 1201 by performing, e.g., a selective epitaxial growth process on the second ground selection semiconductor structure 1188. The second semiconductor structure 1206 may include, e.g., doped or undoped silicon. The second semiconductor structure 1206 may fill the second string contact hole 1201. Subsequently, the semiconductor substrate 1100 having the second semiconductor structure 1206 may be planarized.

A second string selection line structure 1198 and a second word line structure 1190 may be formed by, e.g., patterning a structure under the second string selection capping layer. The patterning may be performed with a plurality of masks.

The second word line structure 1190 may include a first upper word line 1192, a first upper word line dielectric pattern 1193, a second upper word line 1194, and a second upper word line dielectric pattern 1195. The second string selection line structure 1198 may be disposed on the second word line structure 1190. The second string selection line structure 1198 may include a second auxiliary string selection line (not shown) and a second auxiliary string selection capping pattern (not shown). The second auxiliary string selection line and a side surface of the second auxiliary string selection capping pattern may be aligned. The second auxiliary string selection line may have a plate type structure.

In a stair type structure portion of the second word line structure 1190, the first upper word line 1192 and a side surface of the first upper word line dielectric pattern 1193 may be aligned. The second upper word line 1194 and a side surface of the second upper word line dielectric pattern 1195 may be aligned. The second string selection line structure 1198 may continuously form a stair type structure at the stair type structure portion of the second word line structure 1190.

A seventh interlayer dielectric 1212 may be disposed on the second word line structure 1190. An upper surface of the seventh interlayer dielectric 1212 may be planarized. The upper surface of the seventh interlayer dielectric 1212 and an upper surface of the second auxiliary string selection capping pattern may have the same height.

A second string selection line 1196 extending in the first direction and a second string selection capping pattern 1197 may be formed by, e.g., patterning the second auxiliary string selection capping pattern and the second auxiliary string selection line. Each space between the second string selection lines 1196 may be filled with an eight interlayer dielectric 1211. An upper surface of the eighth interlayer dielectric 1211 may be planarized. The upper surface of the eighth interlayer dielectric 1211 and an upper surface of the second string selection line capping pattern 1197 may have the same height, as illustrated in FIG. 36A.

Referring again to FIGS. 20A-20C, a bit line conductive layer (not shown) may be formed on the second semiconductor structure 1206. A second bit line BLb may be formed by, e.g., patterning the bit line conductive layer. The second bit line BLb may extend in the second direction. A ninth interlayer dielectric 1216 may be formed on the semiconductor substrate 1100 having the second bit line BLb. An upper surface of the ninth interlayer dielectric 1216 may be planarized.

Second contact plugs and first upper contact plugs may be formed by, e.g., patterning a structure under the ninth interlayer dielectric 216. Second contact plugs 1242, 1244, 1246, 1248, 1249, and 1254 may include a common source line contact plug 1249, a second ground selection line contact plug 1248, a second upper word line contact plug 1244, a first upper word line contact plug 1246, a second bit line contact plug 1242, and a second string selection line contact plug 1254.

The first upper contact plugs 1222, 1223, 1224, 1226, and 1228 may include first and second upper word line contact plugs 1224 and 1226, a first upper string selection contact plug 1222, a first upper ground selection contact plug 1228, and a first bit line contact plug 1223.

A metal interconnection 1232 may be disposed on the semiconductor substrate 100 having the second contact plugs are formed.

Figure 37A:
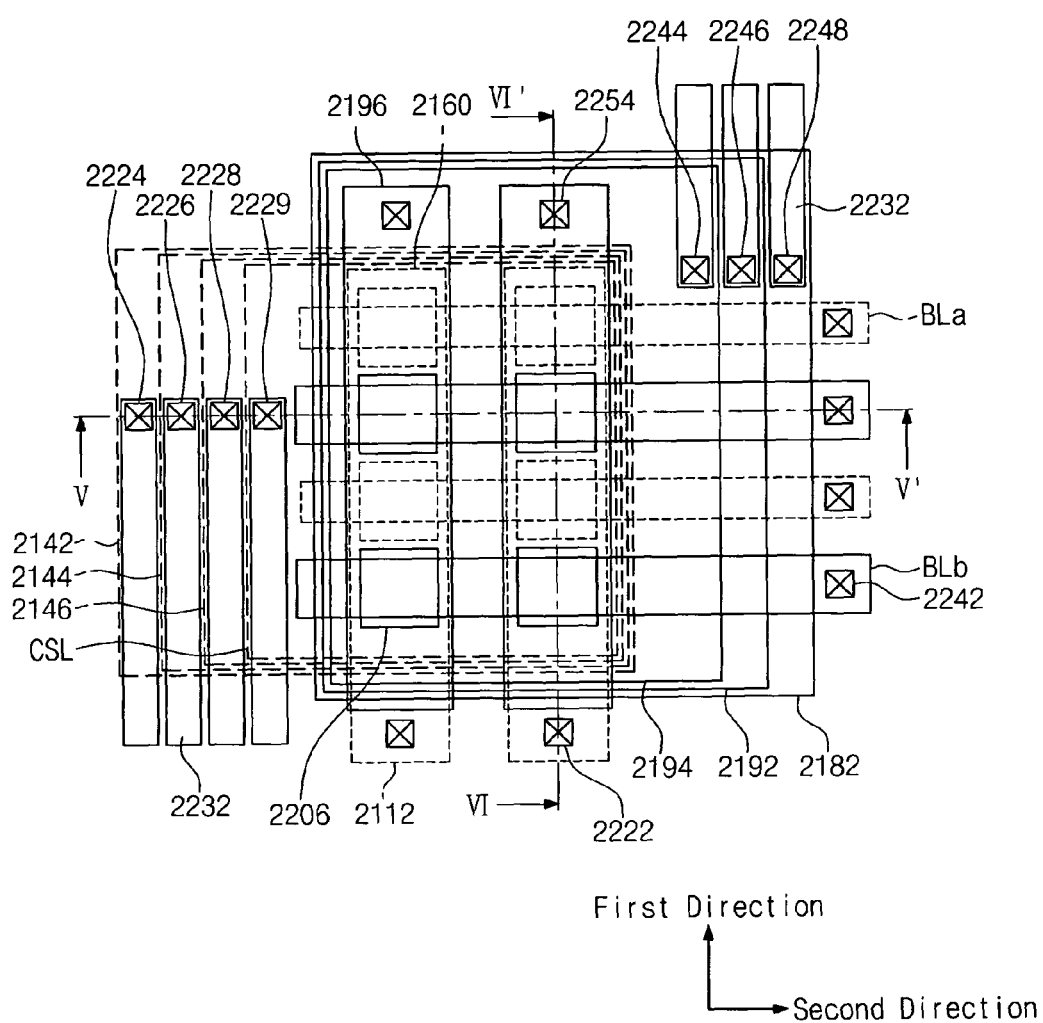
FIG. 37A illustrates a plan view of a vertical type semiconductor device according to an embodiment.
Figure 37B:
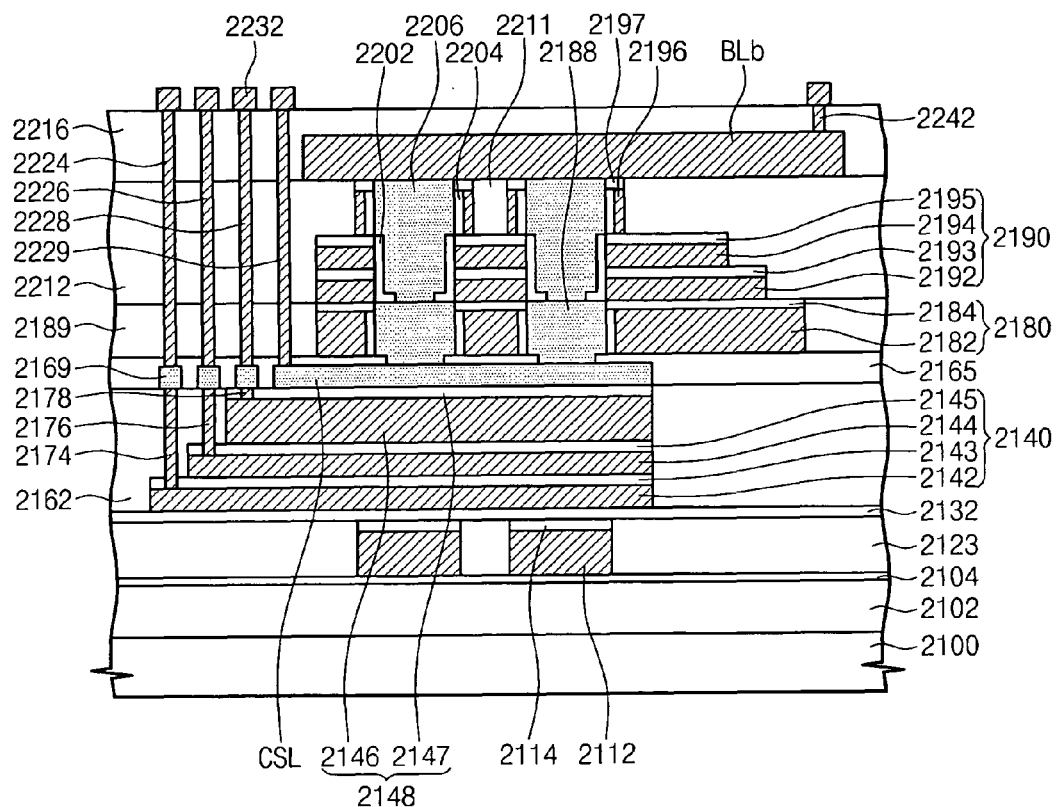
FIGS. 37B and 37C illustrate cross-sectional views of the vertical type semiconductor device of FIG. 37A.
Figure 37C:
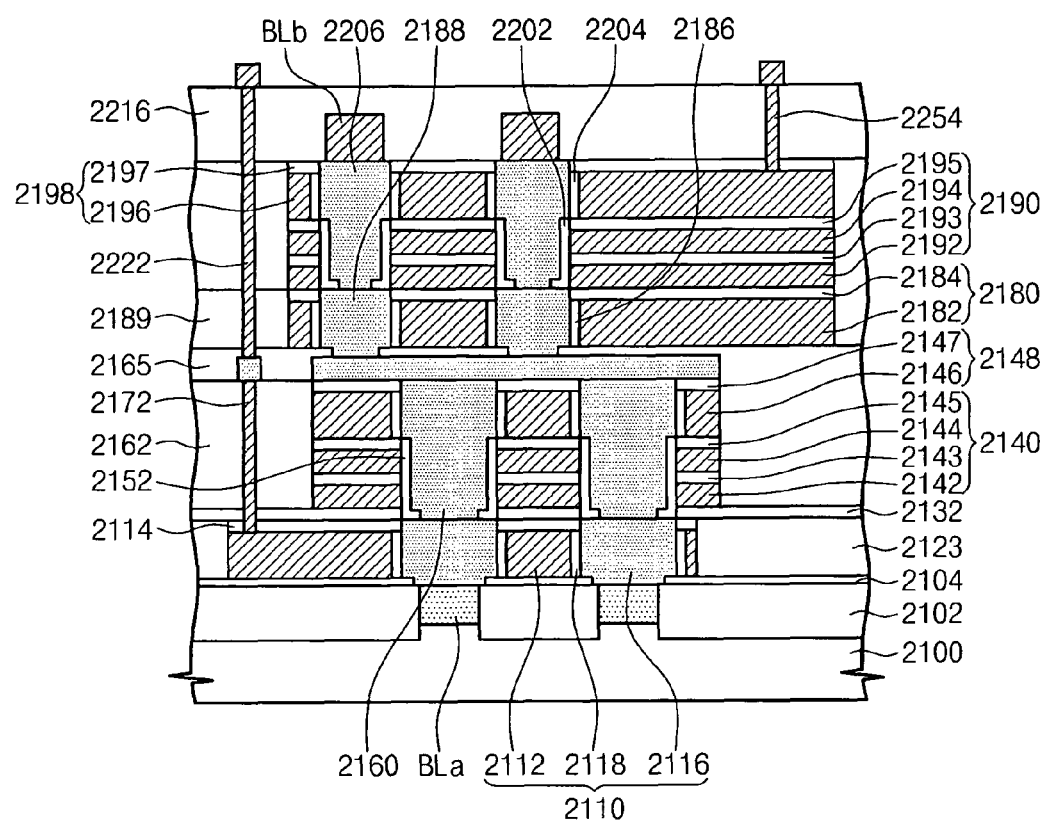

FIG. 37A illustrates a plan view of a vertical type semiconductor device according to yet another embodiment. FIGS. 37B and 37C illustrate cross-sectional views of the vertical type semiconductor device of FIG. 37A. FIG. 37B illustrates a cross-sectional view taken along line V-V' in FIG. 37A. FIG. 37C illustrates a cross-sectional view taken along line VI-VI' in FIG. 37A.

Referring to FIGS. 37A through 37C, an isolation layer 2102 may be disposed on a semiconductor substrate 2100. The isolation layer 2102 may define an active region. An upper surface of the isolation layer 2102 and the semiconductor substrate 2100 may have substantially the same height. The isolation layer 2102 may be formed by, e.g., a shallow trench isolation process. The isolation layer 2102 may include, e.g., a silicon oxide layer. The active region may be doped. The doped active region may be a first bit line BLa. The semiconductor substrate 2100 may be disposed in a plane that is defined by a first direction and a second direction crossing the first direction. The first bit line BLa may serve as a conductive layer. The first bit line BLa may extend in the second direction and have a line type structure. The first bit lines BLa may be disconnected by the isolation layer 2102. The first bit line BLa may include a conductive material, e.g., doped silicon, a metal compound, and/or metal. The first bit line BLa may have a stack structure of metal silicide/silicon or silicon/metal silicide/silicon.

A first interlayer dielectric 2104 may be disposed on the semiconductor substrate 2100. The first interlayer dielectric 2104 may include, e.g., a silicon oxide layer, a silicon nitride layer, and/or a silicon oxynitride layer. A first string selection structure 2110 may be disposed on the first interlayer dielectric 2104. The first string selection structure 2110 may extend in the first direction on the first bit line BLa. The first string selection structure 2110 may form a first string selection transistor SSTmna. The first string selection structure 2110 may include a first string selection line 2112, a first string selection semiconductor structure 2116, which may be disposed through the first string selection line 2112, and a first string selection gate dielectric 2118, which may be disposed between the first string selection semiconductor structure 2116 and the first string selection line 2112.

The string ground selection line 2112 may be formed of, e.g., a doped semiconductor material. A first string selection line capping pattern 2114 may be disposed on the first string selection line 2112. The first string selection line capping pattern 2114 may include an insulator, e.g., a silicon nitride layer, a silicon oxynitride layer, and/or a silicon oxide layer. The first string selection line capping pattern 2114 and a side surface of the first string selection line 2112 may be aligned. The first string selection semiconductor structure 2116 may be disposed through the first string selection line capping pattern 2114, the first string selection line 2112, and the first interlayer dielectric 2104. The first string selection semiconductor structure 2116 may include, e.g., a single-crystalline semiconductor or a polycrystalline semiconductor. The first string selection semiconductor structure 2116 may be doped. One end of the first string selection semiconductor structure 2116 may contact the first bit line BLa. The first string selection semiconductor structure 2116 may be disposed in a matrix type structure through the first string selection line 2112.

The first string selection line 2112 and a side surface of the first string selection line capping pattern 2114 may contact a second interlayer dielectric 2123. An upper surface of the second interlayer dielectric 2123 and an upper surface of the first string selection line capping pattern 2114 may have the same height.

A third interlayer dielectric 2132 may be disposed on the first string selection line capping pattern 2114. The third interlayer dielectric 2132 may include, e.g., a silicon oxide layer, a silicon nitride layer, and/or a silicon oxynitride layer.

A first word line structure 2140 may be disposed on the third interlayer dielectric 2132. The first word line structure 2140 may include a first lower word line 2142, a first lower word line dielectric pattern 2143, a second lower word line 2144, and a second lower word line dielectric pattern 2145, which may be sequentially stacked. The lower word lines 2142 and 2144 may be stacked in two or more layers. At least one side of the first word line structure 2140 may have a stair type structure. In the stair type structure portion of the first word line structure 2140, the first lower word line dielectric pattern 2143 and a side surface of the first lower word line 2142 may be aligned. In the stair type structure portion of the first word line structure 2140, the second word line dielectric pattern 2145 and the side surface of the second word line 2144 may be aligned. The first and second lower word line dielectric patterns 2143 and 2145 may include, e.g., silicon oxide layers. The first and second lower word lines 2142 and 2144 may include, e.g., doped silicon. Thicknesses of the lower word lines 2142 and 2144 may be greater than thicknesses of the lower word line dielectric patterns 2143 and 2145. The lower word lines 2142 and 2144 may have plate type structures.

A first semiconductor structure 2160 may be provided through the first word line structure 2140. The first semiconductor structure 2160 may be disposed in a matrix type structure and pass through a plane onto which the first lower word lines are provided. The first semiconductor structure 2160 may be aligned with the first string selection semiconductor structure 2116. A first gate dielectric 2152 may be disposed between the first semiconductor structure 2160 and the lower word lines 2142 and 2144. In an implementation, the first gate dielectric 2152 may be disposed between the first semiconductor structure 2160 and the first word line structure 2140.

The first gate dielectric 2152 may include a charge trapping layer. An intersection point of one word line and the first semiconductor structure 2160 may form one memory cell. The first semiconductor structure 2160 may provide the channel region, source region and drain region of a memory cell. The first semiconductor structure 2160 may extend through the third interlayer dielectric 2132. One end of the first semiconductor structure 2160 may contact the first string selection semiconductor structure 2116. The first semiconductor structure 2160 may include, e.g., a single crystalline semiconductor or a polycrystalline semiconductor. The semiconductor structure 2160 may have a pillar type structure. In an implementation, the first semiconductor structure 2160 may have a cylindrical shape or a hollow cylindrical shape.

A first ground selection structure 2148 may be disposed on the first word line structure 2140. The first ground selection structure 2148 may include a first ground selection line 2146 and a first ground selection capping pattern 2147. The first ground selection line 2146 may have a plate type structure. The first ground selection line 2146 and a side surface of the first ground selection capping pattern 2147 may be aligned. The first semiconductor structure 2160 may extend through the first ground selection line 2146 and the first ground selection capping pattern 2147. A first ground selection gate dielectric 2149 may be disposed between the first semiconductor structure 2160 and the first ground selection line 2146. A fourth interlayer dielectric 2162 may be disposed at a side surface of the first word line structure 2140 and a side surface of the first ground selection structure 2148. An upper surface of the fourth interlayer dielectric 2162 and an upper surface of the first ground selection capping pattern 2147 may have the same height.

First lower contact plugs 2172, 2174, 2176, and 2178 may be disposed at a periphery of the first word line structure 2140. The first lower contact plugs may include a first lower bit line contact plug (not shown), a first lower string selection line contact plug 2172, first lower word line contact plugs 2174 and 2176, and a first lower ground selection line contact plug 2178.

The first lower contact plugs may be disposed through a portion of or disposed entirely through the fourth interlayer dielectric 2162. Upper surfaces of the first lower contact plugs and an upper surface of the fourth interlayer dielectric 2162 may have the same height. The first lower contact plugs may include a conductive material, e.g., metal, doped silicon, and/or a metal compound.

Another end of the first semiconductor structure 2160 may be electrically connected to a common source line CSL. The common source line CSL may have a plate type structure.

The common source line CSL may include a conductive material, e.g., doped silicon, a metal compound, and/or metal. The common source line CSL may have, e.g., a stack structure of metal silicide/polysilicon or polysilicon/metal silicide/polysilicon. Interconnection pads 2169 may be disposed on the fourth interlayer dielectric 2162. The interconnection pads 2169 may be electrically connected to respective first lower contact plugs. A fifth interlayer dielectric 2165 may be disposed on the common source line CSL. An upper surface of the fifth interlayer dielectric 2165 may be planarized.

A second ground selection structure 2180 may be disposed on the fifth interlayer dielectric 2165. The second ground selection structure 2180 may include a second ground selection line 2182 and a second ground selection capping pattern 2184. The second ground selection line 2182 may have a plate type structure. The second ground selection line 2182 and a side surface of the second ground selection capping pattern 2184 may be aligned. A second ground selection semiconductor structure 2188 may be disposed through the second ground selection line 2182 and the second ground selection capping pattern 2184. A second ground selection gate dielectric 2186 may be disposed between the second ground selection semiconductor structure 2188 and the second ground selection line 2182. The second ground selection semiconductor structure 2188 may be offset from the lower structure in the first direction. In other words, the second ground selection semiconductor structure 2188 may not be aligned with the first semiconductor structure 2160 and may be offset in the first direction.

A sixth interlayer dielectric 2189 may be disposed at a side surface of the second ground selection line 2182. An upper surface of the sixth interlayer dielectric 2189 may be aligned with an upper surface of the second ground selection capping pattern 2184.

A second word line structure 2190 and a second string selection line structure 2198 may be sequentially stacked on the sixth interlayer dielectric 2189. The second word line structure 2190 may include a first upper word line 2192, a first upper word line dielectric pattern 2193, a second upper word line 2194, and a second upper word line dielectric pattern 2195, which may be sequentially stacked. The upper word lines may be stacked in two or more layers. At least one side of the second word line structure 2190 may have a stair type structure. In the stair type structure portion of the second word line structure 2190, the first upper word line dielectric pattern 2193, and a side surface of the first upper word line 2192 may be aligned and the second upper word line dielectric pattern 2195 and a side surface of the second upper word line 2194 may be aligned. The first and second upper word line dielectric patterns 2193 and 2195 may each include, e.g., silicon oxide layers. The first and second upper word lines 2192 and 2194 may include, e.g., doped silicon. The upper word lines 2192 and 2194 may have plate type structures.

The second string selection line structure 2198 may include a second string selection line 2196 and a second string selection line capping pattern 2197, which may be sequentially stacked. The second word line structure 2190 and the second string selection line structure 2198 may each include stair type structures at one side thereof. The second string selection line 2196 may extend in the first direction and have a line type structure.

A second semiconductor structure 2206 may be provided through the second string selection line structure 2198 and the second word line structure 2190. The second semiconductor structure 2206 may be disposed in a matrix type structure and pass through a plane onto which the upper word lines 2192 and 2194 are provided. A second gate dielectric 2202 may be disposed between the second semiconductor structure 2206 and the upper word lines 2192 and 2194. In an implementation, the second gate dielectric 2202 may be disposed between the second semiconductor structure 2206 and the second word line structure 2190. The second string selection gate dielectric 2204 may be interposed between the second string selection line 2196 and the second semiconductor structure 2206.

The second gate dielectric 2202 may include a charge trapping layer. An intersection point of one word line and the second semiconductor structure 2206 may form one memory cell. The second semiconductor structure 2206 may provide the channel region, source region, and drain region of a memory cell. The second semiconductor structure 2206 may extend through the second string selection line capping pattern. The second semiconductor structure 2206 may include, e.g., a single crystalline semiconductor or a polycrystalline semiconductor. The second semiconductor structure 2206 may have a pillar type structure.

A seventh interlayer dielectric 2212 may contact the second word line structure 2190 and the side surface of the second string selection line structure 2198. An upper surface of the seventh interlayer dielectric 2212 and an upper surface of the second string selection line capping pattern 2197 may have the same height. Each space between the second string selection lines 2196 may be filled with an eighth interlayer dielectric 2211. An upper surface of the eighth interlayer dielectric 2211 may be planarized. The upper surface of the eighth interlayer dielectric 2211 and an upper surface of the second string selection line capping pattern 2197 may have the same height.

A second bit line BLb may be disposed on the second string selection structure 2198. One end of the second semiconductor structure 2206 may contact the second ground selection semiconductor structure 2188. Another end of the second semiconductor structure 2206 may contact the second bit line BLb. The bit line BLb may be a conductor. The bit line BLb may extend in the second direction in a line type structure. A ninth interlayer dielectric 2216 may be disposed on the semiconductor substrate having the second bit line BLb. An upper surface of the ninth interlayer dielectric 2216 may be planarized.

Second contact plugs 2242, 2254, 2229, 2244, 2246, and 2248 may pass through the interlayer dielectrics of the lower portion of the ninth interlayer dielectric 2216. The second contact plugs may include a second bit line contact plug 2242, a second string selection line contact plug 2254, a common source line contact plug 2249, second word line contact plugs 2244 and 2246, and a second ground selection line contact plug 2248.

First upper contact plugs 2222, 2224, 2226, and 2228 may be disposed on the first lower contact plugs. The first upper contact plugs 2222, 2224, 2226, and 2228 may be electrically connected to the first lower contact plugs 2172, 2174, 2176, and 2178, respectively. The first upper contact plug and the second contact plugs may be electrically connected to metal interconnections 2232.

Figure 38:
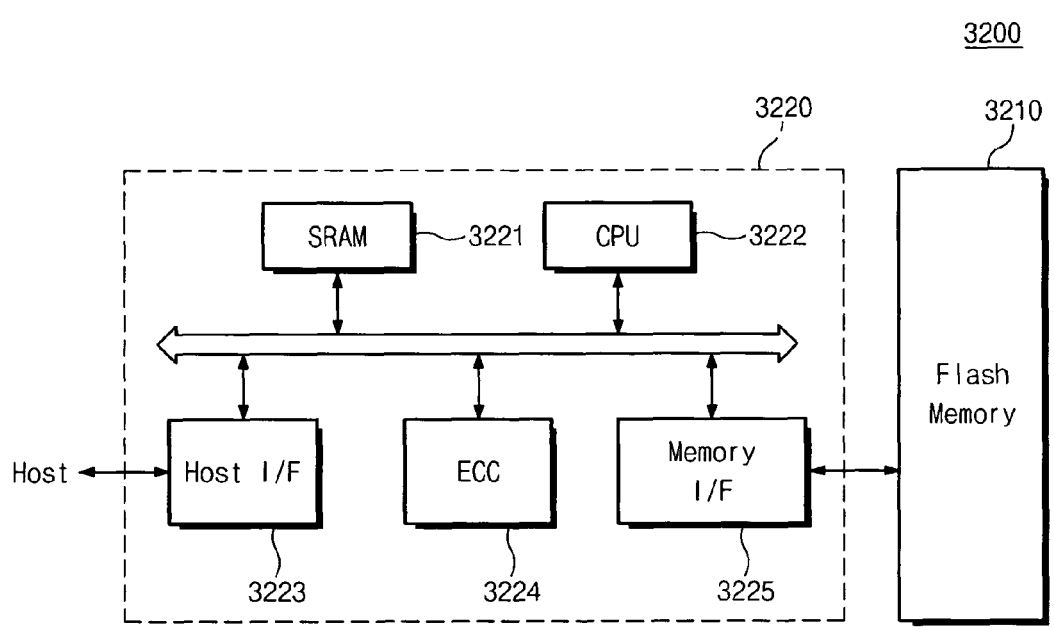
FIG. 38 illustrates a block diagram of a memory card including a flash memory device according to an embodiment.

FIG. 38 illustrates a schematic block diagram of a memory card including a flash memory device according to an embodiment. Referring to FIG. 38, a memory card 3200, which may support large-scale data storage capacity, may include a flash memory device 3210 according to an embodiment. The memory card 3200 may include a memory controller 3220 controlling data exchange between a host and the flash memory device 3210.

A Static Random Access Memory (SRAM) 3221 may be used as the operation memory of a processing unit 3222. A host interface 3223 may include the data exchange protocol of the host that is connected to the memory card 3200. An Error Correction Block (ECC) 3224 may detect and correct an error in data that are read from a multi bit flash memory device 3210. A memory interface 3225 may interface with the flash memory device 3210. The processing unit 3222 may control an overall operation for the data exchange of the memory controller 3220. Although not shown, it is apparent to those skilled in the art that the memory card 3200 may further include a Read Only Memory (not shown), which may store code data that may be used for interfacing with the host.

Figure 39:
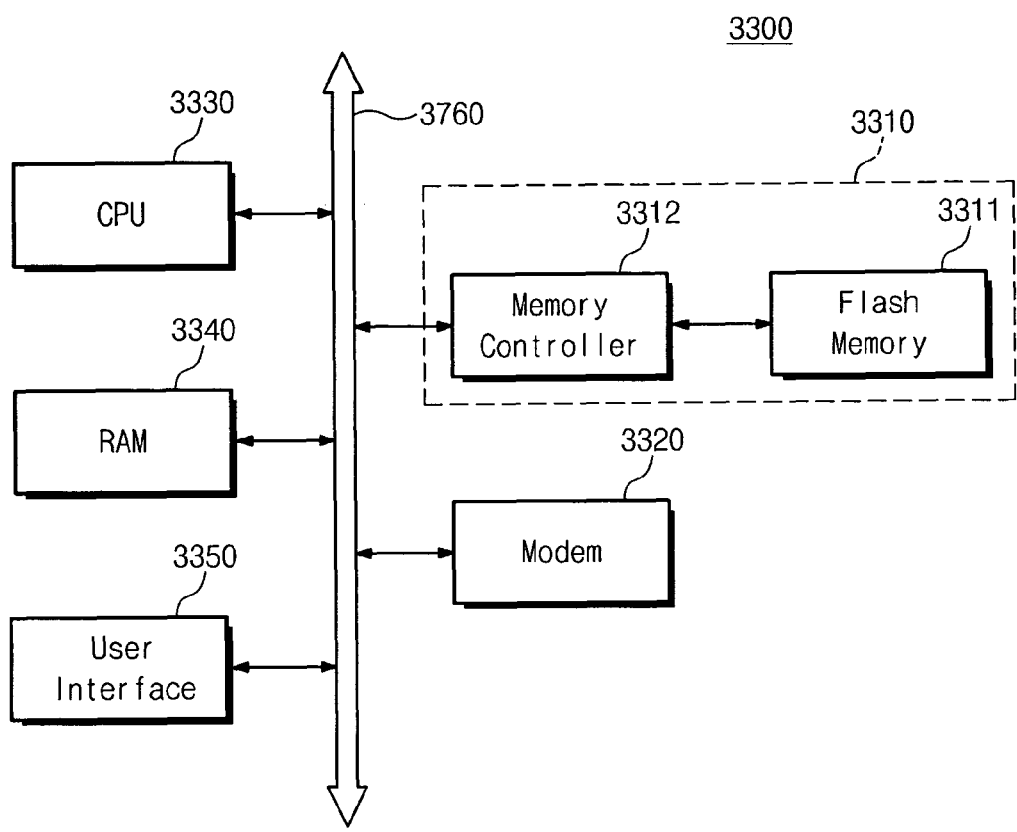
FIG. 39 illustrates a block diagram of an information processing system including a flash memory system according to an embodiment.

FIG. 39 illustrates a schematic block diagram of an information processing system including a flash memory system according to an embodiment. Referring to FIG. 39, a flash memory system 3310 according to an embodiment may be included in an information processing system, e.g., mobile devices and computers. The information processing system 3300 according to an embodiment may include a modem 3320, a Central Processing Unit (CPU) 3330, a RAM 3340, and a user interface 3350, which may be electrically connected to the flash memory system 3310 and a system bus 3360. The flash memory system 3310 may be configured to be substantially the same as the above-described memory system or flash memory system. The flash memory system 3310 may store data processed by the CPU 3330 or data inputted from the outside. Herein, the flash memory system 3310 may be configured with an SSD. In this case, the information processing system 3300 may stably store large-scale data in the flash memory system 3310. As reliability increases, the flash memory system 3310 may conserve resources that would otherwise be consumed for error correction, and thus may provide high-speed data exchange performance to the information processing system 3300. Although not shown, it is apparent to one those skilled in the art that the information processing system 3300 may further include, e.g., an application chipset, a Camera Image Processor (CIS), and/or an input/output device.

Moreover, the flash memory device or the memory system according to the embodiments may be mounted as various types of packages. The flash memory device or the memory system according to embodiments may be packaged in a package type, e.g., Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

In addition, technologies that use vertical semiconductor pillars as active regions for realizing a three-dimensional flash memory device have been disclosed in Japanese Patent Application Laid-Open (JP-A) No. 06-338602 entitled "Semiconductor memory device and manufacturing method thereof", U.S. Patent Publication No. 20070252201 entitled "Nonvolatile semiconductor memory device and manufacturing method thereof", the paper entitled "Optimal Integration and Characteristics of Vertical Array Devices for Ultra-High Density, Bit-Cost Scalable Flash Memory", Electron Devices Meeting, 2007. IEDM 2007. IEEE International, pp. 449-452 presented by Y. Fukuzumi et al., and the paper entitled "Bit Cost Scalable Technology with Punch and Plug Process for Ultra High Density Flash Memory", VLSI Technology, 2007 IEEE Symposium on, pp. 14-15 presented by H. Tanaka et al. The contents of U.S. Patent Publication No. 20070252201 entitled "Nonvolatile semiconductor memory device and manufacturing method thereof" and U.S. Pat. No. 7,382,018 (corresponding to Korean Patent Application No. 10-2005-0011008) entitled "3-Dimensional Flash Memory Device and Method of Fabricating the Same" are hereby incorporated herein by reference in their entirety.

The vertical type semiconductor device according to an embodiment may include a semiconductor structure that is symmetrical with respect to the common source line or the bit line, i.e., the shared interconnection, thereby improving a degree of integration and a current.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A vertical type semiconductor device, comprising:
a first vertical semiconductor device on a semiconductor substrate, the first vertical semiconductor device including a plurality of first memory cells;
a second vertical semiconductor device on the first vertical semiconductor device, the second vertical semiconductor device including a plurality of second memory cells; and
an interconnection between the first and second vertical semiconductor devices, wherein:
the first vertical semiconductor device includes a vertically stacked first word line structure and a first semiconductor structure disposed through the first word line structure,
the second vertical semiconductor device includes a vertically stacked second word line structure and a second semiconductor structure disposed through the second word line structure, and
the first semiconductor structure and the second semiconductor structure are directly connected in common to the interconnection.

2. The vertical type semiconductor device as claimed in claim 1, wherein:
the interconnection is a bit line, and
the bit line is shared in the first and second vertical semiconductor devices.

3. The vertical type semiconductor device as claimed in claim 1, wherein:
the interconnection is a common source line, and
the common source line is shared in the first and second vertical semiconductor devices.

4. The vertical type semiconductor device as claimed in claim 1, wherein the first and second semiconductor structures are aligned with one another.

5. The vertical type semiconductor device as claimed in claim 1, wherein the first and second semiconductor structures are offset from one another.

6. The vertical type semiconductor device as claimed in claim 1, wherein at least one side of the first word line structure has a stair type structure and at least one side of the second word line structure has a stair type structure.

7. The vertical type semiconductor device as claimed in claim 6, wherein the stair type structure of the first word line structure and the stair type structure of the second word line structure are disposed at opposite sides of the semiconductor device.

8. The vertical type semiconductor device as claimed in claim 6, further comprising at least one contact plug connected to the stair type structure of at least one of the first word line structure and the second word line structure.

9. The vertical type semiconductor device as claimed in claim 1, wherein the first vertical semiconductor device further includes a first string selection line structure and a first ground selection line structure.

10. The vertical type semiconductor device as claimed in claim 9, wherein:
the first ground selection line structure is disposed under the first word line structure, and
the first string selection line structure is disposed above the first word line structure.

11. The vertical type semiconductor device as claimed in claim 10, wherein the first ground selection line structure includes a first ground selection line, a first ground selection semiconductor structure, and a first ground selection gate dielectric between the first ground selection line and the first ground selection semiconductor structure.

12. The vertical type semiconductor device as claimed in claim 10, wherein the first string selection line structure includes a first string selection line, a first string selection capping pattern, and a first string selection gate dielectric.

13. The vertical type semiconductor device as claimed in claim 1, wherein the second vertical semiconductor device further includes a second string selection line structure and a second ground selection line structure.

14. The vertical type semiconductor device as claimed in claim 13, wherein:
the second ground selection line structure is disposed under the second word line structure, and
the second string selection line structure is disposed above the second word line structure.

15. The vertical type semiconductor device as claimed in claim 14, wherein the second ground selection line structure includes a second ground selection line, a second ground selection semiconductor structure, and a second ground selection gate dielectric between the second ground selection line and the second ground selection semiconductor structure.

16. The vertical type semiconductor device as claimed in claim 14, wherein the second string selection line structure includes a second string selection line, a second string selection capping pattern, and a second string selection gate dielectric.

17. The vertical type semiconductor device as claimed in claim 1, wherein the interconnection has a multi-layer structure.

18. The vertical type semiconductor device as claimed in claim 1, wherein the interconnection includes at least one of a doped semiconductor material, a metal, and a metal compound.

19. The vertical type semiconductor device as claimed in claim 1, wherein:
the first memory cells are connected in series, and
the second memory cells are serially connected in series.

* * * * *